(12) United States Patent
Andrews

(10) Patent No.: US 11,894,488 B2
(45) Date of Patent: Feb. 6, 2024

(54) LED CHIPS WITH IRREGULAR MICROTEXTURED LIGHT EXTRACTION SURFACES, AND FABRICATION METHODS

(71) Applicant: CreeLED, Inc., Durham, NC (US)

(72) Inventor: Peter Scott Andrews, Durham, NC (US)

(73) Assignee: CreeLED, Inc., Durham, NC (US)

( * ) Notice: Subject to any disclaimer, the term of this patent is extended or adjusted under 35 U.S.C. 154(b) by 269 days.

(21) Appl. No.: 17/357,091

(22) Filed: Jun. 24, 2021

(65) Prior Publication Data

US 2021/0408328 A1    Dec. 30, 2021

Related U.S. Application Data

(60) Provisional application No. 63/044,746, filed on Jun. 26, 2020.

(51) Int. Cl.
| | | |
|---|---|---|
| H01L 33/20 | (2010.01) | |
| H01L 33/32 | (2010.01) | |
| H01L 33/50 | (2010.01) | |
| H01L 33/38 | (2010.01) | |
| H01L 33/00 | (2010.01) | |

(52) U.S. Cl.
CPC ............ *H01L 33/20* (2013.01); *H01L 33/005* (2013.01); *H01L 33/32* (2013.01); *H01L 33/382* (2013.01); *H01L 33/50* (2013.01); *H01L 2933/0016* (2013.01); *H01L 2933/0041* (2013.01)

(58) Field of Classification Search
CPC ....... H01L 33/32; H01L 33/50; H01L 33/005; H01L 33/22; H01L 33/0095; H01L 33/20; H01L 33/382; H01L 2933/0041; H01L 33/007; H01L 2933/0016
See application file for complete search history.

(56) References Cited

U.S. PATENT DOCUMENTS

| | | |
|---|---|---|
| 8,357,923 B2 | 1/2013 | Edmond et al. |
| 9,281,445 B2 | 3/2016 | Donofrio |

(Continued)

OTHER PUBLICATIONS

Author Unknown, "CAB-O-SIL® TS-720 Fumed Silica" Cabot Corporation, Safety Data Sheet, Revised May 20, 2015, 12 pages.

(Continued)

*Primary Examiner* — Savitri Mulpuri
(74) *Attorney, Agent, or Firm* — Withrow & Terranova, P.L.L.C.; Vincent K. Gustafson

(57) ABSTRACT

LED chips and related fabrication methods are disclosed. A LED chip includes an active layer arranged on or over a light-transmissive substrate having a light extraction surface. The light extraction surface comprises a microtextured etched surface having a non-repeating, irregular textural pattern (e.g., with an average feature depth in a range of from 120 nm to 400 nm, and preferably free of any plurality of equally sized, shaped, and spaced textural features). The microtextured etched surface may be formed by applying a micromask having first and second solid materials of different etching rates over the light extraction surface, and exposing the micromask to an etchant (e.g., via reactive ion etching) to form a microtextured etched surface having a non-repeating, irregular textural pattern. Lumiphoric material may be applied over the microtextured surface.

22 Claims, 30 Drawing Sheets

(56) References Cited

U.S. PATENT DOCUMENTS

| | | | |
|---|---|---|---|
| 10,879,441 B2* | 12/2020 | Check | H01L 33/387 |
| 11,031,527 B2* | 6/2021 | Check | H01L 33/382 |
| 11,145,689 B2* | 10/2021 | Hall | H01L 33/005 |
| 11,387,389 B2* | 7/2022 | Check | H01L 33/42 |
| 11,398,591 B2* | 7/2022 | Check | H01L 33/62 |
| 11,417,635 B2* | 8/2022 | Andrews | H01L 33/20 |
| 11,437,548 B2* | 9/2022 | Andrews | H01L 33/60 |
| 11,664,407 B2* | 5/2023 | Andrews | H01L 33/32 |
| | | | 257/88 |
| 2019/0044040 A1 | 2/2019 | Andrews | |

OTHER PUBLICATIONS

Author Unknown, "DuPont™ Ti-Pure® R-105: Titanium Dioxide" DuPont, 2013, 2 pages.

Author Unknown, "781S Series Spray Valve:Installation Guide" Nordson EFD, 2020, v022920, 4 pages.

Author Unknown, "787MS-SS MicroSpray™ Valve: Maintenance & Parts Guide" Nordson EFD, 2016, v050816, 4 pages.

* cited by examiner

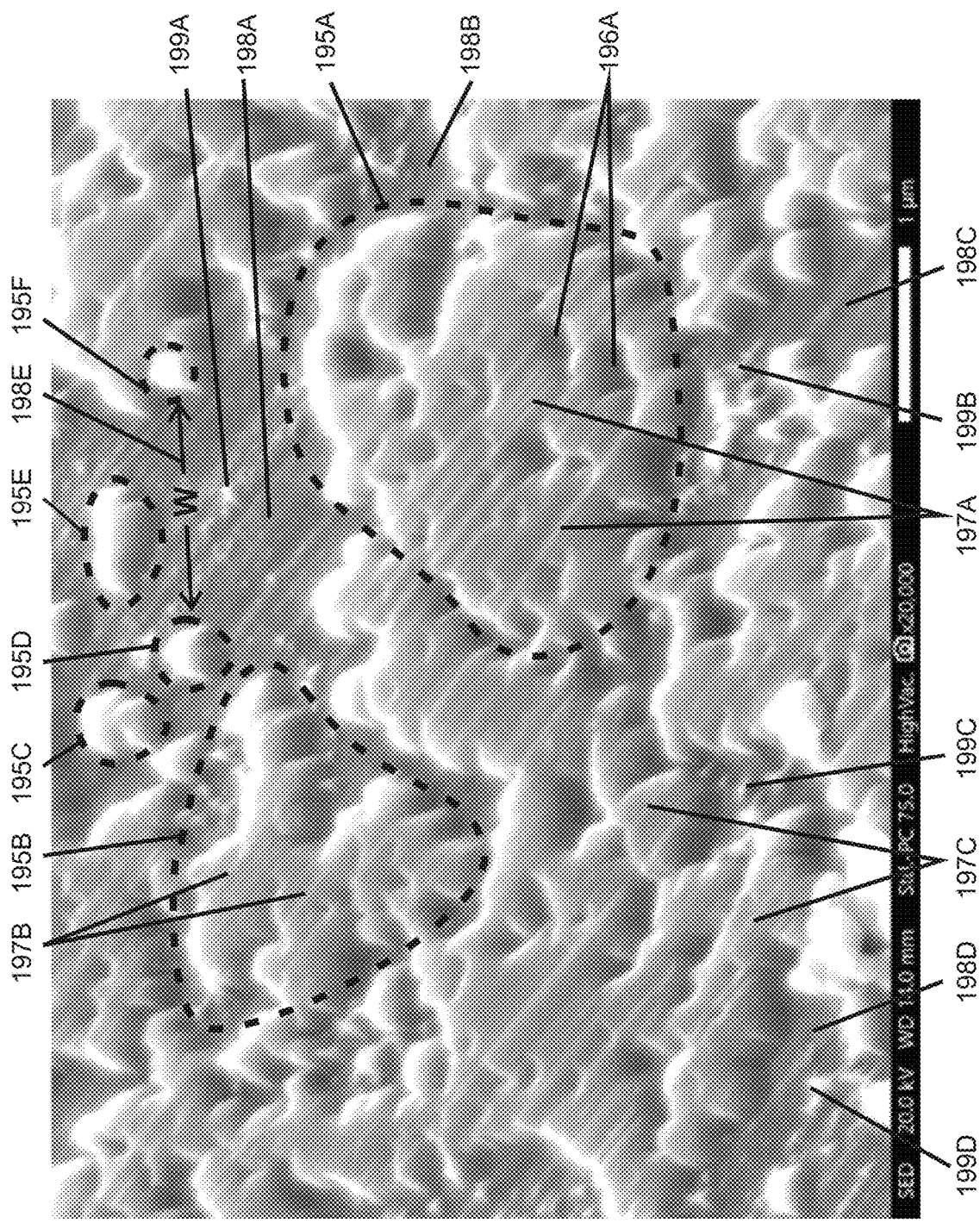

LED CHIPS WITH IRREGULAR MICROTEXTURED LIGHT EXTRACTION SURFACES, AND FABRICATION METHODS

CROSS-REFERENCE TO RELATED APPLICATION(S)

This application claims the benefit of U.S. Provisional Patent Application No. 63/044,746 filed on Jun. 26, 2020, wherein the entire contents of the foregoing application are hereby incorporated by reference herein.

TECHNICAL FIELD

Subject matter herein relates to solid state light-emitting devices, including light emitting diode (LED) chips with substrates configured to transmit light emissions, devices incorporating one or more LED chips, and related fabrication methods.

BACKGROUND

Light emitting diodes (LEDs) are widely known solid-state lighting elements that are capable of generating light in response to an applied voltage. LEDs generally include a diode region having an n-type layer, a p-type layer and a p-n junction, with an anode and cathode contacting the p-type and n-type layers, respectively. The diode region may be epitaxially formed on a substrate, such as a sapphire, silicon, silicon carbide, gallium arsenide, gallium nitride, etc., growth substrate, but the completed device may or may not include a substrate. The diode region may be fabricated, for example, from silicon carbide, gallium nitride, gallium phosphide, aluminum nitride and/or gallium arsenide-based materials and/or from organic semiconductor-based materials.

Many LEDs include an active region (or diode region) fabricated of Group III nitride layers. As used herein, the term "Group III Nitride" refers to semiconducting compounds of nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. Group III nitride compounds may be doped p-type and/or n-type using, for example, p-type dopants such as magnesium and/or n-type dopants such as silicon.

Various methods have been developed for texturing a surface of a Group III nitride layer in an LED, for example, to facilitate light extraction and/or for other purposes. U.S. Pat. No. 8,357,923 to Edmond et al., entitled External Extraction Light Emitting Diode Based Upon Crystallographic Faceted Surfaces, discloses steps of removing a substrate from a Group III nitride light emitting structure, and thereafter etching the surface of the Group III nitride from which the substrate has been removed with an anisotropic etch to develop crystal facets on the surface in which the facets are along an index plane of the Group III nitride material. U.S. Pat. No. 9,281,445 to Donofrio, entitled "Methods of fabricating light emitting diodes by masking and wet chemical etching," discloses a LED including a mesa face with Group III nitride surface features having tops defined by mask features (which may include a two-dimensional array of dots that are spaced apart from one another), and with additional texture between the mask-defined features.

LEDs have been widely adopted in various illumination contexts, for backlighting of liquid crystal display (LCD) systems (e.g., as a substitute for cold cathode fluorescent lamps), and for sequentially illuminated LED displays. Applications utilizing LED arrays include automotive headlamps, roadway illumination, light fixtures, and various indoor, outdoor, and specialty contexts. Desirable characteristics of LED devices according to various end uses include high luminous efficacy, long lifetime, and wide color gamut.

Large format multi-color sequentially illuminated LED displays (including full color LED video screens) typically include numerous individual LED panels, packages, and/or components providing image resolution determined by the distance between adjacent pixels or "pixel pitch." Large format displays (e.g., electronic billboards and stadium displays) intended for viewing from great distances typically have relatively large pixel pitches and usually include discrete LED arrays with multi-color (e.g., red, green, and blue) LEDs that may be independently operated to form what appears to a viewer to be a full color pixel.

Various LED array applications, including (but not limited to) automotive headlamps, high resolution displays suitable for short viewing distances, and other lighting devices, may benefit from smaller pixel pitches; however, practical considerations have limited their implementation. Conventional pick-and-place techniques useful for mounting LED components and packages to PCBs may be difficult to implement in a reliable manner in high-density arrays with small pixel pitches. Additionally, due to the omnidirectional character of LED and phosphor emissions, it may be difficult to prevent emissions of one LED (e.g., a first pixel) from significantly overlapping emissions of another LED (e.g., a second pixel) of an array, which would impair the effective resolution of an LED array device. It may also be difficult to avoid non-illuminated or "dark" zones between adjacent LEDs (e.g., pixels) to improve homogeneity, particularly while simultaneously reducing crosstalk or light spilling between emissions of the adjacent LEDs.

One method that has been developed to address crosstalk while seeking to enhance light extraction involves bevel cutting (sawing) from a light extraction surface into an interior of a substrate of a pixelated-LED chip to form a pattern of grooves and protrusions embodying macro-textural features, such as disclosed in U.S. Patent Application Publication No. 2019/0044040 assigned to Cree, Inc. A representative pixelated-LED chip produced by such a method is shown in FIG. 27. As shown, active layer portions 234-1 to 234-3 are registered with substrate portions 236-1 to 236-3 (of substrate 236) to form pixels 250A to 250C, which are electrically accessible by anodes and cathodes 240, 242 that are coupled with bond pads 246, 248 of a submount 247. The substrate 236 defines protrusions 270 and recesses 272 along a light extraction surface 238, and a lumiphoric material 252 is deposited over the light extraction surface 238. However, the bevel-cutting method required to produce such a pixelated-LED chip is time-consuming, requires precise setup for saw alignment, is not amenable to large-scale batch processing, and involves an undue risk of cracking the substrate, which may reduce manufacturing yield and affect long-term reliability. Additionally, lumiphoric material deposited over a bevel-cut surface may have a non-uniform thickness, which may undesirably introduce spatial variation in color point of emissions produced by a light emitting device.

The art continues to seek LEDs with improved light extraction and improved LED array devices with small pixel pitches, while overcoming limitations associated with conventional devices and production methods.

SUMMARY

The present disclosure relates in various aspects to solid state light emitting devices embodied in or including LED chips (optionally embodied in pixelated-LED chips) including an active layer, and a light-transmissive substrate supporting the active layer and having at least one light extraction surface. The at least one light extraction surface comprises a microtextured etched surface having a non-repeating, irregular textural pattern. The non-repeating, irregular textural pattern may have an average feature depth in a range of from 120 nm to 400 nm, and may be free of any plurality of equally sized, shaped, and spaced textural features. The microtextured etched surface may be formed by applying a micromask having first and second solid materials of different etching rates over the light extraction surface, and exposing the micromask to an etchant (e.g., via reactive ion etching) to form a microtextured etched surface having a non-repeating, irregular textural pattern. The surface may be rinsed after etching. The mask deposition, etching, and rinsing steps may be repeated as a sequence, so that a previously etched surface may be re-masked, re-etched, and re-rinsed. Lumiphoric material may be applied over the microtextured surface. Such steps may be performed after one or more LED chips are mounted on a submount that provides mechanical support and electrical connections to the LED chips.

In one aspect, a LED chip comprises: an active layer comprising at least one active layer portion configured to produce electrically activated emissions, a substrate portions supporting the active layer, wherein the substrate comprises a light-transmissive material and at least one light extraction surface, and at least one anode-cathode pair associated with the at least one active layer portion. The active layer is configured to illuminate the substrate and transmit light through the at least one light extraction surface. Each light extraction surface comprises a microtextured etched surface having a non-repeating, irregular textural pattern having a non-repeating, irregular textural pattern.

In certain embodiments, the non-repeating, irregular textural pattern comprises an average feature depth in a range of from 120 nm to 400 nm.

In certain embodiments, the non-repeating, irregular textural pattern comprises a plurality of plateau regions and pits defined in upper surfaces of the plurality of plateau regions. In certain embodiments, upper surfaces of at least some plateau regions of the plurality of plateau regions comprise residual surface processing lines, which may be substantially parallel and may embody scoring marks imparted by surface grinding (e.g., for thinning of the substrate) prior to masking and etching.

In certain embodiments, the non-repeating, irregular textural pattern comprises a tiered microstructure including a plurality of plateau regions arranged at different heights. In certain embodiments, a first plurality of plateau regions may be arranged at a first height or tier (e.g., level), and a second plurality of plateau regions may be arranged at a second height or tier that differs from the first height or tier.

In certain embodiments, the non-repeating, irregular textural pattern comprises a plurality of irregularly shaped first features of a first height, and a plurality of valley regions extending between different irregularly shaped first features of the plurality of irregularly shaped first features, wherein at least some valley regions of the plurality of valley regions are wider than individual irregularly shaped first features that border the at least some valley regions.

In certain embodiments, the non-repeating, irregular textural pattern comprises a plurality of irregularly shaped first features of a first height, a plurality of valley regions extending between different irregularly shaped first features of the plurality of irregularly shaped first features, and a plurality of irregularly shaped second features of a second height that is less than the first height, wherein the plurality of irregularly shaped second features are arranged within the plurality of valley regions.

In certain embodiments, the non-repeating, irregular textural pattern comprises a plurality of irregularly shaped first plateau regions of a first height, a plurality of irregularly shaped second plateau regions of a second height that is less than the first height, and a plurality of valleys between different plateau regions of the plurality of irregularly shaped first plateau regions and the plurality of irregularly shaped second plateau regions.

In certain embodiments, each light extraction surface is free of any plurality of equally sized, equally shaped, and equally spaced textural features.

In certain embodiments, the LED chip further comprises at least one Group III nitride epitaxial layer arranged between the active layer and the substrate, wherein the substrate is compositionally different from the at least one Group III nitride epitaxial layer.

In certain embodiments, the at least one light extraction surface consists essentially of silicon carbide or sapphire.

In certain embodiments, the non-repeating, irregular textural pattern is irregular in both a lateral direction and a vertical direction.

In certain embodiments, the LED chip is arranged in a flip-chip configuration, with the active layer arranged between the substrate and the at least one anode-cathode pair.

In certain embodiments, the LED chip further comprises at least one lumiphoric material arranged on or over the microtextured etched surface, wherein the at least one lumiphoric material is configured to receive at least a portion of light emitted by the plurality of active layer portions and to responsively generate lumiphor emissions In certain embodiments, the at least one lumiphoric material comprises a thickness variation of less than 500 nm over an entirety of the microtextured etched surface.

In certain embodiments, the LED chip is embodied in a pixelated-LED chip, wherein: the at least one active layer portion comprises a plurality of active layer portions, with a plurality of streets defined through the active layer and arranged to segregate individual active layer portions of the plurality of active layer portions; the substrate comprises a plurality of substrate portions supporting the plurality of active layer portions, wherein each substrate portion comprises a light extraction surface of the at least one light extraction surface; and the at least one anode-cathode pair comprises a plurality of anode-cathode pairs; and each active layer portion of the plurality of active layer portions comprises a different anode-cathode pair of the plurality of anode-cathode pairs and is configured to illuminate a different substrate portion of the plurality of substrate portions and transmit light through the light extraction surface of the substrate portion, such that the plurality of active layer portions and the plurality of substrate portions form a plurality of pixels.

In certain embodiments, the light extraction surface of each substrate portion comprises silicon carbide or sapphire.

In certain embodiments, at least one lumiphoric material is arranged on or over the microtextured etched surface, wherein the at least one lumiphoric material is configured to receive at least a portion of light emitted by the plurality of active layer portions and to responsively generate lumiphor emissions.

In certain embodiments, the at least one lumiphoric material is continuous on the plurality of pixels.

In certain embodiments, the at least one lumiphoric material comprises a plurality of light segregation elements that are registered between pixels of the plurality of pixels.

In certain embodiments, the at least one lumiphoric material comprises a thickness variation of less than 500 nm over an entirety of the microtextured etched surface.

In certain embodiments, the plurality of light segregation elements comprises gaps or cuts in the at least one lumiphoric material.

In certain embodiments, the plurality of substrate portions comprises a plurality of discontinuous substrate portions.

In certain embodiments, further comprising light scattering particles arranged between the light extraction surface of each substrate portion and the at least one lumiphoric material.

In certain embodiments, a lighting device comprises at least one LED chip as disclosed herein.

In another aspect, the disclosure relates to a method for fabricating a LED chip that comprises an active layer comprising at least one active layer portion and a substrate supporting the active layer, wherein the substrate comprises a light-transmissive material defining at least one light extraction surface. The method comprises: applying a first micromask to the at least one light extraction surface, wherein the first micromask comprises a first solid material having a first etching rate and a second solid material having a second etching rate that differs from the first etching rate; and exposing the first micromask to an etchant to (i) consume at least portions of one or more of the first solid material or the second solid material and (ii) etch portions of the at least one light extraction surface to form a microtextured etched surface having a non-repeating, irregular textural pattern.

In certain embodiments, the first solid material is compositionally different from the second solid material.

In certain embodiments, the first solid material comprises a metal oxide, and the second solid material comprises a non-metallic oxide.

In certain embodiments, a weight percent of the first solid material is at least five times greater than a weight percent of the second solid material in the first micromask.

In certain embodiments, the first solid material comprises titanium dioxide, and second solid material comprises silicon dioxide.

In certain embodiments, the second solid material comprises fumed silica.

In certain embodiments, at least one of the first solid material or the second solid material comprises a thixotropic agent.

In certain embodiments, the applying of the first micromask to the at least one light extraction surface comprises spray coating the at least one light extraction surface with a composition comprising the first solid material, the second solid material, and a liquid. In certain embodiments, the liquid comprises xylene.

In certain embodiments, the exposing of the first micromask to the etchant comprises use of a reactive ion etching technique.

In certain embodiments, the method further comprises rinsing residual first solid material and residual second solid material from the at least one light extraction surface following exposure of the first micromask to the etchant. In certain embodiments, the rinsing comprising supplying deionized water to the at least one light extraction surface.

In certain embodiments, the method further comprises: applying a second micromask to the light extraction surface, wherein the second micromask comprises the first solid material and the second solid material; exposing the second micromask to an etchant to consume at least portions of one or more of the first solid material of the second micromask or the second solid material of the second micromask and (ii) etch portions of the at least one light extraction surface to form a further microtextured etched surface having a non-repeating, irregular textural pattern; and rinsing residual first solid material and residual second solid material from the at least one light extraction surface following exposure of the second micromask to the etchant.

In certain embodiments, the exposing of the second micromask to the etchant comprises use of a reactive ion etching technique.

In certain embodiments, the non-repeating, irregular textural pattern has an average feature depth in a range of from 120 nm to 400 nm. In certain embodiments, the non-repeating, irregular textural pattern is irregular in both a lateral direction and a vertical direction.

In certain embodiments, the method further comprises applying at least one lumiphoric material over the microtextured etched surface In certain embodiments, the method further comprises grinding the at least one lumiphoric material to reduce a thickness of the at least one lumiphoric material over the microtextured etched surface.

In certain embodiments, the at least one lumiphoric material comprises a thickness variation of less than 500 nm over an entirety of the microtextured etched surface.

In certain embodiments, the substrate comprises a Group III nitride epitaxial layer.

In certain embodiments, the substrate comprises silicon carbide or sapphire.

In certain embodiments, the at least one active layer portion comprises a plurality of active layer portions, with a plurality of streets defined through the active layer and arranged to segregate individual active layer portions of the plurality of active layer portions; the substrate comprises a plurality of substrate portions supporting the plurality of active layer portions, wherein each substrate portion comprises a light extraction surface of the at least one light extraction surface; the at least one anode-cathode pair comprises a plurality of anode-cathode pairs; and each active layer portion of the plurality of active layer portions comprises a different anode-cathode pair of the plurality of anode-cathode pairs and is configured to illuminate a different substrate portion of the plurality of substrate portions and transmit light through the light extraction surface of the substrate portion, such that the plurality of active layer portions and the plurality of substrate portions form a plurality of pixels.

In certain embodiments, the method further comprises applying protective material to lateral edges of each of the plurality of active layer portions and the plurality of substrate portions prior to the exposing of the first micromask to the etchant.

In certain embodiments, the method further comprises: applying at least one lumiphoric material over the microtextured etched surface, and defining gaps or cuts in the at least one lumiphoric material registered with boundaries between different pixels of the plurality of pixels.

In certain embodiments, the method further comprises applying a light-scattering material over the microtextured etched surface prior to the applying of the at least one lumiphoric material over the microtextured etched surface.

In certain embodiments, disclosure further relates to a LED chip (optionally embodied in a pixelated-LED chip) produced by methods disclosed herein.

In another aspect, the disclosure relates to a method for fabricating at least one LED chip that comprises an active layer comprising at least one active layer portion, a substrate of light-transmissive material supporting the active layer and having at least one light extraction surface, and at least one anode-cathode pair associated with the active layer, wherein the light extraction surface is substantially planar, the method comprising: mounting the at least one LED chip to a submount that provides mechanical support and electrical connections to the at least one LED chip wherein the at least one light extraction surface comprises a microtextured etched surface having a non-repeating, irregular textural pattern; applying a layer of at least one lumiphoric material over the at least one light extraction surface of each substrate portion; and reducing a thickness of the layer of the at least one lumiphoric material by grinding the at least one lumiphoric material to provide a substantially uniform thickness of the at least one lumiphoric material over the at least one light extraction surface.

In certain embodiments, the at least one lumiphoric material comprises a thickness variation of less than 500 nm over an entirety of the at least one light extraction surface.

In certain embodiments, the at least one lumiphoric material comprises lumiphoric particles dispersed in a light-transmissive binder.

In certain embodiments, the applying of the layer of at least one lumiphoric material over the at least one light extraction surface comprises dispensing a lumiphoric material composition in fluid form, and then leveling the lumiphoric material composition by skimming a surface thereof with a flat edge.

In certain embodiments, the method further comprises electrically activating the at least one LED chip to identify a color property of emissions produced by the at least one LED chip, and, responsive to the color property identifying step, further reducing the thickness of the layer of the at least one lumiphoric material by further grinding the at least one lumiphoric material.

In certain embodiments, the LED chip is embodied in a pixelated-LED chip, wherein: the at least one active layer portion comprises a plurality of active layer portions, with a plurality of streets defined through the active layer and arranged to segregate individual active layer portions of the plurality of active layer portions; the substrate comprises a plurality of substrate portions supporting the plurality of active layer portions, wherein each substrate portion comprises a light extraction surface of the at least one light extraction surface; the at least one anode-cathode pair comprises a plurality of anode-cathode pairs; and each active layer portion of the plurality of active layer portions comprises a different anode-cathode pair of the plurality of anode-cathode pairs and is configured to illuminate a different substrate portion of the plurality of substrate portions and transmit light through the light extraction surface of the substrate portion, such that the plurality of active layer portions and the plurality of substrate portions form a plurality of pixels.

In certain embodiments, the mounting of the at least one pixelated-LED chip comprises reflow soldering of each anode-cathode pair to corresponding bond pads of the submount.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 20D is an annotated version of FIG. 20C including labeling of certain features of the etched surface of the pixelated-LED chip.

DETAILED DESCRIPTION

Figure 1:
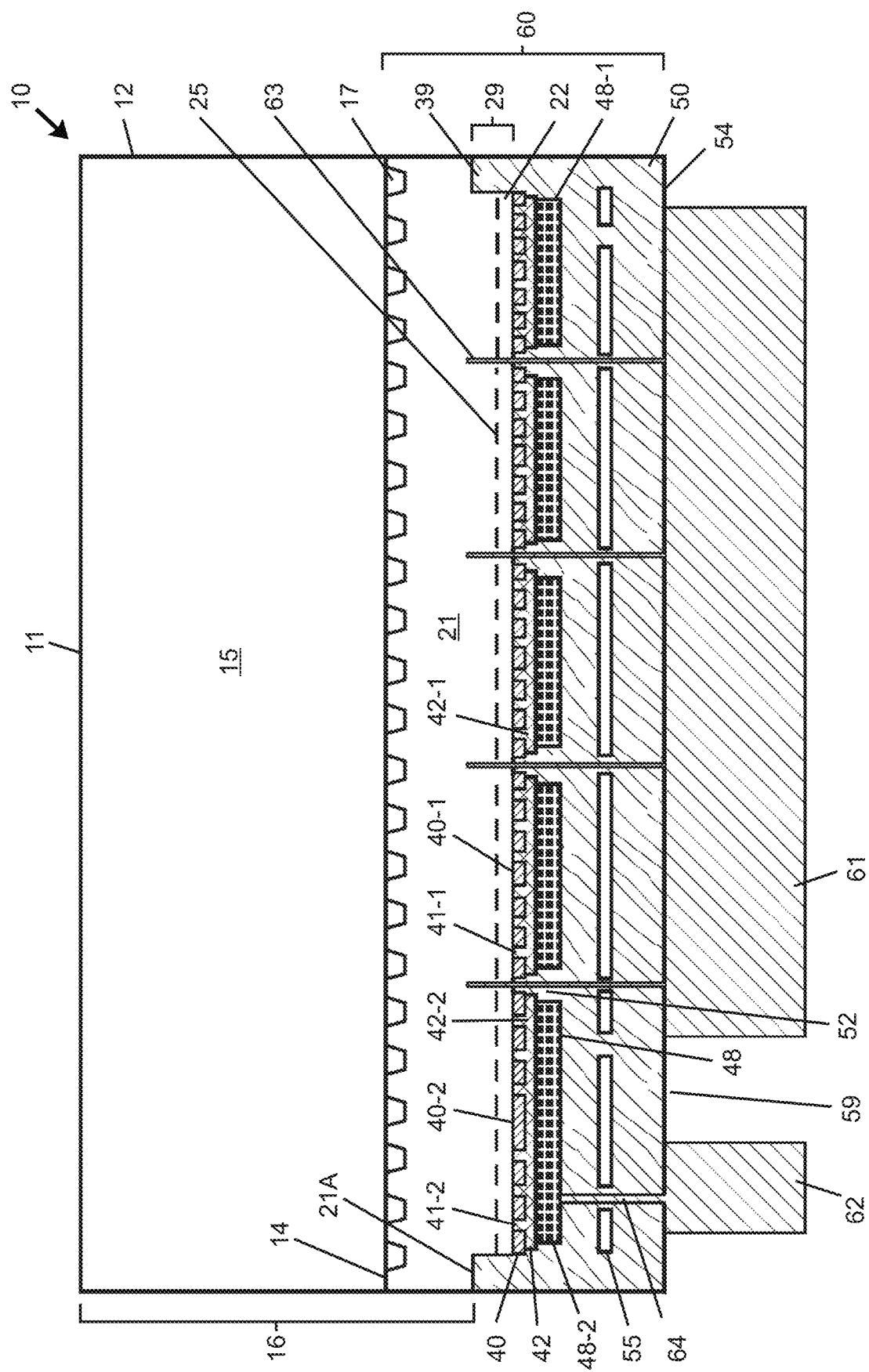
FIG. 1 is a side cross-sectional illustration of a flip chip light emitting diode (LED) chip being representative of flip chips useable in flip chip LED arrays according to embodiments of the present disclosure.

Solid state light emitting devices disclosed herein include an active layer and a light-transmissive substrate supporting the active layer had having at least one light extraction surface. The at least one light extraction surface comprises a microtextured etched surface having a non-repeating, irregular textural pattern. The non-repeating, irregular textural pattern may have an average feature depth in a range of from 120 nm to 400 nm, may comprise plateau regions with pits defined in upper surfaces thereof, may have a tiered microstructure including a plurality of plateau regions arranged at different heights, and/or may be free of any plurality of equally sized, shaped, and spaced textural features. The microtextured etched surface may be formed by applying a micromask having first and second solid materials of different etching rates over the light extraction surface, and exposing the micromask to an etchant (e.g., via reactive ion etching) to form a microtextured etched surface having a non-repeating, irregular textural pattern. The microtextured etched surface may enhance light extraction.

If the LED chip comprises a pixelated-LED chip (including a plurality of independently electrically accessible active layer portions in combination with a plurality of light transmissive substrate portions that form a plurality of pixels), the microtextured light extraction surface may provide reduced light spillover (crosstalk) between adjacent pixels to provide favorable contrast and sharpness values for a pixelated-LED chip, while dispensing with the need for bevel cutting of a light extraction surface of a pixelated-LED chip.

A microtextured etched surface having a non-repeating, irregular textural pattern fabricated by methods disclosed herein may comprise various features that are different from etched surfaces known in the art. When a mixture including first and second solid materials having different etching rates is deposited (e.g., by spray coating and without use of a mask defining regularized features) on a surface that is subsequently etched, localized variation in presence, stacking, and composition of the different solids leads to formation of different features on the etched surface. For example, prior to etching, a spray-coated substrate surface may have exposed areas, areas directly covered with the first solid material, areas directly covered with the second solid material, and areas in which particles of the first and second solid materials may be stacked on the substrate surface (either with particles of the first solid material stacked atop the second solid material, or vice-versa). Upon exposure of the coated surface to an etchant, the degree of etching of the substrate surface in any one area will depend on the presence, stacking, and composition of the solid materials. In areas where solid coating material is absent, the substrate will be etched deeply. In areas where a rapidly consumed first solid material is initially present, the first solid material will briefly protect the underlying substrate surface from etching, and then after the first solid material is consumed, the underlying substrate surface will be etched to a moderate depth. In areas where a less rapidly consumed (or non-consumed) second solid material is initially present, the second solid material will provide more lasting protection of the underlying solid surface against etching, and the underlying substrate surface may be etched shallowly or not at all. In areas where particles of the second solid material are initially stacked atop particles of the first solid material or vice-versa, still different results may be obtained. Still further localized variation in etching results may be produced when sequential cycles of coating, etching, and rinsing are performed.

In certain embodiments, a non-repeating, irregular textural pattern may comprise an average feature depth in a range of from 120 nm to 400 nm, or in a range of 150 nm to 350 nm, or in a range of 200 nm to 350 nm. In certain embodiments, a non-repeating, irregular textural pattern may include multiple plateau regions with localized pits defined in upper surfaces thereof. A plateau region may have a predominantly flat upper surface except along lateral boundaries thereof (which may have rounded edges toward lower-lying areas) and except for the presence of pitted areas. Valley regions of various widths may be provided between plateau regions. In certain embodiments, plateau regions may be interconnected in various irregular shapes. In certain embodiments, at least some plateau regions may comprise substantially parallel scoring marks along upper surfaces thereof, with such scoring marks having been imparted by surface grinding (e.g., prior to masking and etching). In certain embodiments, a non-repeating irregular textural pattern may comprise a tiered microstructure including plateau regions provided at different heights. In certain embodiments, a tiered microstructure may include a first plurality of plateau regions at a first height and a second plurality of plateau regions at a second height that differs from the first height, with the presence of valley regions and/or pit regions that are deeper than the first and second pluralities of plateau regions.

In certain embodiments, a non-repeating, irregular textural pattern includes a plurality of irregularly shaped first features of a first height, a plurality of valley regions extending between different irregularly shaped first features, and a plurality of irregularly shaped second features of a second height that is less than the first height, with the plurality of irregularly shaped second features being arranged within the plurality of valley regions. In certain embodiments, at least some of the plurality of irregularly shaped first features of a first height comprise plateau regions.

In certain embodiments, a light extraction surface provided with a non-repeating, irregular textural pattern is free of any plurality of equally sized, equally shaped, and equally spaced textural features. In certain embodiments, a light extraction surface that includes a non-repeating, irregular textural pattern is also free of saw texturing features (e.g., features with large angular faces that are typically pyramidal in shape). Avoidance of saw texturing features enables attainment of a LED chip with a low profile which confers significant benefits in allowing small secondary optics, forming desired beam shapes, and (as applied to pixelated-LED chips) improved sharpness and contrast compared to neighboring pixels.

In certain embodiments, a light extraction surface provided with a non-repeating, irregular textural pattern may be formed over a saw-textured substrate surface to provide macro-textural features that are overlaid with microtextural features. In such an embodiment, a substrate may be thinned, saw textured, and then subjected to one or more cycles of micromasking, etching, and rinsing as disclosed herein.

In certain embodiments, at least one LED chip may be mounted to a submount providing mechanical support and electrical connections to the at least one LED chip; a layer of at least one lumiphoric material may be applied over at least one light extraction surface of the at least one LED chip wherein the at least one light extraction surface comprises a microtextured etched surface having a non-repeating, irregular textural pattern, and a thickness of the layer of at least one lumiphoric material may be reduced by grinding the at least one lumiphoric material to provide a substantially uniform thickness of the at least one lumiphoric material over the at least one light extraction surface. A color property of emissions of the at least one pixelated LED chip may be identified by testing, and the grinding step may be repeated as necessary in response to the color property identification. Such steps may enable consistent attainment of a desired color point among different LED chips.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, a "pixelated-LED chip" refers to an inorganic light emitting device or precursor thereof, in which a body or film comprising at least one layer or region made of a semiconductor material and being configured into sub-regions or pixels to emit visible light, infrared and/or ultraviolet light when a current is applied. The pixelated-LED chip may include an active layer that is segregated into a plurality of active layer portions such that each pixel comprises a different active layer portion. The pixelated-LED chip may also include a substrate that supports the active layer. The substrate may be segregated, either partially or entirely through a thickness of the substrate, into a plurality of substrate portions that support a different active layer portion in each pixel. Depending on the embodiment, the pixelated-LED chip may include lumiphoric materials, including phosphors or other conversion materials, and other physical optical structures that are integral with the pixelated-LED chip.

As used herein, an "active layer" or an "active region" of a solid state light emitting device refers to the layer or region in which majority and minority electronic carriers (e.g., holes and electrons) recombine to produce light. In general, an active layer or region according to embodiments disclosed herein can include a double heterostructure or a well structure, such as a quantum well structure. An active layer or region can include multiple layers or regions, such as a multiple quantum well structure.

Solid state light emitting devices disclosed herein may include at least one solid state light source (e.g., an LED chip or a pixelated-LED chip) and one or more lumiphoric materials (also referred to herein as lumiphors) arranged to receive emissions of the at least one solid state light source. A lumiphoric material may include one or more of a phosphor, a scintillator, a lumiphoric ink, a quantum dot material, a day glow tape, or the like. In certain embodiments, a lumiphoric material may be in the form of one or more phosphors and/or quantum dots arranged in a binder such as silicone or glass, arranged in the form of a single crystalline plate or layer, a polycrystalline plate or layer, and/or a sintered plate. In certain embodiments, a lumiphoric material such as a phosphor may be spin coated or sprayed on a surface of an LED array or a pixelated-LED chip. In certain embodiments, a lumiphoric material composition may be dispensed or otherwise applied in fluid form (e.g., akin to a gel, such as with lumiphoric material particles dispersed in silicone or another binding material) on or over a light extraction surface, and then leveling the lumiphoric material composition by skimming a surface thereof with a flat edge such as a squeegee, followed by curing and solidification of any binding material. In certain embodiments, a lumiphoric material may be located on a growth substrate, on epitaxial layers, and/or on a carrier substrate of an LED array or a pixelated-LED chip. If desired, multiple pixels including one or more lumiphoric materials may be manufactured in a single plate. In general, a solid state light source may generate light having a first peak wavelength. At least one lumiphor receiving at least a portion of the light generated by the solid state light source may re-emit light having a second peak wavelength that is different from the first peak wavelength. A solid state light source and one or more lumiphoric materials may be selected such that their combined output results in light with one or more desired characteristics such as color, color point, intensity, etc. In certain embodiments, aggregate emissions of one or more flip chip LEDs or pixels of a pixelated-LED chip, optionally in combination with one or more lumiphoric materials, may be arranged to provide cool white, neutral white, or warm white light, such as within a color temperature range of from 2500 K to 10,000 K. In certain embodiments, lumiphoric materials having cyan, green, amber, yellow, orange, and/or red peak wavelengths may be used. In certain embodiments, lumiphoric materials may be added to one or more emitting surfaces (e.g., a top surface and one or more edge surfaces) by methods such as spray coating, dipping, liquid dispensation, powder coating, inkjet printing, or the like. In certain embodiments, lumiphoric material may be dispersed in an encapsulant, adhesive, or other binding medium.

In certain embodiments, photolithographic patterning or other stencil-type patterning may be used to permit different lumiphoric materials to be applied on or over different pixels associated with a substrate to provide lumiphoric materials and/or scattering materials that differs in (a) composition, (b) concentration, (c) particle size, or (d) distribution with respect to different pixels.

In certain embodiments, a scattering material may be provided between a substrate and a lumiphoric material, or may be incorporated into a lumiphoric material. The scattering material may include scattering particles arranged in a binder, such as silicone. The scattering particles affect total internal reflection (TIR) of light to promote scattering and mixing of light that interacts with the scattering material. The scattering particles may include fused silica, fumed silica, or particles of titanium dioxide ($TiO_2$), among others. In some embodiments, the scattering material includes a layer of scattering particles suspended in a binder that is applied on the lumiphoric material. In other embodiments, the scattering particles may be included within the lumiphoric material such that the lumiphoric material comprises lumiphoric particles and scattering particles suspended in the same binder.

As used herein, a layer or region of a light emitting device may be considered to be "transparent" when at least 70% of emitted radiation that impinges on the layer or region emerges through the layer or region. For example, in the context of LEDs configured to emit visible light, suitably pure crystalline substrate materials of silicon carbide (SiC) or sapphire may be considered transparent. Moreover, as used herein, a layer or region of an LED is considered to be "reflective" or embody a "reflector" when at least 70% of the angle averaged emitted radiation that impinges on the layer or region is reflected. In some embodiments, an LED is considered to be "reflective" or embody a "reflector" when at least 90% of the angle averaged emitted radiation that impinges on the layer or region is reflected. For example, in the context of gallium nitride (GaN)-based blue and/or green LEDs, silver (Ag) (for example, at least 70% reflective, or at least 90% reflective) may be considered a reflective or reflecting material. In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

Certain embodiments disclosed herein relate to the use of flip chip LED devices (optionally embodied in flip chip pixelated-LED chips) in which a light-transmissive substrate represents the exposed light emitting surface. In certain embodiments, the light-transmissive substrate embodies or includes an LED growth substrate, wherein one or more LEDs are grown on the same substrate that forms a light emitting surface or region. In certain embodiments, a pixelated-LED chip includes multiple active layer portions formed from an active layer grown on a growth substrate. In certain embodiments, the pixels may share functional layers of the pixelated-LED chip. In certain embodiments, one or more portions (or the entirety) of a growth substrate and/or portions of epitaxial layers may be thinned or removed. In certain embodiments, a second substrate (such as a carrier substrate or a temporary substrate to perform chip processing) may be added to a LED chip (e.g., a pixelated-LED chip) or precursor thereof, whether or not a growth substrate has been partially or fully removed. In certain embodiments, a light-transmissive substrate includes SiC, sapphire, or glass that may have a light extraction surface comprising microtextured etched surface having a non-repeating, irregular textural pattern, fabricated by methods disclosed herein. Multiple LEDs (e.g., flip chip LEDs or flip chip pixels) may be grown on a substrate and incorporated into a light emitting device. In certain embodiments, a substrate (e.g., silicon (Si)) may include vias arranged to make contact with LED chips mounted or grown thereon. In certain embodiments, as an alternative to using flip chips, individual LEDs or LED packages may be individually placed and mounted on or over a substrate to form an array. For example, multiple wafer level packaged LEDs may be used to form LED arrays or subarrays.

When LEDs embodying a flip chip configuration are used, desirable flip chip LEDs incorporate multi-layer reflectors and incorporate light-transmissive (preferably transparent) substrates that are optionally patterned along an internal surface adjacent to semiconductor layers. A flip chip LED, or a flip chip pixel in some embodiments, includes anode and cathode contacts that are spaced apart and extend along the same face, with such face opposing a face defined by the light-transmissive (preferably transparent) substrate. A flip chip LED may be termed a horizontal structure, as opposed to a vertical structure having contacts on opposing faces of an LED chip. In certain embodiments, the transparent substrate may be patterned, roughened, or otherwise textured along a growth surface prior to growth of one or more epitaxial layers to provide a varying surface that increases the probability of refraction over internal reflection, so as to enhance light extraction. A growth surface of a substrate may be patterned or roughened by any of various methods known in the art, including (but not limited to) formation of nano-scale features by etching (e.g., photolithographic etching) using any suitable etchants, optionally in combination with one or more masks.

Patterning or texturing of a growth surface of a substrate may depend on the substrate material as well as implications on light extraction efficiency and/or pixel separation. If a SiC substrate bearing multiple LEDs (e.g., flip chip LEDs or flip chip pixels) is used, then the index of refraction of the SiC is well-matched to a GaN-based active region of an LED, so light emissions of the active region tend to enter the substrate easily. If a sapphire substrate bearing multiple LEDs (e.g., flip chip LEDs or flip chip pixels) is used, then it may be desirable to provide a patterned, roughened, or textured interface between the active region and the substrate to promote passage of LED emissions into the substrate. With respect to a light extraction surface of a substrate, in certain embodiments it may be desirable to provide a patterned, roughened, or textured surface to promote extraction of light from the substrate. In embodiments where a growth substrate is removed, a GaN epitaxial light emitting surface can be roughened, patterned and/or textured.

In certain embodiments, LEDs or pixels may be grown on a first substrate of a first material (e.g., Si, SiC, or sapphire), the first (growth) substrate may be partially removed (e.g., thinned) or fully removed, and the LEDs or pixels may be bonded to, mounted to, or otherwise supported by a second substrate of a second material (e.g., glass, sapphire, etc.) having a light extraction surface through which LED emissions are transmitted, wherein the second material is preferably more transmissive of LED emissions than the first material. Removal of the first (growth) substrate may be done by any appropriate method, such as by use of an internal parting region or parting layer that is weakened and/or separated by: application of energy (e.g., laser rastering, sonic waves, heat, etc.), fracturing, one or more heating and cooling cycles, chemical removal, and/or mechanical removal (e.g., including one or more grinding, lapping, and/or polishing steps), or by any appropriate combination of techniques. In certain embodiments, one or more substrates may be bonded or otherwise joined to a carrier. Bonding of one or more LEDs or pixels to a substrate, or bonding of substrates to a carrier, may be performed by any suitable methods. Any suitable wafer bonding technique known in the art may be used such as van der Waals bonds, hydrogen bonds, covalent bonds, and/or mechanical interlocking. In certain embodiments, direct bonding may be used. In certain embodiments, bonding may include one or more surface activation steps (e.g., plasma treatment, chemical treatment, and/or other treatment methods) followed by application of heat and/or pressure, optionally followed by one or more annealing steps. In certain embodiments, one or more adhesion promoting materials may additionally or alternatively be used.

In certain embodiments, an LED array includes multiple flip chip LEDs or flip chip pixels grown on a single first (or growth) substrate, with the first substrate removed from the LEDs, and a second substrate (or carrier) added to the LEDs, with the second substrate including one or more reflective layers, vias, and a lumiphoric material layer (e.g., spin-coated phosphor layer). In certain embodiments, an LED array includes multiple flip chip LEDs or flip chip pixels grown on a single growth substrate, wherein grooves, recesses, or other features are defined in the growth substrate and/or a carrier, and are used to form light-affecting elements, optionally being filled with one or more materials such as to form a grid between individual LEDs or pixels.

In certain embodiments utilizing flip chip LEDs or flip chip pixels, a light-transmissive substrate, a plurality of semiconductor layers, a multi-layer reflector, and a passivation layer may be provided. The light-transmissive substrate is preferably transparent with a patterned internal (e.g., growth) surface including a plurality of recessed features and/or a plurality of raised features. The plurality of semiconductor layers is adjacent to the patterned internal surface, and includes a first semiconductor layer comprising doping of a first type and a second semiconductor layer comprising doping of a second type, wherein a light emitting active region is arranged between the first semiconductor layer and the second semiconductor layer. The multi-layer reflector is arranged proximate to the plurality of semiconductor layers and includes a metal reflector layer and a dielectric reflector layer, wherein the dielectric reflector layer is arranged between the metal reflector layer and the plurality of semiconductor layers. The passivation layer is arranged between the metal reflector layer and first and second electrical contacts, wherein the first electrical contact is arranged in conductive electrical communication with the first semiconductor layer, and the second electrical contact is arranged in conductive electrical communication with the second semiconductor layer. In certain embodiments, a first array of conductive microcontacts extends through the passivation layer and provides electrical communication between the first electrical contact and the first semiconductor layer, and a second array of conductive microcontacts extends through the passivation layer. In certain embodiments, a substrate useable for forming and supporting an array of flip chip LEDs or flip chip pixels may include sapphire; alternatively, the substrate may include Si, SiC, a Group III-nitride material (e.g., GaN), or any combination of the foregoing materials (e.g., Si on sapphire, etc.) that may have a light extraction surface comprising microtextured etched surface having a non-repeating, irregular textural pattern, fabricated by methods disclosed herein. Further details regarding fabrication of flip chip LEDs are disclosed in U.S. Patent Application Publication No. 2017/0098746A1, with the entire contents thereof being hereby incorporated by reference herein.

FIG. 1 illustrates a single flip chip LED 10 including a light-transmissive substrate 15, first and second electrical contacts 61, 62, and a functional stack 60 (incorporating at least one light emitting active region 25) arranged therebetween. The flip chip LED 10 includes an internal light-transmissive surface 14 that is patterned (with multiple recessed and/or raised features 17) proximate to multiple semiconductor layers 21, 22 of the LED 10, including a multi-layer reflector proximate to the semiconductor layers 21, 22 according to one embodiment. The light-transmissive (preferably transparent) substrate 15 has an outer major surface 11, side edges 12, and the patterned surface 14. The multiple semiconductor layers 21, 22 sandwiching the light emitting active region 25 are adjacent to the patterned surface 14, and may be deposited via vapor phase epitaxy or any other suitable deposition process. In one implementation, a first semiconductor layer 21 proximate to the substrate 15 embodies an n-doped material (e.g., n-GaN), and a second semiconductor layer 22 embodies a p-doped material (e.g., p-GaN). A central portion of the multiple semiconductor layers 21, 22 including the active region 25 extends in a direction away from the substrate 15 to form a mesa 29 that is laterally bounded by at least one recess 39 containing a passivation material (e.g., silicon nitride (SiN) as part of a passivation layer 50), and that is vertically bounded by surface extensions 21A of the first semiconductor layer 21.

The multi-layer reflector is arranged proximate to (e.g., on) the second semiconductor layer 22, with the multi-layer reflector consisting of a dielectric reflector layer 40 and a metal reflector layer 42. The dielectric reflector layer 40 is arranged between the metal reflector layer 42 and the second semiconductor layer 22. In certain implementations, the dielectric reflector layer 40 comprises silicon dioxide ($SiO_2$), and the metal reflector layer 42 comprises Ag. Numerous conductive vias 41-1, 41-2 are defined in the dielectric reflector layer 40 and are preferably arranged in contact between the second semiconductor layer 22 and the metal reflector layer 42. In certain implementations, the conductive vias 41-1, 41-2 comprise substantially the same material(s) as the metal reflector layer 42. In certain implementations, at least one (preferably both) of the dielectric reflector layer 40 and the metal reflector layer 42 is arranged over substantially the entirety of a major surface of the mesa 29 terminated by the second semiconductor layer 22 (e.g., at least about 90%, at least about 92%, or at least about 95% of the major (e.g., lower) surface of the mesa 29 of the second semiconductor layer 22).

A barrier layer 48 (including first and second portions 48-1, 48-2) is preferably provided between the metal reflector layer 42 and the passivation layer 50. In certain implementations, the barrier layer 48 comprises sputtered titanium (Ti)/platinum (Pt) followed by evaporated gold (Au), or comprises sputtered Ti/nickel (Ni) followed by evaporated Ti/Au. In certain implementations, the barrier layer 48 may function to prevent migration of metal from the metal reflector layer 42. The passivation layer 50 is arranged between the barrier layer 48 and (i) the first externally accessible electrical contact (e.g., electrode, or cathode) 61 and (ii) the second externally accessible electrical contact (e.g., electrode, or anode) 62, which are both arranged along a lower surface 54 of the flip chip LED 10 separated by a gap 59. In certain implementations, the passivation layer 50 comprises SiN. The passivation layer 50 includes a metal-containing interlayer 55 arranged therein, wherein the interlayer 55 may include (or consist essentially of) aluminum (Al) or another suitable metal.

The LED 10 includes first and second arrays of microcontacts 63, 64 extending through the passivation layer 50, with the first array of microcontacts 63 providing conductive electrical communication between the first electrical contact 61 and the first (e.g., n-doped) semiconductor layer 21, and with the second array of microcontacts 64 providing conductive electrical communication between the second electrical contact 62 and the second (e.g., p-doped) semiconductor layer 22. The first array of microcontacts 63 extends from the first electrical contact 61 (e.g., n-contact) through the passivation layer 50, through openings defined in the interlayer 55, through openings 52 defined in the first portion 48-1 of the barrier layer 48, through openings defined in a first portion 42-1 of the metal reflector layer 42, through openings defined in a first portion 40-1 of the dielectric reflector layer 40, through the second semiconductor layer 22, and through the active region 25 to terminate in the first semiconductor layer 21. Within the openings defined in the interlayer 55, the first portion 48-1 of the barrier layer 48, the first portion 42-1 of the metal reflector layer 42, and the first portion 40-1 of the dielectric reflector layer 40, dielectric material of the dielectric reflector layer 40 laterally encapsulates the first array of microcontacts 63 to prevent electrical contact between the first array of microcontacts 63 and the respective layers 55, 48, 42, 40. The conductive vias 41-1 defined in the first portion 40-1 of the dielectric reflector layer 40 contact the first portion 40-1 of the dielectric reflector layer 40 and the second semiconductor layer 22, which may be beneficial to promote current spreading in the active region 25. The second array of microcontacts 64 extends from the second electrical contact 62 through the passivation layer 50 and through the openings defined in the interlayer 55 to at least one of (i) the second portion 48-2 of the barrier layer 48, and (ii) a second portion 42-2 of the metal reflector layer 42, wherein electrical communication is established between the metal reflector layer 42 and the second semiconductor layer 22 through the conductive vias 41-2 defined in a second portion 40-2 of the dielectric reflector layer 40. Although the second array of microcontacts 64 is preferred in certain implementations, in other implementations, a single second microcontact may be substituted for the second array of microcontacts 64. Similarly, although it is preferred in certain implementations to define multiple vias 41-2 in the second portion 40-2 of the dielectric reflector layer 40, in other implementations, a single via or other single conductive path may be substituted for the conductive vias 41-2.

Following formation of the passivation layer 50, one or more side portions 16 extending between the outer major surface 11 of the substrate 15 and the surface extensions 21A of the first semiconductor layer 21 are not covered with passivation material. Such side portions 16 embody a non-passivated side surface.

In operation of the flip chip LED 10, current may flow from the first electrical contact (e.g., n-contact or cathode) 61, the first array of microcontacts 63, and the first (n-doped) semiconductor layer 21 into the active region 25 to generate light emissions. From the active region 25, current flows through the second (p-doped) semiconductor layer 22, the conductive vias 41-2, the second metal reflector layer portion 42-2, the second barrier layer portion 48-2, and the second array of microcontacts 64 to reach the second electrical contact (e.g., p-contact or anode) 62. Emissions generated by the active region 25 are initially propagated in all directions, with the reflector layers 40, 42 serving to reflect emissions in a direction generally toward the substrate 15. As emissions reach the patterned surface 14 arranged between the substrate 15 and the first semiconductor layer 21, the recessed and/or raised features 17 arranged in or on the patterned surface 14 promote refraction rather than reflection at the patterned surface 14, thereby increasing the opportunity for photons to pass from the first semiconductor layer 21 into the substrate 15 and thereafter exit the LED 10 through the outer major surface 11 and non-passivated side portions 16. In certain implementations, one or more surfaces of the LED 10 may be covered with one or more lumiphoric materials (not shown), to cause at least a portion of emissions emanating from the LED 10 to be up-converted or down-converted in wavelength.

Figure 2A:
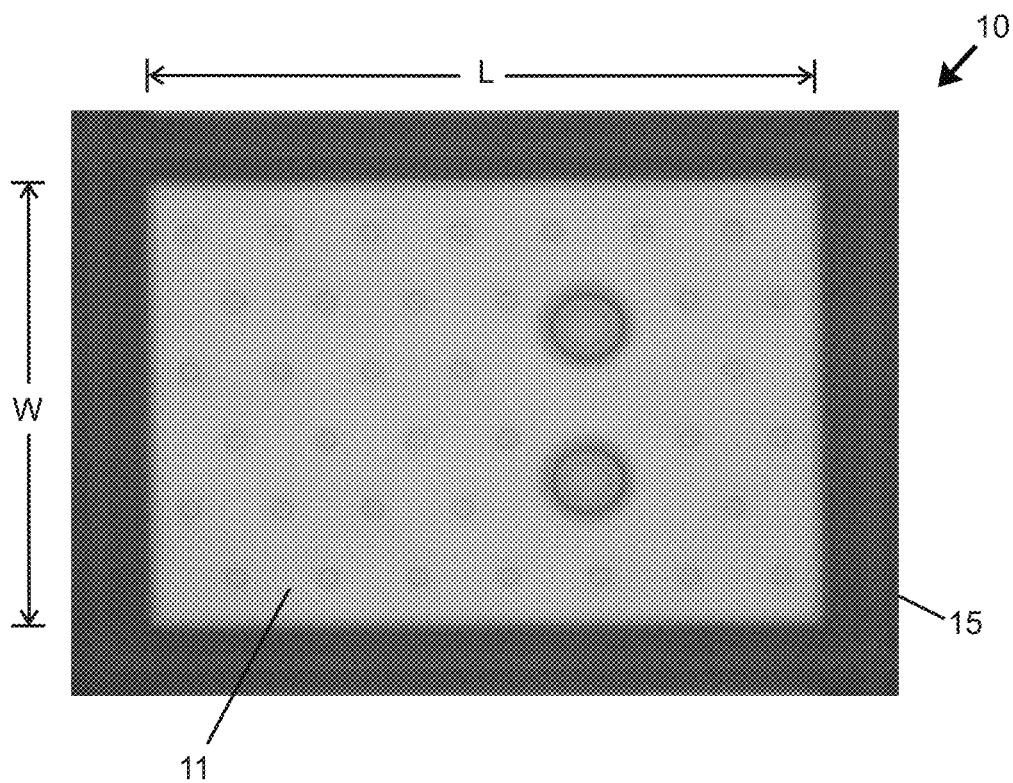
FIG. 2A is a plan view photograph of a flip chip LED, with a transparent substrate facing upward, useable in flip chip arrays according to embodiments of the present disclosure.
Figure 2B:
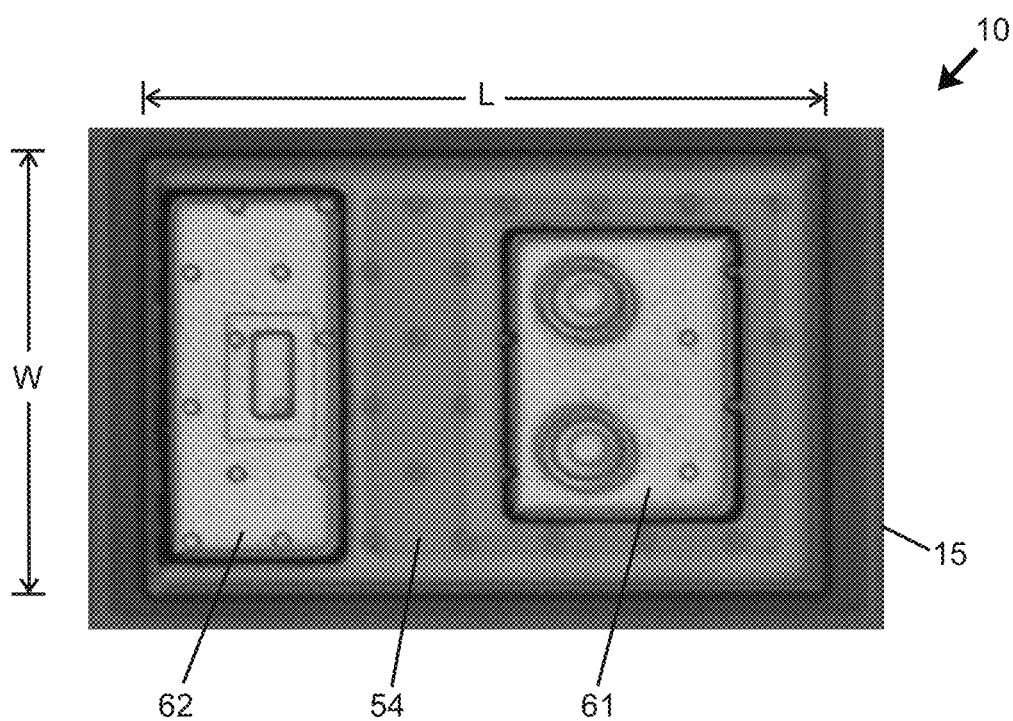
FIG. 2B is a plan view photograph of the flip chip LED of FIG. 2A, with electrodes facing upward.

FIGS. 2A and 2B are plan view photographs of a single flip chip LED 10 similar in structure and operation to the flip chip LED 10 of FIG. 1. Referring to FIG. 2A, the flip chip LED 10 includes an outer major surface 11 (i.e., a light extraction surface) arranged for extraction of LED emissions, and includes an active region having a length L and a width W. In certain embodiments, the active region includes a length L of about 280 microns (μm), and a width W of about 220 μm, and a substrate 15 extends beyond the active region. Referring to FIG. 2B, the flip chip LED 10 includes a cathode (e.g., first electrical contact) 61 and an anode (e.g., second electrical contact) 62 arranged along a lower surface 54. In certain embodiments, the cathode 61 includes length and width dimensions of about 95 μm by 140 μm, and the anode 62 includes length and width dimensions of about 70 μm by 170 μm.

Figure 3A:
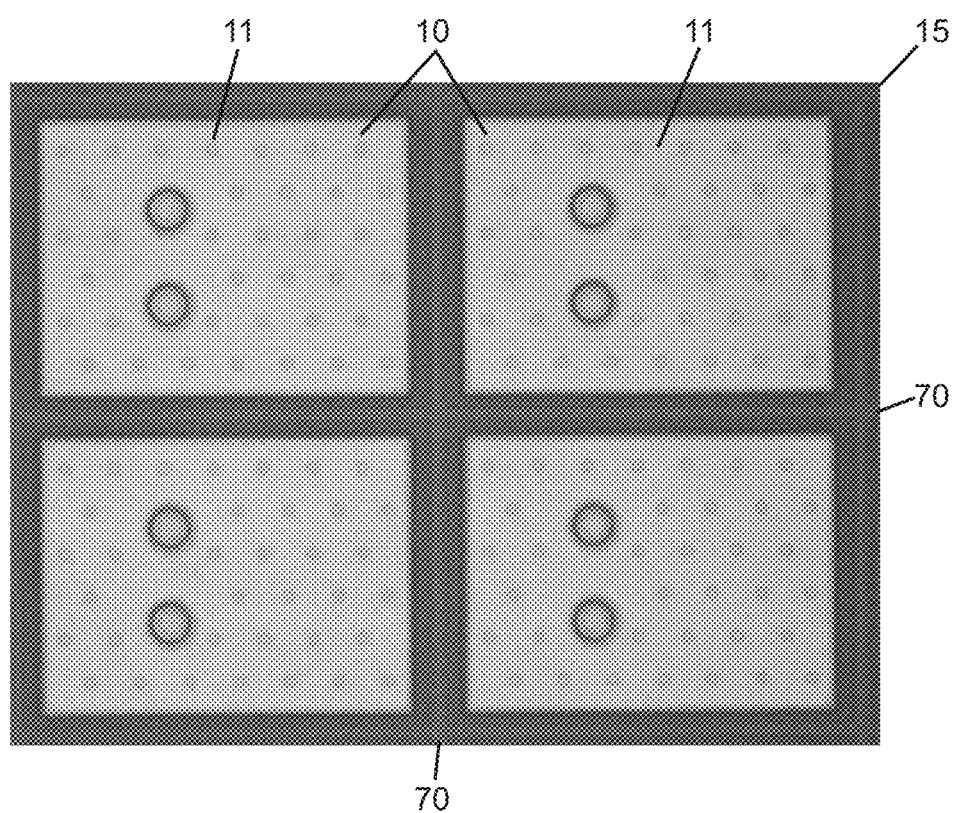
FIG. 3A is a plan view photograph of a pixelated-LED chip including an array of four flip chip type LEDs on a single transparent substrate facing upward, useable in embodiments of the present disclosure.
Figure 3B:
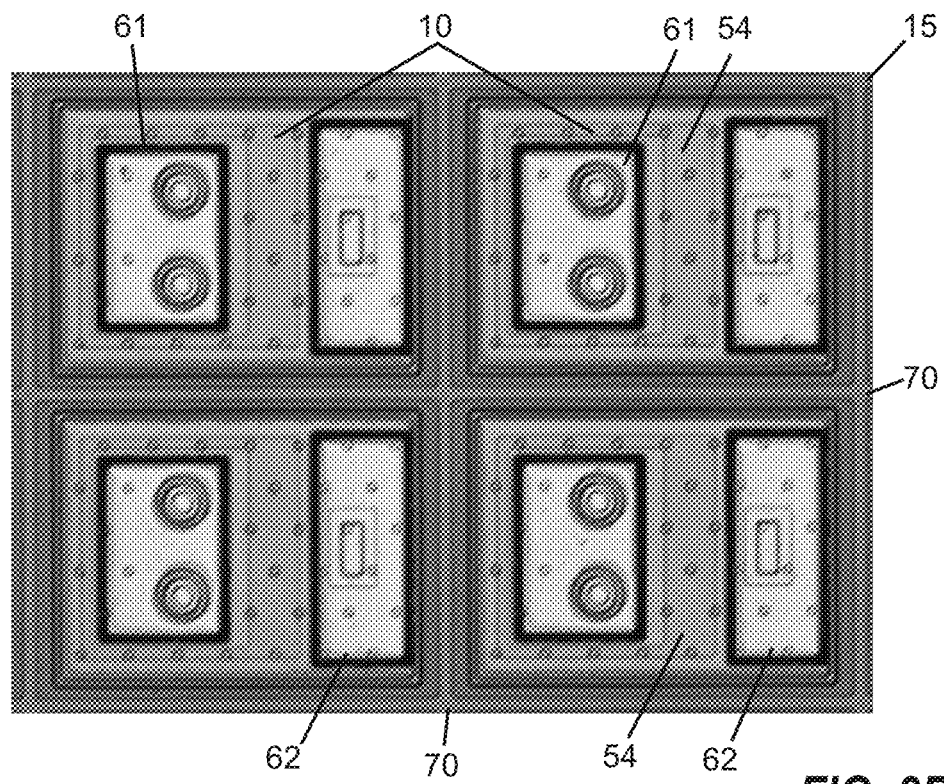
FIG. 3B is a plan view photograph of the pixelated-LED chip of FIG. 3A, with electrodes facing upward.

FIGS. 3A and 3B are plan view photographs of a pixelated-LED chip including an array of four flip chip LEDs 10 formed on a single transparent substrate 15, with each flip chip LED 10 being substantially similar in structure and operation to the flip chip LED 10 of FIG. 1. Each flip chip LED 10 includes an active layer portion of an active layer. The active layer portion of each flip chip LED 10 is spaced apart from the active area of each adjacent flip chip LED 10 by a gap (e.g., 40 μm in a length direction and 30 μm in a width direction). A central portion of each gap embodies a street 70 (e.g., having a width of about 10 μm) consisting solely of the substrate 15, whereas peripheral portions of each gap (between each street 70 and active areas of LEDs 10) includes the substrate 15 as well as passivation material (e.g., the passivation layer 50 shown in FIG. 1). Each street 70 thus represents a boundary between adjacent flip chip LEDs 10. Each flip chip LED 10 includes a cathode 61 and an anode 62 arranged along a lower surface 54, and each flip chip LED 10 is arranged to emit light through an outer major surface 11 of the substrate 15. The exposed cathodes 61 and anodes 62 permit separate electrical connections to be made to each flip chip LED 10, such that each flip chip LED 10 may be individually addressable and independently electrically accessed. Additionally, this allows groups or subgroups of the flip chip LEDs 10 to be accessed together, separately from other flip chip LEDs 10. If it were desired to separate the flip chip LEDs 10 from one another, then a conventional method to do so would be to utilize a mechanical saw to cut through the streets 70 to yield individual flip chip LEDs 10.

Figure 4A:
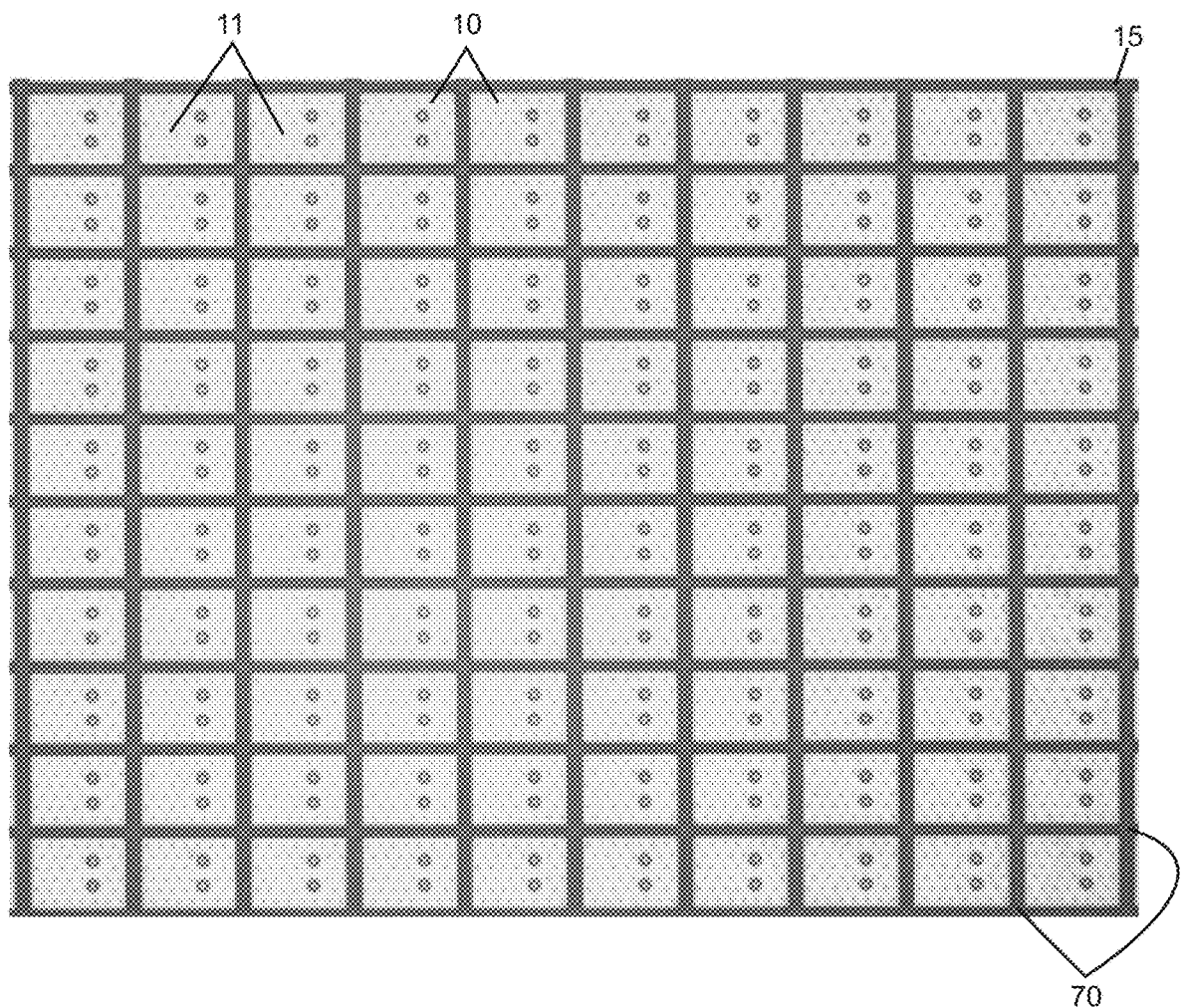
FIG. 4A is a plan view photograph of a pixelated-LED chip including an array of one hundred flip chip LEDs on a single transparent substrate facing upward, useable in embodiments of the present disclosure.
Figure 4B:
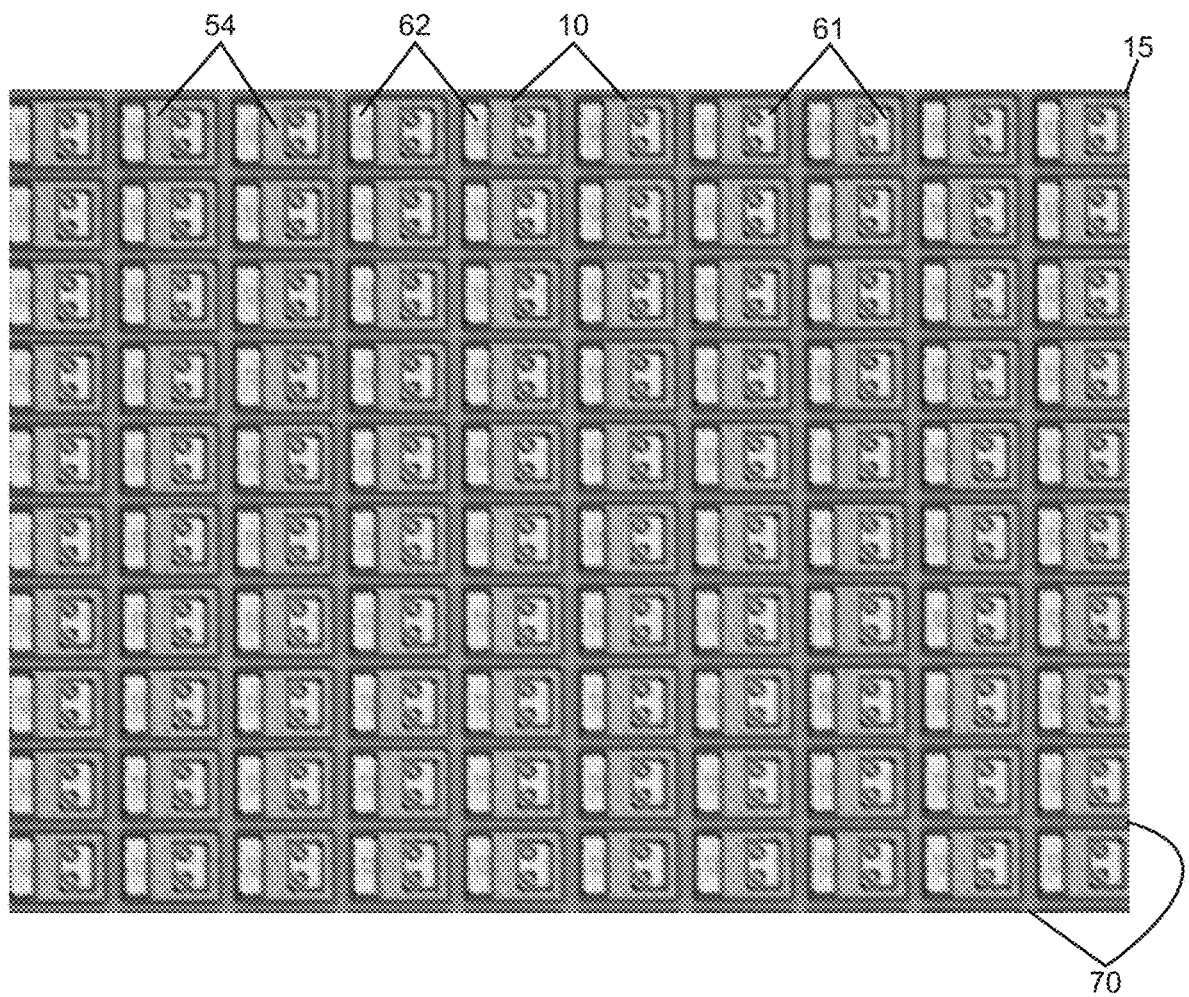
FIG. 4B is a plan view photograph of the pixelated-LED chip of FIG. 4A, with electrodes facing upward.

FIGS. 4A and 4B are plan view photographs of a pixelated-LED chip including an array of one hundred flip chip LEDs 10 on a single transparent substrate 15, with each flip chip LED 10 being substantially similar in structure and operation to the flip chip LED 10 illustrated in FIG. 1. The flip chip LEDs 10 are separated from one another by gaps including streets 70. Each flip chip LED 10 includes an outer major surface 11 arranged for extraction of LED emissions, and includes a cathode 61 and an anode 62 arranged along a lower surface 54. The exposed cathodes 61 and anodes 62 permit separate electrical connections to be made to each flip chip LED 10, such that each flip chip LED 10 may be individually addressable and independently electrically accessed.

In certain embodiments, each flip chip LED of an array of LEDs supported by a single substrate (e.g., a pixelated-LED chip) includes a greatest lateral dimension of no greater than about 400 µm, about 300 µm, or about 200 µm. In certain embodiments, each flip chip LED pixel of an array of LEDs supported by a single substrate includes inter-pixel spacing of no greater than about 60 µm, or about 50 µm, or about 40 µm, or about 30 µm, or about 20 µm, or about 10 µm. Such dimensional ranges provide a desirably small pixel pitch.

In certain embodiments, a pixelated-LED chip includes LEDs serving as pixels each having a substantially square shape. In certain embodiments, a pixelated-LED chip includes LEDs serving as pixels each having a rectangular (but non-square) shape. In other embodiments, LEDs may be provided as pixels having hexagonal shapes, triangular shapes, round shapes, or other shapes.

In certain embodiments, a pixelated-LED chip may include LEDs provided in a two-dimensional array as pixels of about 70 µm long×70 µm wide, each including an active region of about 50 µm long×50 µm wide, thereby providing a ratio of emitting area to total area of 0.0025 mm$^2$/0.0049 mm$^2$=0.51 (or 51%). In certain embodiments, an array of at least 100 LEDs (as shown in FIG. 4B) may be provided in an area of no greater than 32 mm long×24 mm wide, with spacing between LEDs (pixel pitch) of no greater than 40 µm in the length direction and no greater than 30 µm in the width direction. In certain embodiments, each LED may include an emissive area of 280 µm long×210 µm wide (totaling an area of 0.0588 mm$^2$). Considering a total top area of 320 µm long×240 µm wide (totaling an area of 0.0768 mm$^2$) for each LED, a ratio of emissive area to total area (i.e., including emissive area in combination with non-emissive area) along a major (e.g., top) surface is 76.6%. In certain embodiments, a light emitting device as disclosed herein includes a ratio of emissive area to non-emissive (or dark) area along a major (e.g., top) surface of at least about 30%, at least about 40%, at least about 50% (i.e., about 1:1 ratio of emitting area to non-emitting (dark) area), at least about 55%, at least about 60%, at least about 65%, at least about 70%, at least about 75%, or at least about 80%. In certain embodiments, one or more of the foregoing values may optionally constitute a range bounded by an upper value of no greater than 70%, 75%, 80%, 85%, or 90%. In certain embodiments, an array of at least 1000 LEDs may be provided.

Although FIGS. 2A, 2B, 3A, 3B, 4A, and 4B show each LED 10 as including two n-contact vias (embodying vertically offset circles registered with the n-contact or cathode 61), in certain embodiments, n-contacts and any associated n-contact vias may be shifted laterally and provided in a dark area outside the emitting area of each LED 10.

As noted previously, the omnidirectional character of LED and phosphor emissions may render it difficult to prevent emissions of one LED (e.g., a first pixel) from significantly overlapping emissions of another LED (e.g., a second pixel) of an array of flip chip LEDs arranged on a single light-transmissive substrate. A single transparent substrate supporting multiple flip chip LEDs would permit light beams to travel in numerous directions, leading to light scattering and loss of pixel-like resolution of emissions transmitted through the substrate. Problems of light scattering and loss of pixel-like resolution would be further exacerbated by presence of one or more lumiphoric materials overlying the light extraction surface of a substrate, owing to the omnidirectional character of lumiphor emissions. In certain embodiments, this issue may be addressed at least in part by providing light segregation elements configured to reduce interaction between emissions of different LEDs and/or lumiphoric material regions, thereby reducing scattering and/or optical crosstalk and preserving pixel-like resolution of the resulting emissions. In this manner, light segregation elements as described herein may additionally provide strong contrast and/or sharpness between lit and unlit regions of LED arrays. In certain embodiments, exemplary light segregation elements may extend from a light injection surface into a substrate, may extend from a light extraction surface into a substrate, may extend outward from a light extraction surface, or any combination of the foregoing. In certain embodiments, multiple light segregation elements may be defined by different methods in the same substrate and/or light emitting device. In certain embodiments, light segregation elements of different sizes and/or shapes may be provided in the same substrate and/or light emitting device. For example, in certain embodiments, a first group of light segregation elements having a first size, shape, and/or fabrication technique may extend from a light injection surface into an interior of a substrate, and a second group of light segregation elements having a second size, shape, and/or fabrication technique may extend from the light injection surface into the interior of the substrate, wherein the second size, shape, and/or fabrication technique differs from the first size, shape, and/or fabrication technique. In certain embodiments, light segregation elements may include recesses (whether filled or unfilled) defined in a substrate supporting multiple LEDs, with such recesses embodying boundaries between pixels.

In certain embodiments, an underfill material may be arranged between pixels of a pixelated-LED chip to form light segregation elements. In some embodiments, the underfill material comprises TiO$_2$ particles suspended in a silicone binder. In certain embodiments, the underfill material comprises a dielectric material. In other embodiments, the underfill material comprises air.

In certain embodiments, light segregation elements may additionally or alternatively be formed in a lumiphoric material layer arranged over a light extraction surface of a pixelated-LED chip. In certain embodiments, gaps or cuts may be defined in a light extraction surface of a pixelated-LED chip, such as by cutting with a blade or other suitable methods. These gaps or cuts may be left unfilled, or optionally may be filled with one or more light-affecting materials.

Figure 5:
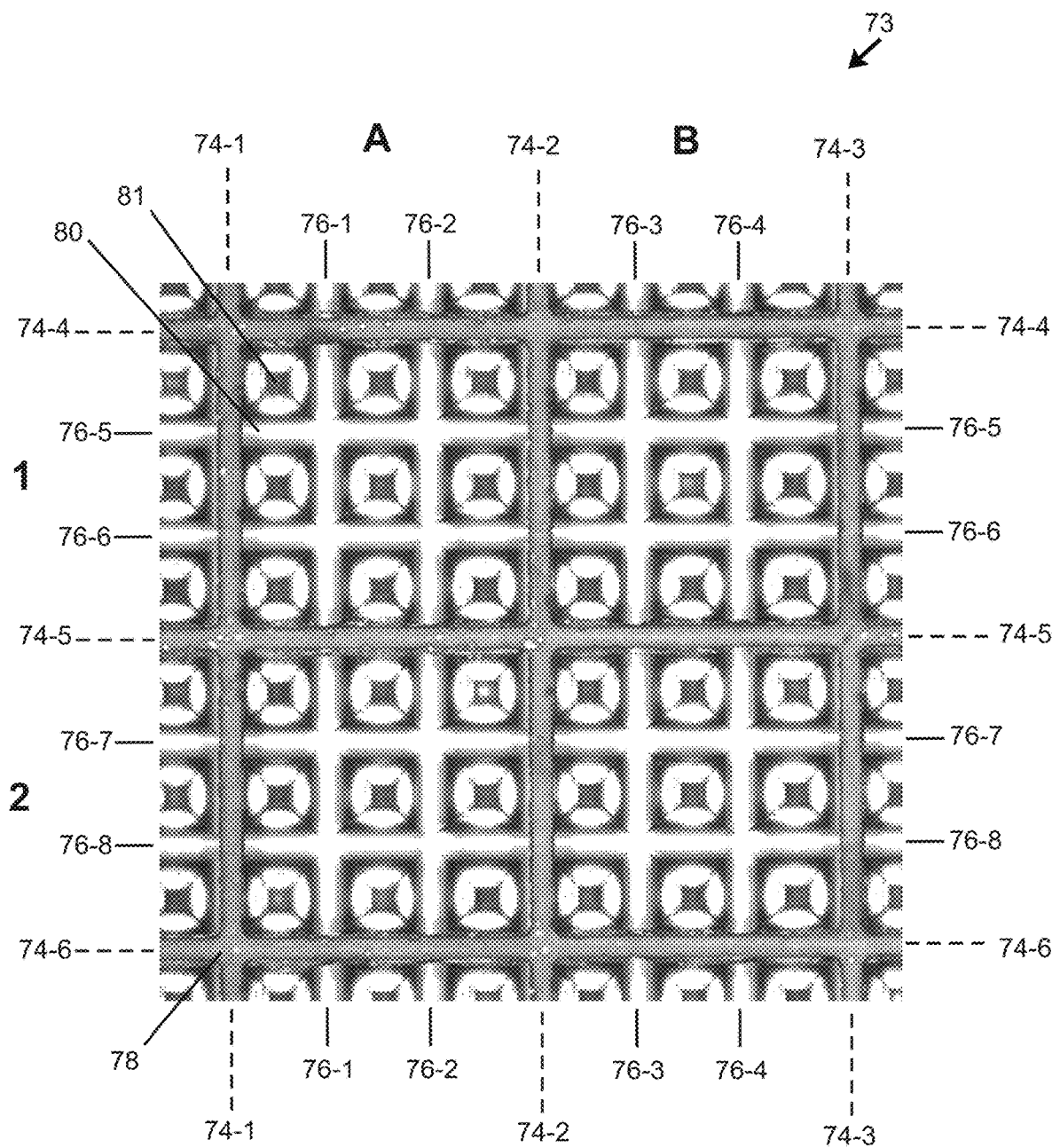
FIG. 5 is an upper perspective view photograph of a portion of a pixelated-LED light emitting device incorporating pixelated-LED chips according to the design of FIG. 23 to illustrate pixel placement and spacing.

FIG. 5 is an upper perspective view photograph of a portion of a pixelated-LED light emitting device 72 (e.g., according to the design of FIG. 27), showing a plurality of pixels A1, A2, B1, and B2. Alphanumeric column labels A and B appear at top between vertical dashed lines, and Arabic numerals 1 and 2 appear at left between horizontal dashed lines to provide column and row references for individual pixels. The vertical and horizontal dashed lines correspond to street-aligned cut lines or regions 74-1 to 74-6 that define lateral borders and inter-pixel spaces between the pixels A1, A2, B1, and B2. Dashed lines extending outward beyond the image represent extensions of boundaries between pixels. The vertical and horizontal solid lines correspond to cut lines or regions 76-1 to 76-8 that are not aligned with streets between pixels. As shown, additional cut lines or regions 76-1 to 76-8 may be provided (e.g., and formed by bevel cutting) to form a patterned surface of macro-textural protruding features 80 (e.g., square-base pyramidal shapes) to promote extraction of light from each pixel. In various embodiments disclosed herein, these macro-textural features are omitted, and replaced by a microtextured etched surface having a non-repeating, irregular textural pattern. The underfill material 73 is configured along the lateral borders of each pixel A1, A2, B1, B2 for improved contrast. The width of the street-aligned cut lines 74-1 to 74-6 forms at least a portion of the spacing between pixels. In certain embodiments, each pixel A1, A2, B1, B2 of the pixelated-LED light emitting device 72 is spaced from adjacent pixels by a distance no greater than about 60 μm, or about 50 μm, or about 40 μm, or about 30 μm, or about 20 μm, or about 10 μm, or in a range of from about 10 μm to about 30 μm, or in a range of from about 10 μm to about 20 μm. Such dimensional ranges provide a desirably small pixel pitch. The spacing between pixels also relates to the width of the underfill material 73 that is configured between adjacent pixels. For example, in some embodiments, a 25 μm spacing between pixels allows more of the underfill material 73 (about 25 μm width) to be configured between adjacent pixels than a pixel spacing of 20 μm. Accordingly, more light may be reflected and redirected out of each pixel without leaking into an adjacent pixel by the underfill material 73 with 25 μm spacing compared to the underfill material 73 with 20 μm spacing, thereby providing improved contrast and pixel brightness. Notably, for a constant spacing between the street-aligned cut lines 74-1 to 74-6, a pixel spacing of 25 μm reduces the area of each pixel; however, the increase in the underfill material 73 may still provide brighter pixels with improved contrast.

In certain embodiments, inter-pixel spaces are provided between adjacent pixels in a pixelated-LED chip. Inter-pixel spaces are formed when individual pixels are defined within a pixelated-LED chip and may include spaces between various elements of adjacent pixels, including active layer portions, substrate portions, and electrical contacts, among others. In certain embodiments, an underfill material is arranged in the inter-pixel spaces to cover all lateral surfaces between adjacent pixels. Additionally, the underfill material may substantially fill entire inter-pixel spaces between adjacent pixels. In certain embodiments, the electrical contacts for each pixel include an anode and a cathode and the underfill material is additionally arranged between the anode and cathode of each pixel.

Figure 6A:
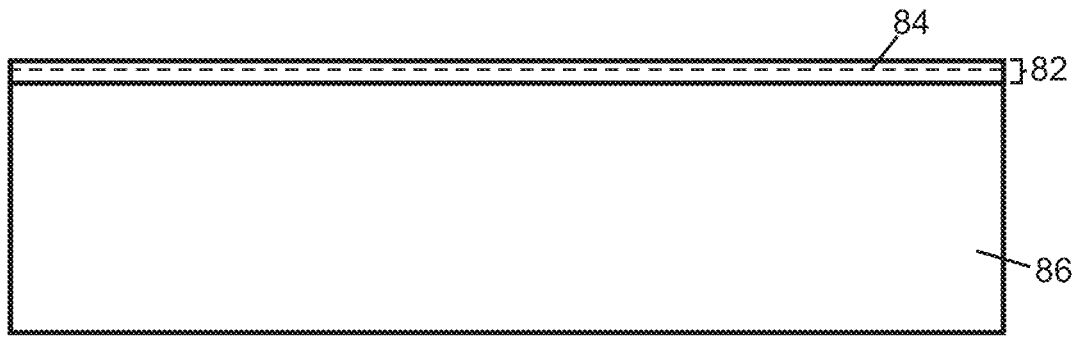
FIGS. 6A-6F are schematic cross-sectional views of various states of fabrication of a pixelated-LED chip prior to initiation of microtexturing steps.

FIGS. 6A-6F are schematic cross-sectional views of various states of fabrication of a pixelated-LED chip, prior to initiation of microtexturing steps. In FIG. 6A, an LED structure 82 including an active layer 84 has been deposited on a substrate 86. The LED structure 82 may include a plurality of epitaxial layers deposited by metal organic chemical vapor deposition (MOCVD). In addition to the active layer 84, the LED structure 82 may further include one or more n-type semiconductor layers and one or more p-type semiconductor layers. In some embodiments, the LED structure 82 includes Group III nitrides including but not limited to GaN, aluminum gallium nitride (AlGaN), aluminum indium gallium nitride (AlInGaN), and indium gallium nitride (InGaN). An exemplary n-type dopant is Si and an exemplary p-type dopant is magnesium (Mg). The active layer 84 may be configured between at least one n-type layer and one p-type layer. The active layer 84 may include a single quantum well (SQW) structure that includes a layer of InGaN or a multiple quantum well (MQW) structure such as a plurality of layers that include alternating layers of InGaN and GaN. Other semiconductor materials are possible, including gallium arsenide (GaAs), gallium phosphide (GaP), and alloys thereof. The substrate 86 may include a light-transmissive material such as SiC or sapphire, although other substrate materials are possible.

Figure 6B:
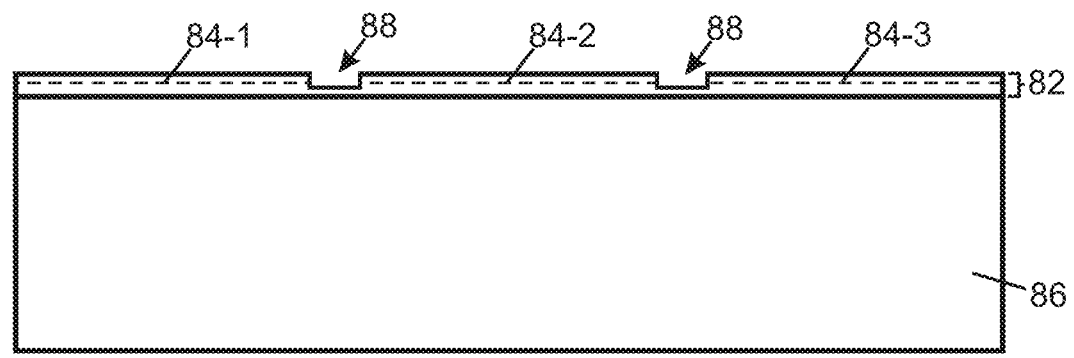
Figure 6C:
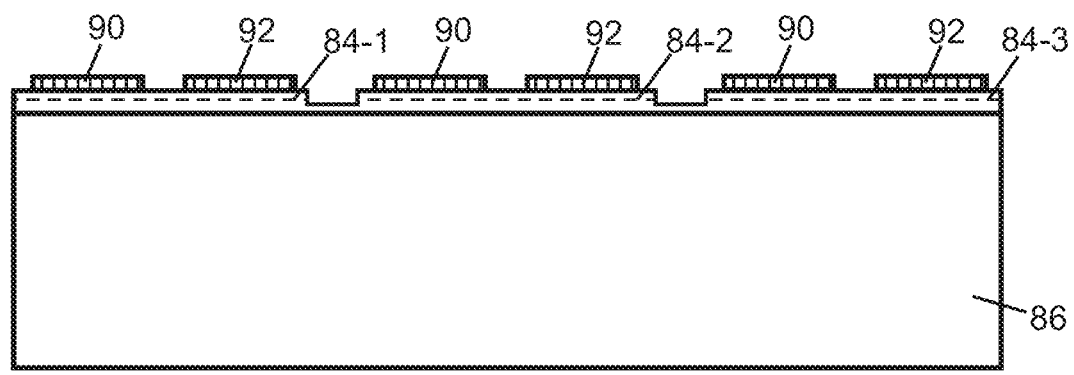

In FIG. 6B, a plurality of active layer portions 84-1 to 84-3 have been formed from the LED structure 82. A plurality of recesses or streets 88 are configured to segregate the active layer portions 84-1, 84-2, and 84-3. The plurality of recesses 88 may be formed by selectively etching portions of the LED structure 82. In some embodiments, the plurality of recesses 88 extends entirely through the active layer 84 and less than an entire thickness of an n-type layer that is between the active layer 84 and the substrate 86. In certain embodiments, the plurality of recesses 88 may further extend into the substrate 86 to any desired depth. In certain embodiments, an etching step is applied to the LED structure 82 to form the plurality of active layer portions 84-1 to 84-3. In FIG. 6C, electrical contacts that include an anode 90 and a cathode 92 are deposited over each of the active layer portions 84-1 to 84-3 to form a plurality of anode-cathode pairs 90, 92.

Figure 6D:
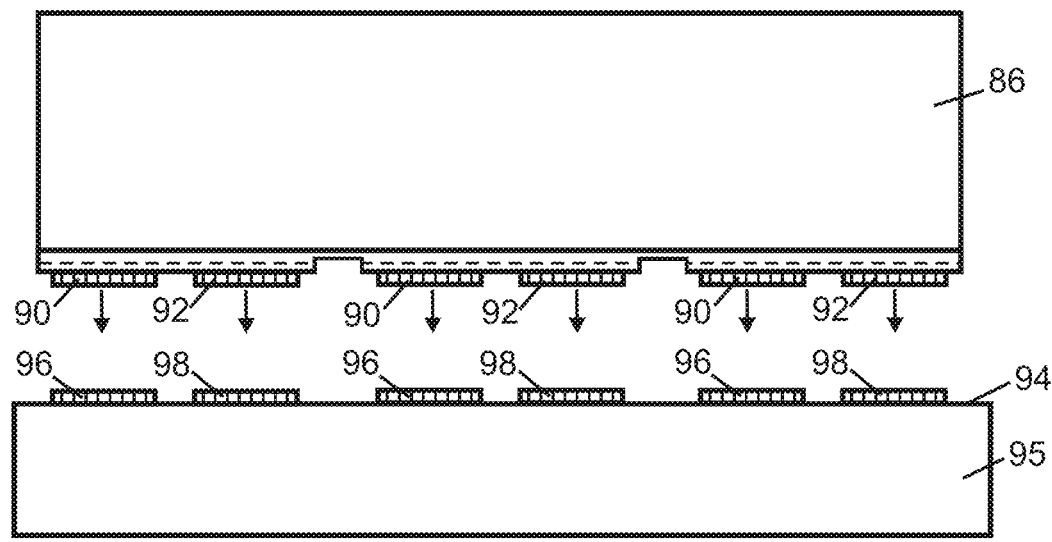
Figure 6E:
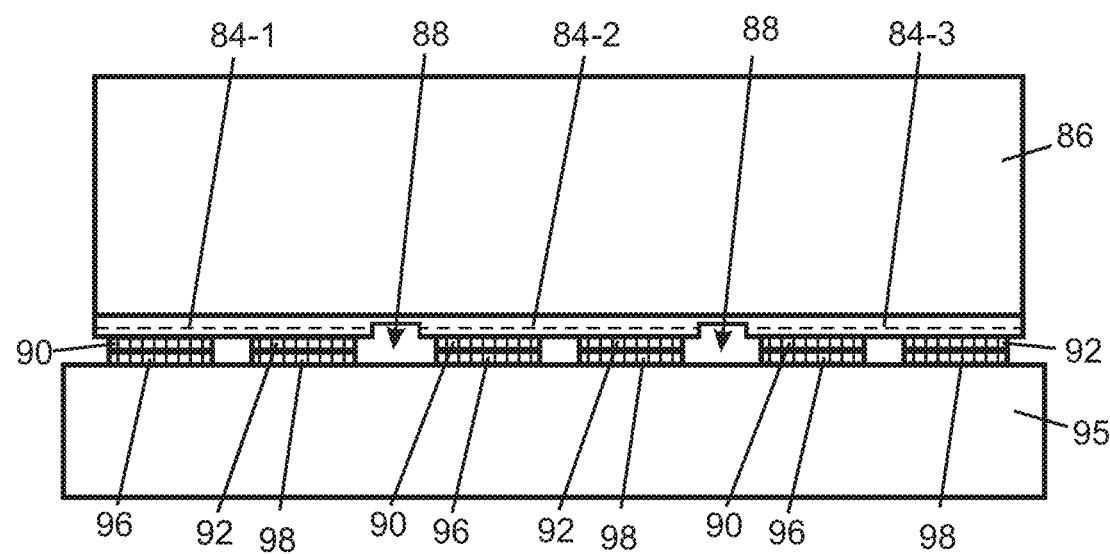

In FIG. 6D and FIG. 6E, the substrate 86 is flip-chip mounted over a mounting surface 94. In some embodiments, the mounting surface 94 is a surface of a submount 95 that includes a plurality of electrode pairs 96, 98. The submount 95 may comprise an active interface element such as an ASIC chip, a passive interface element that serves as an intermediate element that may be later-attached to an active interface element, or a temporary interface element that provides temporary support for subsequent manufacturing steps. For embodiments where the submount 95 comprises a temporary interface element, the plurality of electrode pairs 96, 98 may be omitted. The flip-chip mounting comprises establishing electrically conductive paths between the plurality of anode-cathode pairs 90, 92 and the plurality of electrode pairs 96, 98. In some embodiments, the plurality of anode-cathode pairs 90, 92 are planarized before flip-chip mounting to correct any variations in thicknesses from the anode-cathode deposition. Such planarization helps ensure that reliable electrical contacts may be made across the electrode pairs 96, 98 distributed across the entire interface between the submount 95 and the substrate 86, and avoids variation in interfacial height that would otherwise promote cracking of the substrate 86 when the substrate 86 is mechanically processed (e.g., thinned and shaped) in subsequent steps. The submount 95 may include a plurality of separate electrical paths, including one electrical path for each electrode pair of the plurality of electrode pairs 96, 98. In this regard, each of the active layer portions 84-1 to 84-3 may be independently electrically accessible. Additionally, this allows a group or subgroup of the active layer portions (e.g., 84-1 and 84-2) to be accessed together, independently of other active layer portions (e.g., 84-3). Any suitable material and/or technique (e.g., solder attachment, preform attachment, flux or no-flux eutectic attachment, silicone epoxy attachment, metal epoxy attachment, thermal compression attachment, bump bonding, and/or combinations thereof) can electrically connect the plurality of anode-cathode pairs 90, 92 and the plurality of electrode pairs 96, 98. In some embodiments, residue from the mounting step may be left in undesired areas between the substrate 86 and the submount 95 (such as in the recesses or streets 88), and a cleaning step (such as an ultrasonic clean), may be used to remove the residue.

Figure 6F:
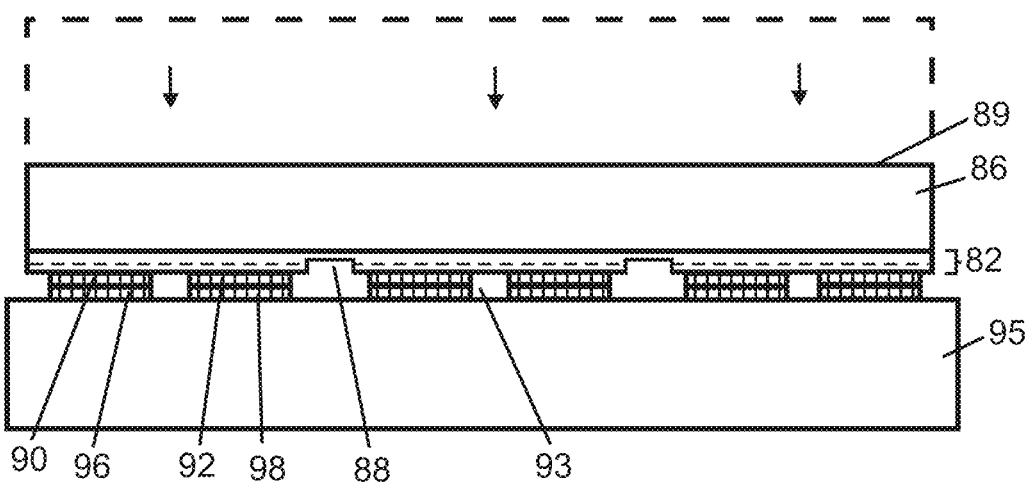

In FIG. 6F, the substrate 86 may be subjected to one or more thinning processes such as etching, grinding, lapping, mechanical polishing, chemical polishing, chemical-mechanical polishing, and the like. In some embodiments, the substrate 86 may initially comprise a thickness of greater than 300 µm, wherein this increased thickness facilitates handling and avoids breakage before the substrate 86 (with LED structure 82) is mounted over the submount 95. After mounting the substrate 86 to the submount 95 (i.e., to provide mechanical support, and to provide electrical connections to the LED structure 82 through the plurality of anode-cathode pairs 90, 92 and the plurality of electrode pairs 96, 98), the substrate 86 may be thinned to a thickness of no more than 100 µm. In some embodiments, the substrate 86 may be thinned to about 50 µm by one or more thinning steps. After thinning, the substrate 86 has a light extraction surface 89 that is unpatterned. In certain embodiments, multiple thinning steps may be performed in increments of 20-80 µm per thinning step. In certain embodiments, underfill material (not shown) may be provided between the substrate 86 and the submount 95 prior to the thinning (e.g., to fill the plurality of recesses or streets 88 as well as gaps 93 between anodes 90 and cathodes 92) to provide additional mechanical support for the substrate 86.

FIGS. 7A-7F illustrate various steps (e.g., following the steps illustrated in FIGS. 6A-6F) for fabricating a pixelated-LED chip to form a microtextured etched light extraction surface with a non-repeating, irregular textural pattern, and to add a lumiphoric material applied over the light extraction surface.

Figure 7A:
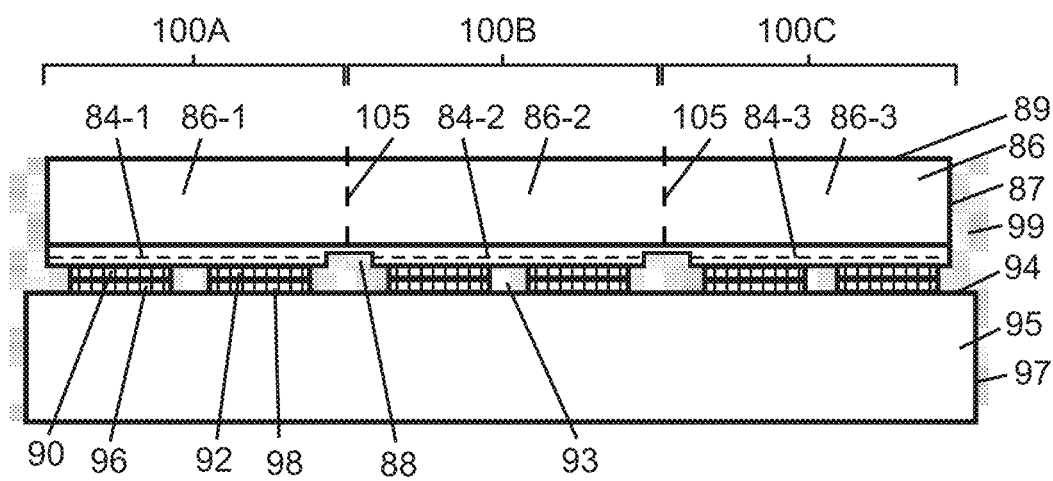
FIGS. 7A-7F are schematic cross-sectional views of various states of fabrication of a pixelated-LED chip that includes a substrate having a microtextured etched light extraction surface with a non-repeating, irregular textural pattern, and that includes a lumiphoric material applied over the light extraction surface.

FIG. 7A shows the structure of FIG. 6F following addition of an underfill and/or protective material 99 along lateral surfaces 87, 97 of the substrate 86 and submount 97, respectively, the upper surface 94 of the submount, as well as into the recesses or streets 88 and into the gaps 93 between anodes 90 and cathodes 92, in preparation for patterning of the light extraction surface 89. The underfill and/or protective material 99 may be used to enhance mechanical support between the substrate 86 and the submount 95, and may also be used to protect various surfaces (including lateral surfaces 87, 97) from being attacked by an etchant during one or more etching steps. In certain embodiments, the underfill and/or protective material 99 may include a first material between the substrate 86 and the submount 95, and may include a second material along lateral surfaces 87, 97 of the substrate 86 and submount 95. In certain embodiments, the underfill and/or protective material 99 may comprise a light-altering material, such as light-altering particles suspended in an insulating binder or a matrix. The light-altering material may include a material or particles that are configured to reflect, refract, or otherwise redirect light, or even absorb light generated from the active layer portions 84-1 to 84-3. In certain embodiments, the light-altering material may include combinations of different light-altering materials, such as light reflective or refractive particles suspended in the same binder as light-absorbing particles. The underfill and/or protective material 99 may comprise $TiO_2$ particles suspended in a silicone binder. In certain embodiments, a weight ratio of $TiO_2$ to silicone is in a range of 50% to 150%. In certain embodiments, the weight ratio of $TiO_2$ to silicone is about 100%, or about 1:1. Additionally, a solvent may be added to alter a viscosity of the underfill material 108 to promote improved penetration of the underfill and/or protective material 99 into confined spaces between the substrate 86 and the submount 95. In certain embodiments, the underfill and/or protective material 99 may comprise metallic particles suspended in an insulating binder. In some embodiments, the underfill and/or protective material 99 may comprise a dielectric material.

As shown, active layer portions 84-1 to 84-3 are registered with substrate portions 86-1 to 86-3 to form pixels 100A to 100C. If desired, the substrate 86 may be separated by a method such as etching or sawing with a rotary saw along various cut lines or regions (e.g., cut lines 105) optionally aligned with the recesses or streets 86 that segregate the active layer portions 84-1 to 84-3. In such an instance, the substrate 86 may be thereby segregated into a plurality of discontinuous substrate portions.

Figure 7B:
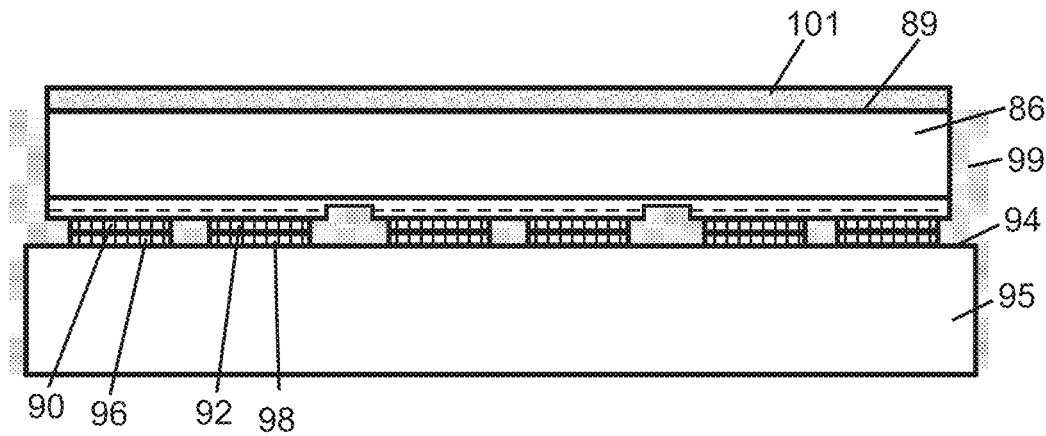

FIG. 7B shows the structure of FIG. 7A following formation of a micromask 101 over the light extraction surface 89. The micromask 101 includes first and second solid materials that exhibit different etching rates when exposed to a desired etchant. Upon exposure of the micromask 101 to an etchant, the etchant will consume (e.g., dissolve or chemically degrade) at least portions of one or more of the first or the second solid material, and etch portions of the light extraction surface 89 to form a microtextured etched surface having a non-repeating, irregular textural pattern. The first solid material having a first etching rate and a second solid material having a second etching rate that differs from the first etching rate. In certain embodiments, the first and second solid materials of the micromask 101 may be compositionally different (e.g., with one optionally being a metal oxide and the other a non-metallic oxide). In certain embodiments, the first solid material comprises titanium dioxide ($TiO_2$), and second solid material comprises silicon dioxide ($SiO_2$), with one example of a suitable $SiO_2$ composition being fumed silica (FS). Fumed silica is a known thixotropic agent (i.e., a rheology/viscosity modifier that serves to resist settling of solids in a fluid mixture). In certain embodiments, the micromask 101 is applied to the light extraction surface 89 by a spray coating process, with the first and second solid materials being dispersed in a liquid that evaporates readily (such as xylene), and the liquid-solid mixture being sprayed onto the light extraction surface by aid of pressurized gas. In certain embodiments, one or more of the first and second solid materials may be electrically charged and applied to the light extraction surface 89 by a process such as electrophoretic deposition. In certain embodiments, one or more surfactants (e.g., Diamaflow™ dicing solution (Keteca USA, Inc.), detergent, or the like) may be added to a mixture to be deposited for forming a micromask, with the desired effect of reducing clumping between particles of the first and/or second solid materials. In certain embodiments, if 100 parts by weight of liquid are present, a first solid material may be present in an amount of from 1 to 10 parts by weight, and a second solid material may be present in an amount of from 0.5 to 5 parts by weight.

Figure 7C:
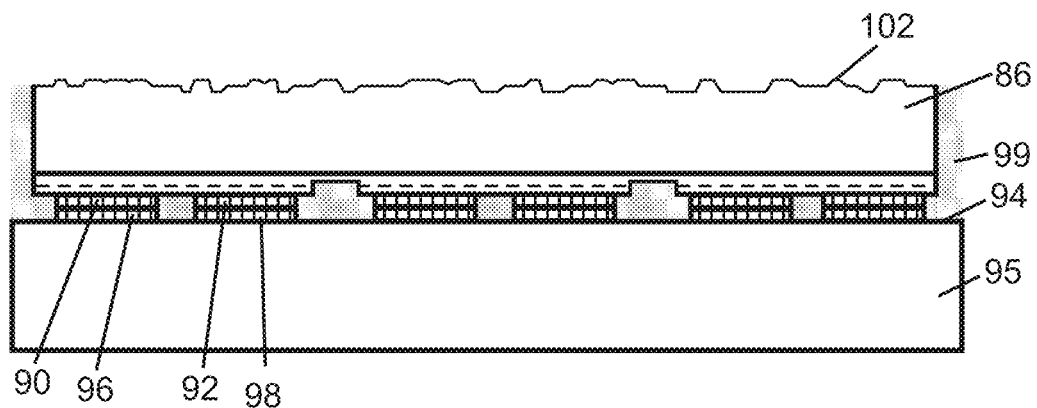

FIG. 7C shows the structure of FIG. 7B after etching of the light extraction surface (89 shown in FIG. 7B) through the micromask (101 shown in FIG. 7B), and rinsing of residual micromask material, to form a microtextured etched light extraction surface 102. In certain embodiments, the etching comprises use of a reactive ion etching (RIE) process performed in a chamber having a low-pressure plasma (e.g., fluorinated plasma) environment with a suitable etchant (e.g., $NF_3$). The microtextured etched light extraction surface 102 preferably has a non-repeating, irregular textured pattern with an average feature depth in a range of from 120 nm to 400 nm (or 150 nm to 350 nm, or 200 nm to 325 nm). In certain embodiments, the non-repeating, irregular textural pattern of the microtextured etched light extraction surface 102 is irregular in both a lateral direction and a vertical direction.

In one example, a reactive ion etching process may be performed utilizing the following steps. First, a reaction chamber is evacuated to a pressure of 110 mTorr and maintained at such value for 10 minutes. Thereafter, a pre-gas flow condition is established at a pressure of 100 mTorr, during which a gas mixture of $NF_3$ (90%) and $N_2O$ (10%) is supplied to the reaction chamber for 30 seconds with a RF generator setpoint of 0. Next, an active etching step includes supplying a gas mixture of $NF_3$ (90%) and $N_2O$ (10%) for 68 minutes, with a pressure of 100 mTorr and a RF generator power setpoint of 135 watts. Thereafter, the reaction chamber is evacuated with a turbopump at 110 mTorr and held for 10 seconds, and the reaction chamber is purged for 30 seconds at a pressure of 400 mTorr.

It is to be appreciated that the steps of adding a micromask to a light extraction surface, etching the light extraction surface through the micromask, and rinsing any residual micromask material from the light extraction surface, may be repeated in sequence as many times as desired to obtain a suitable degree of patterning when forming a microtextured etched light extraction surface. In certain embodiments, two cycles of mask formation, etching, and rinsing may be performed in sequence. In certain embodiments, surface topology may be examined and/or radiant flux may be measured after formation of a microtextured etched light extraction surface, and the results of such examination and/or measurement may be used to determine whether any additional cycles of mask formation, etching, and rinsing may be necessary or desired to obtain a desired result.

Figure 7D:
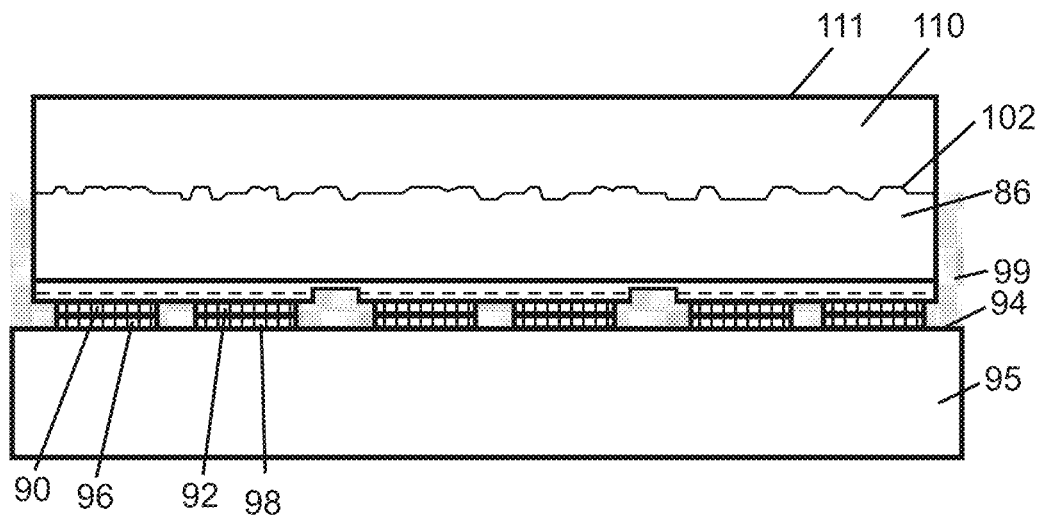

FIG. 7D shows the structure of FIG. 7C following addition of a (thick) lumiphoric material layer 110 over the microtextured etched light extraction surface 102. The lumiphoric material layer 110 may be applied by any suitable method such as spray coating, spin coating, dip coating, or the like to provide a first thickness terminating at an initial upper surface 111. As previously described, the lumiphoric material layer 110 may include one or more of a phosphor, a scintillator, a lumiphoric ink, a quantum dot material, a day glow tape, or the like. In certain embodiments, the lumiphoric material layer 110 may be in the form of one or more phosphors and/or quantum dots arranged in a binder such as silicone or glass, arranged in the form of a single crystalline plate or layer, a polycrystalline plate or layer, and/or a sintered plate. In certain embodiments, a light scattering material may be mixed with the lumiphoric material, or may be applied to the microtextured etched light extraction surface 102 prior to the formation of the lumiphoric material layer 110. In certain embodiments, the lumiphoric material layer 110 is configured to generate emissions that combine with emissions of the active layer portions 84-1 to 84-3 (shown in FIG. 7A) to produce light that is perceived as white in appearance. As shown in FIG. 7D, the lumiphoric material layer 110 has a significant thickness; such thickness may be reduced, as desired hereinafter.

Figure 7E:
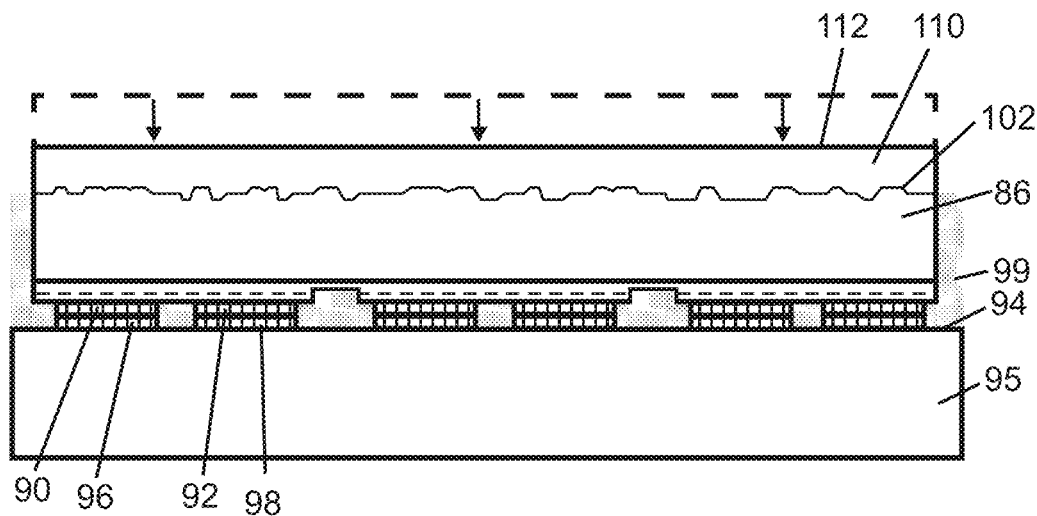

FIG. 7E shows the structure of FIG. 7D following thinning of the lumiphoric material layer 110 to terminate at a revised upper surface 112. Such thinning may be performed by any suitable method, but in certain embodiments is performed by grinding. In certain embodiments, the thinning of the lumiphoric material layer 110 is performed to enhance its flatness and to tune an output property (e.g., color property and/or radiant flux) of a pixelated-LED chip responsive to testing of the pixelated-LED chip. In certain embodiments, after a first step of thinning the lumiphoric material layer 110 is performed, the pixelated-LED chip may be electrically activated (by creating an electrical potential difference between the anodes 90 and cathodes 92), preferably by probing external contacts (not shown) of the submount 95, to identify a radiant flux and/or color property (e.g., color point) of emissions produced by the at least one pixelated-LED chip. Based on and in response to the radiant flux and/or color property identifying step, a thickness of the lumiphoric material layer 110 may further reduced by additional grinding or other material removal methods. In certain embodiments, a lumiphoric material layer 110 is reduced to a thickness in a range of from 20 microns to 100 microns, or in a range of from 20 microns to 50 microns.

Figure 7F:
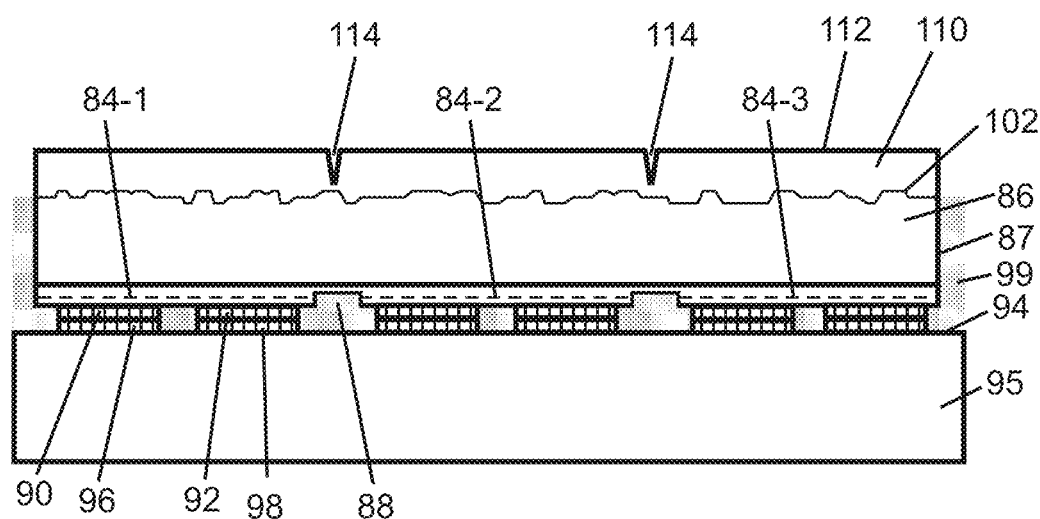

FIG. 7F shows the structure of FIG. 7E following modification of the lumiphoric material layer 110 to form cuts or gaps 114 therein to serve as light segregation elements. As shown, the cuts or gaps 114 are registered with the recesses or streets 88 that segregate the different active layer portions 84-1 to 84-3. In certain embodiments, the cuts or gaps 114 are defined by blade cutting through at least a portion of the lumiphoric material layer 110. In certain embodiments, the cuts or gaps 114 may be unfilled; in other embodiments, the cuts or gaps 114 may be at least partially filled with one or more light-affecting materials (not shown).

Although FIGS. 6A to 7F each show processing steps applied to one pixelated-LED chip, it is to be appreciated that various processing steps disclosed herein are suitable for being applied to numerous pixelated-LED chips simultaneously in a batch processing format. For example, the submount 95 shown in FIGS. 6D-6F and FIGS. 7A-7F may comprise a silicon wafer (e.g., of six or eight inch diameter) having various traces and structures formed thereon, wherein a multitude of pixelated-LED chips may be mounted to the wafer to be processed simultaneously (e.g., for steps such as thinning the substrate 86, applying underfill and/or protective material 99, applying a micromask 101, etching the substrate 86 through the micromask 101, rinsing the substrate 86, adding the lumiphoric material layer 110, and grinding the lumiphoric material layer 110). Moreover, the foregoing steps do not require precise alignment of pixelated-LED chips to facilitate bevel cutting in predefined areas. In this regard, the formation of microtextured patterned surfaces on pixelated-LED chips represents a significant advance over prior methods utilizing bevel cutting to form macro-textural features for light extraction.

Figure 8:
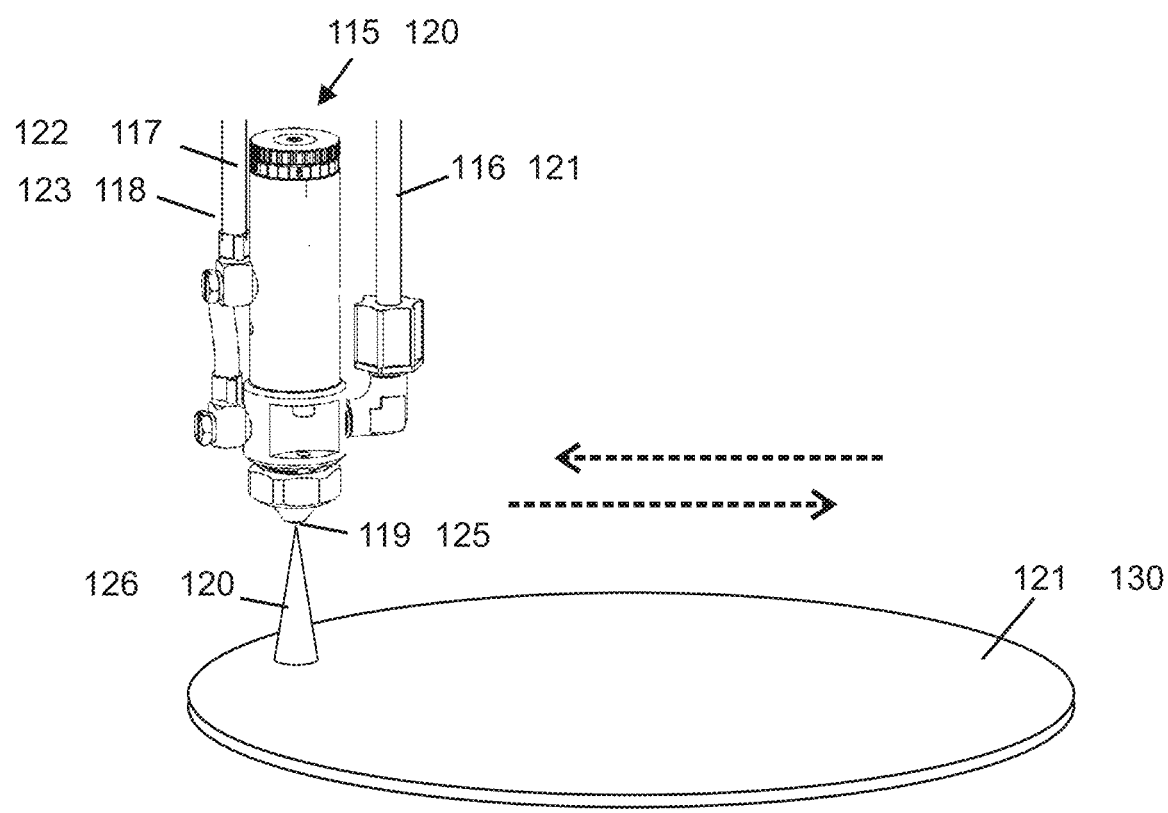
FIG. 8 is a schematic perspective view illustration of a spray coating apparatus for applying a micromask to one or more pixelated-LED chips previously mounted to a submount.

FIG. 8 is a schematic perspective view illustration of a spray coating apparatus 120 suitable for applying a micromask to one or more LED chips previously mounted to a submount 130, with the submount 130 being configured as a semiconductor (e.g., Si) wafer, optionally embodied in an ASIC chip. The spray coating apparatus 120 includes a fluid supply line 121, a control air supply line 122, a nozzle air supply line 123, and a nozzle 125 configured to generate a spray 126 for coating pixelated-LED chips (not shown) arranged on the submount 130. The spray coating apparatus 120 may be moved over the surface of the submount 130 in a raster-like manner to permit even coating of all items supported by the submount 130 with a micromask including a first solid material, a second solid material, and a volatile carrier liquid. In certain embodiments, the spray coating apparatus 120 may be moved across the submount 130 and then paused after each pass in order to provide time for a volatile liquid component of the micromask to evaporate, in order to prevent undesirable 'puddling' of liquid on the surface(s) to be coated. Once a liquid puddle forms, it has a tendency to undesirably "pull" particles laterally as the liquid evaporates, thereby interfering with substantially even distribution of particles of the first and second material on the surface to be coated. In certain embodiments, the spray coating apparatus 120 may include a spray valve (e.g., model 787 commercially available from Nordson EFD).

Figure 9A:
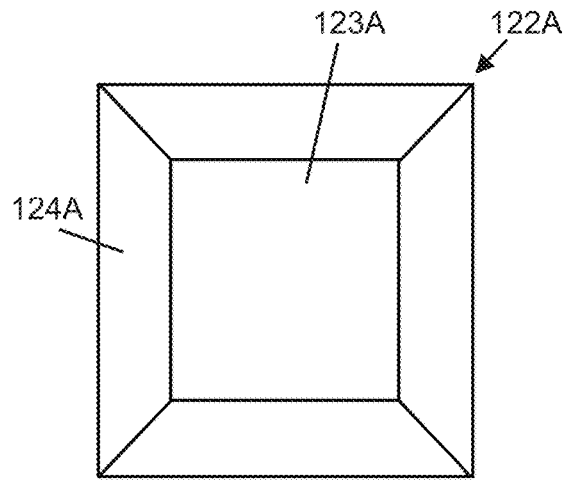
FIGS. 9A-9C provide top plan, side elevation, and bottom plan views, respectively, of a LED chip according to one embodiment arranged in flip-chip configuration with a substrate having an upper microtextured etched light extraction surface having a non-repeating, irregular textural pattern and sloping sidewalls.
Figure 9B:
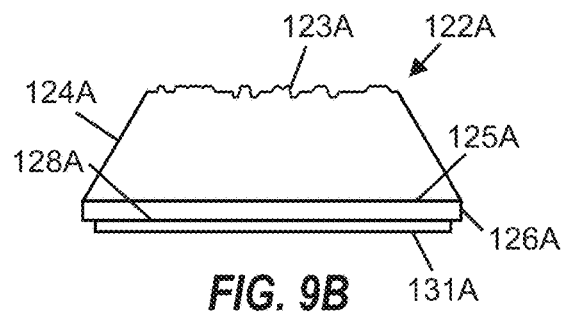
Figure 9C:
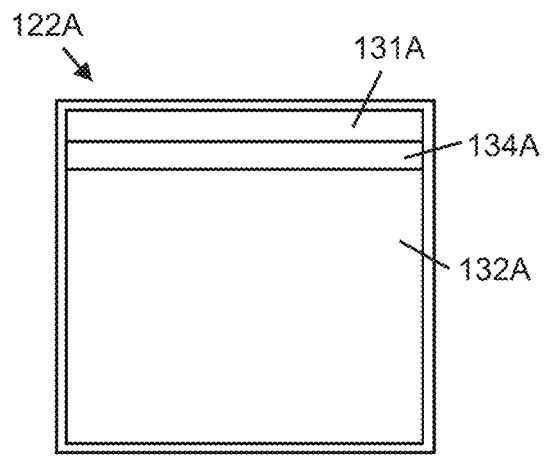

Although various figures of the present disclosure illustrate pixelated-LED chips, the present disclosure is not so limited; instead, it is to be appreciated that structures and methods disclosed herein are equally applicable to other (e.g., non-pixelated) LED chips of various types and configurations. In certain FIGS. 9A-9C provide top plan, side elevation, and bottom plan views, respectively, of a LED chip 122A according to one embodiment. The LED chip 122A includes an upper light extraction surface 123A and sloping sidewalls 124A that are non-perpendicular to the upper light extraction surface 123A. As shown in FIG. 9B, at least the upper light extraction surface 123A comprises a microtextured etched surface having a non-repeating, irregular textural pattern, which may be produced by methods disclosed herein. In certain embodiments, the sloping sidewalls 124A may be produced by bevel cutting or etching, and optionally the sloping sidewalls 124A may also be provided as microtextured etched surfaces with non-repeating, irregular textural patterns. In certain embodiments, the upper light extraction surface 123A and sloping sidewalls 124A are defined by a substrate (e.g., silicon carbide, sapphire, or the like), optionally embodying a growth substrate on which an active region 125A was grown. In certain embodiments, the upper light extraction surface 123A and/or the sloping sidewalls 124A may be defined by one or more epitaxial layers (e.g., III-nitride layers) exposed after removal of a growth substrate. The active region 125A is positioned between a lower surface 128A and the upper light extraction surface 123A. Arranged at a bottom of the LED chip are anode and cathode contacts 131A, 132A separated by an insulating region 134A.

Figure 10A:
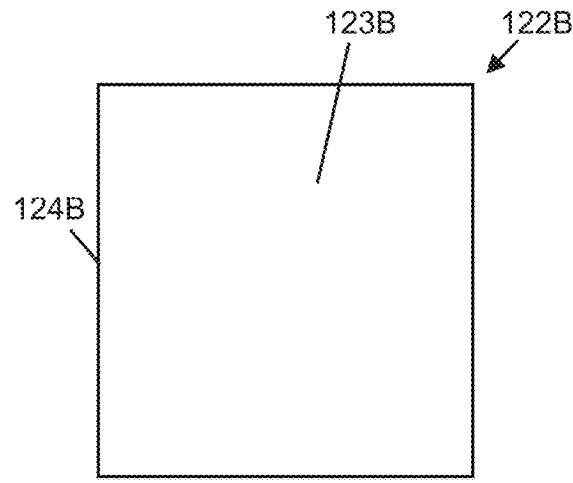
FIGS. 10A-10C provide top plan, side elevation, and bottom plan views, respectively, of a LED chip according to one embodiment arranged in flip-chip configuration with a substrate having an upper microtextured etched light extraction surface having a non-repeating, irregular textural pattern and substantially vertical sidewalls.
Figure 10B:
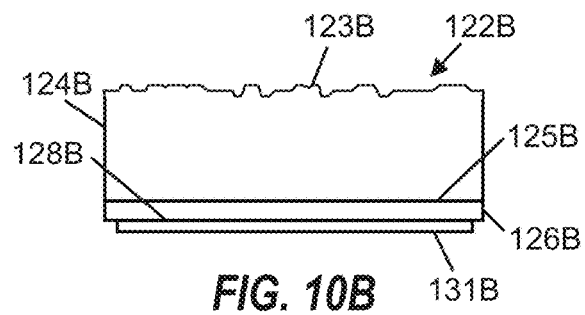
Figure 10C:
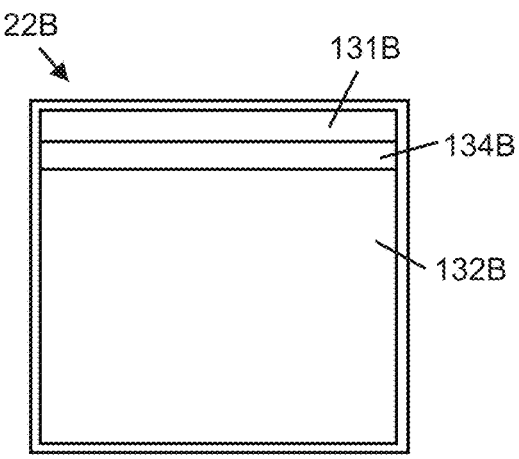

FIGS. 10A-10C provide top plan, side elevation, and bottom plan views, respectively, of a LED chip 122B according to an embodiment similar to the LED chip 122A shown in FIGS. 9A-9C, but having sidewalls 124B that are substantially perpendicular to the upper light extraction surface 123B that embodies a microtextured etched surface having a non-repeating, irregular textural pattern provided by a method disclosed herein. An active region 125B is positioned between a lower surface 128B and the upper light extraction surface 123B. Arranged at a bottom of the LED chip 122B are anode and cathode contacts 131B, 132B separated by an insulating region 134B.

Figure 11:
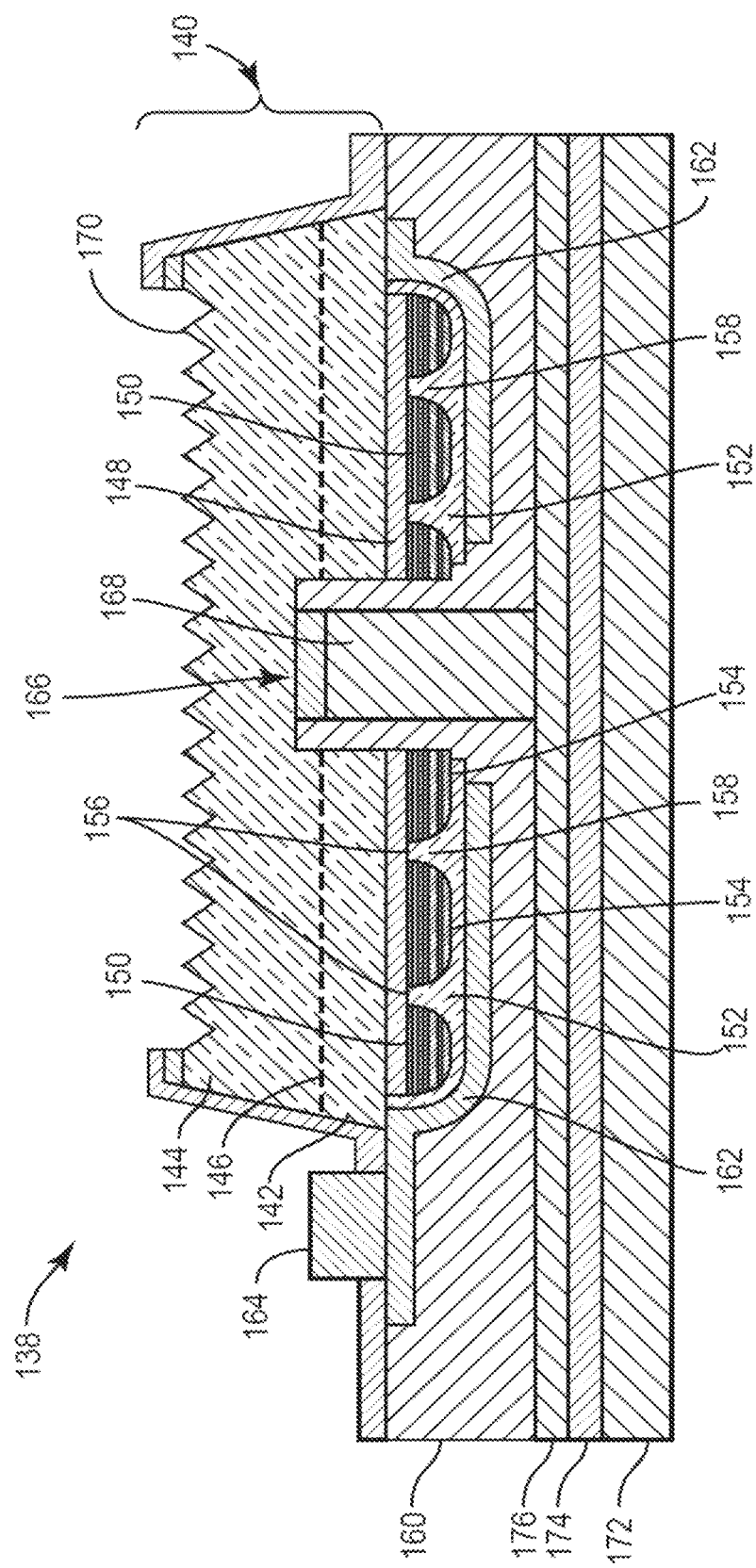
FIG. 11 is a side cross-sectional view of a LED chip according to one embodiment with a III-nitride epitaxial layer defining a microtextured etched light extraction surface having a non-repeating, irregular textural pattern.

FIG. 11 is a side cross-sectional view of a packaged LED chip 138 according to one embodiment with a III-nitride epitaxial (e.g., n-type) layer 144 that defining a microtextured etched light extraction surface 170 preferably having a non-repeating, irregular textural pattern. (Although FIG. 11 depicts the light extraction surface 170 as having a generally sawtooth profile, it is to be appreciated that such surface may have a profile akin to the light extraction surface 219 shown in FIG. 22.) The LED chip 138 includes an active LED structure 140 comprising a p-type layer 142, n-type layer 144, and an active layer 146. A current-spreading layer 148 is included on the p-type layer 142 to spread current to the p-type layer 142 during operation. A first reflective layer 150 (optionally arranged as alternating dielectric layers) is included on the current-spreading layer 148, and a second reflective layer 152 is included on the first reflective layer 150 with an adhesion layer 154 between the two. Reflective layer holes 156 pass through the adhesion layer 154 and the first reflective layer 150 to the current-spreading layer 148, and can be filled to form vias 158. A passivation layer 160 and a barrier layer 162 extend beyond the edge of the active LED structure 140 where a p-contact 164 can be formed on the barrier layer 162. An n-contact via or n-contact 168 is included in an active structure hole 166 for applying an electrical signal to the n-type layer 144. An electrical signal applied across the p-contact 164 and the n-contact 168 is conducted to the p-type layer 142 and the n-type layer 144, causing the active layer 146 to emit light.

In FIG. 11, a growth substrate for LED chip 138 has been removed, and the light extraction surface 170 of the n-type layer 144 is textured with a microtextured etched surface having a non-repeating, irregular textural pattern. To provide mechanical stabilization, the LED chip 138 is flip-chip mounted to a submount 172, with a bond metal layer 174 and blanket mirror layer 176 between the submount 172 and the active LED structure 140.

Although FIGS. 9A-9C, 10A-10C, and 11 illustrate specific types of LED chips, one skilled in the art will understand that one or more light extraction surfaces of any desired type of LED and of any suitable material may be processed by methods disclosed herein to provide a microtextured etched surface having a non-repeating, irregular textural pattern.

Figure 12:
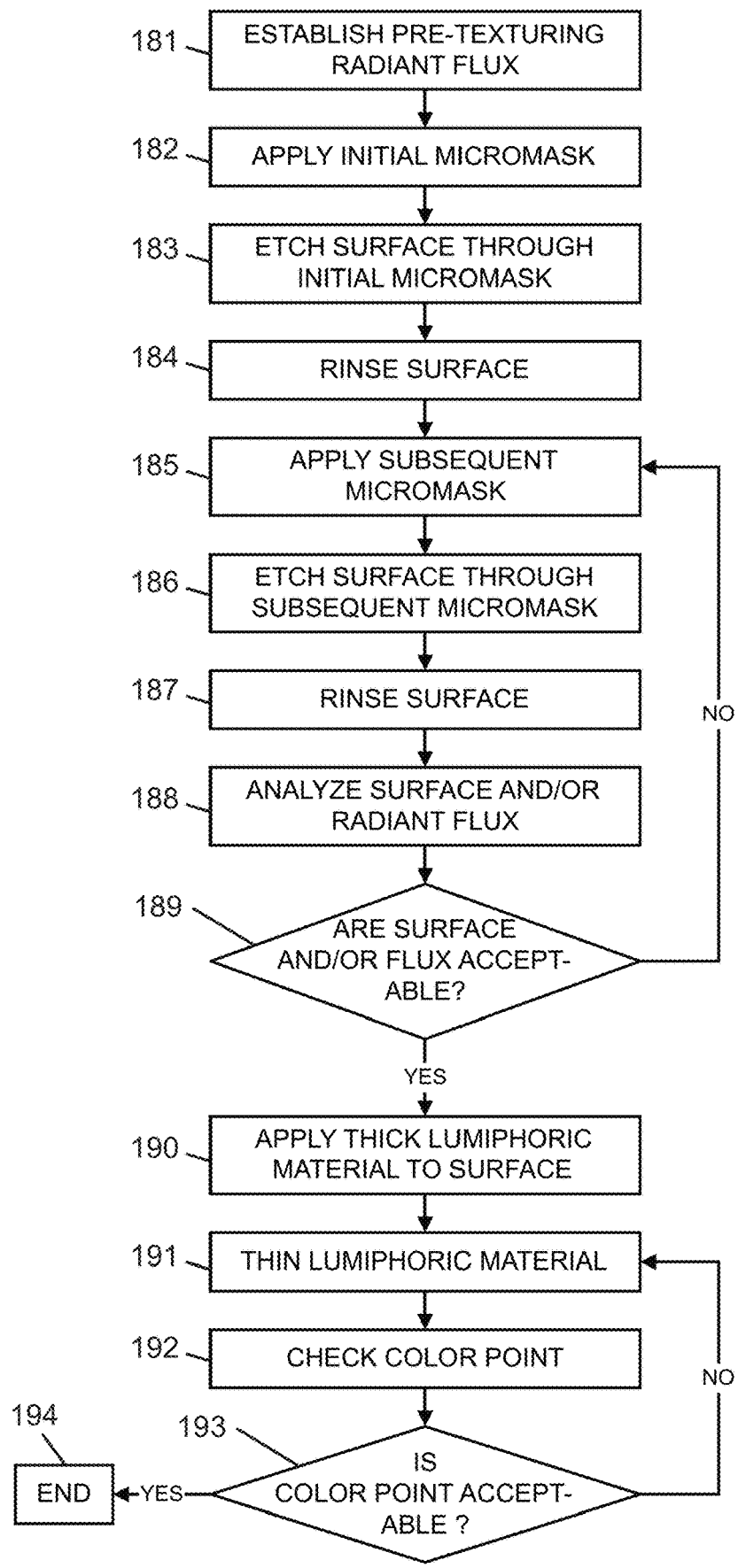
FIG. 12 is a flowchart providing steps of a method for fabricating a pixelated-LED chip that includes a substrate having a microtextured etched light extraction surface with a non-repeating, irregular textural pattern, and that includes a lumiphoric material applied over the light extraction surface.

FIG. 12 is a flowchart providing steps of a method for fabricating a pixelated-LED chip that includes a substrate having a microtextured etched light extraction surface with a non-repeating, irregular textural pattern, and that includes a lumiphoric material applied over the light extraction surface. At block 181, a first step includes establishing a radiant flux value of a pixelated-LED chip before texturing, to serve as a baseline for assessing whether microtexturing steps have been sufficient and/or sufficiently repeatable to meet desired specifications. At block 182, an initial (e.g., first) micromask having first and second solid materials of different etching rates is applied over light extraction surfaces of one or more pixelated-LED chips. At block 183, the light extraction surfaces of the one or more pixelated-LED chips are etched through the initial (first) micromask, wherein the different etching rates of the first and second solid materials promotes formation of a non-repeating, irregular textural pattern that may exhibit irregularity in both lateral and vertical directions. At block 184, residual material of the initial (first) micromask is rinsed from the light extraction surface(s). In certain embodiments, such rinsing may include supplying deionized water to the light extraction surface, optionally followed by supplying alcohol to the light extraction surface, followed by drying. In certain embodiments, a brush may be used to dislodge solid material from the light extraction surface. The liquid supplying steps may further include supplying a stream followed by a spray of liquid. Optionally, one or more surfactants (e.g., Diamaflow) may also be mixed with a rinsing agent. Blocks 185 to 187 replicate the micromask application, etching, and rinsing steps of blocks 182 to 186 according to one or more subsequent (e.g., second or third) operations. At block 188, effectiveness of the microtexturing may be assessed visual by examination of the surface (e.g., using a microscope) and/or by measuring radiant flux output of one or more pixelated-LED chips, by supplying electrical current to such chip(s) through the submount. If the surface properties and/or radiant flux properties are not acceptable, then the method returns to block 185 to perform at least one additional cycle of masking, etching, and rinsing of the light extraction surface. Otherwise, if the surface properties and/or radiant flux properties are acceptable, then the method proceeds to block 160, at which point a thick lumiphoric material layer is applied to the microtextured etched light extraction of one or more pixelated-LED chips. Thereafter, the thick lumiphoric material layer is thinned (e.g., by grinding) at block 191. The method then proceeds to block 192, where the one or more pixelated LED chips are electrically activated to permit one or color properties (e.g., color point) to be checked. If color point is acceptable, then the method ends at block 194; otherwise, the method returns to block 191 to permit further thinning of the lumiphoric material followed by re-checking of the one or more color properties.

When titanium dioxide ($TiO_2$) and fumed silica (FS) are used as solid materials in a micromask (e.g., an irregular mask, such as may be applied by spray coating) that is applied to a SiC substrate, and subjected to reactive ion etching in a fluorinated plasma environment such as $NF_3$, has been found that the FS is entirely (or almost entirely) consumed during etching, while the $TiO_2$ is not consumed. With a micromask of $TiO_2$ and FS applied over a SiC light extraction surface, there are initially exposed areas of SiC, FS, and $TiO_2$, plus stacked combinations of FS and $TiO_2$. It has been observed that when reactive ion etching with $NF_3$, the $NF_3$ locally attacks exposed SiC, the $NF_3$ consumes FS and starts attacking SiC previously covered by FS, and the $NF_3$ consumes SiC arranged under those $TiO_2$ particles that happen to be buoyed (i.e., supported from below by) FS particles. However, where $TiO_2$ is present directly on the SiC light extraction surface, minimal to no etching of the underlying SiC is observed.

Various tests were performed to assess conditions producing microtextured etched light extraction surfaces on pixelated-LED chips. It was determined that light spray coating of micromask materials was desirable to provide reasonably uniform and moderately complete (but less than 100 percent), coverage of a light extraction surface, and that multiple (e.g., two) mask formation, etching, and rinsing sequences were more effective than a single sequence. Micrographs depicting results of such tests are shown in FIGS. 13A to 21C, as described hereinafter.

Figure 13A:
FIGS. 13A-13C provide images obtained by microscopy at increasing magnification values of a masked surface of a pixelated-LED chip following spray coating with a micromask including titanium dioxide, fumed silica, and xylene with a mass fraction of titanium dioxide being ten times that of fumed silica, and at applied at a nonzero liquid pressure feed value.
Figure 13B:
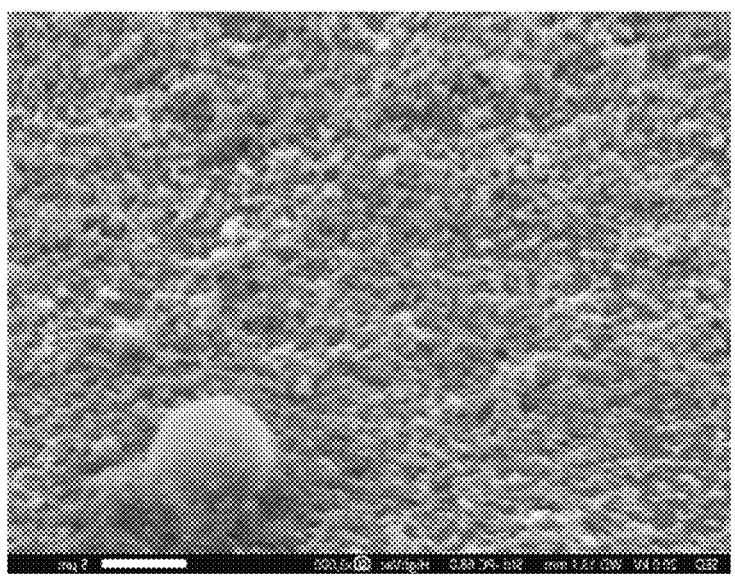
Figure 13C:
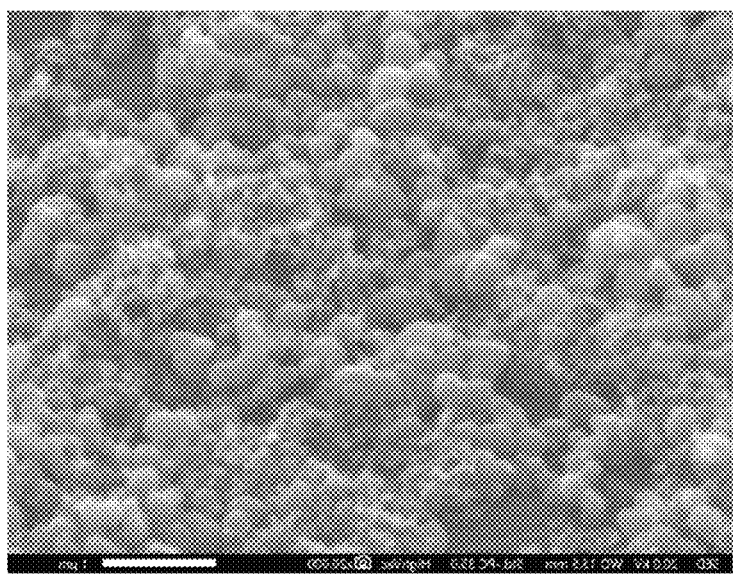

FIG. 13A provides a 1000× optical micrograph, and FIGS. 13B-13C provide 3000× and 20,000×SEM micrographs, of a micromask applied to a (not previously etched) SiC light extraction surface of a pixelated-LED chip, with the micromask including $TiO_2$ and fumed silica applied with xylene at a nonzero (1.6 psi) fluid supply pressure, 60 psi atomizing air pressure, and a mass fraction of $TiO_2$ that is ten times (10×) greater than that of the fumed silica. In FIG. 13A, lighter areas represent SiC, and darker areas represent solid particulate material ($TiO_2$ and fumed silica). In FIGS. 13B-13C, balls of $TiO_2$ and fumed silica chains are spread out nicely on the SiC surface.

Figure 14A:
FIGS. 14A-14C provide images obtained by microscopy at increasing magnification values of an etched surface of the pixelated-LED chip of FIGS. 10A-10C, following performance of initial reactive ion etching and initial rinsing steps.
Figure 14B:
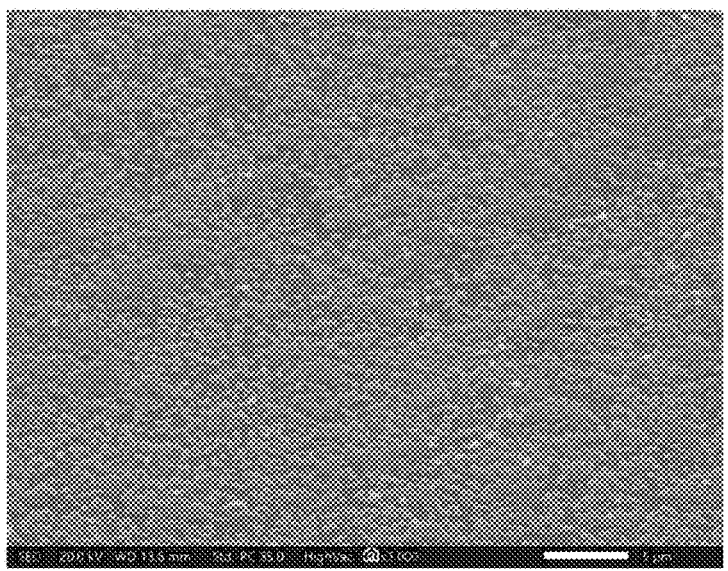
Figure 14C:
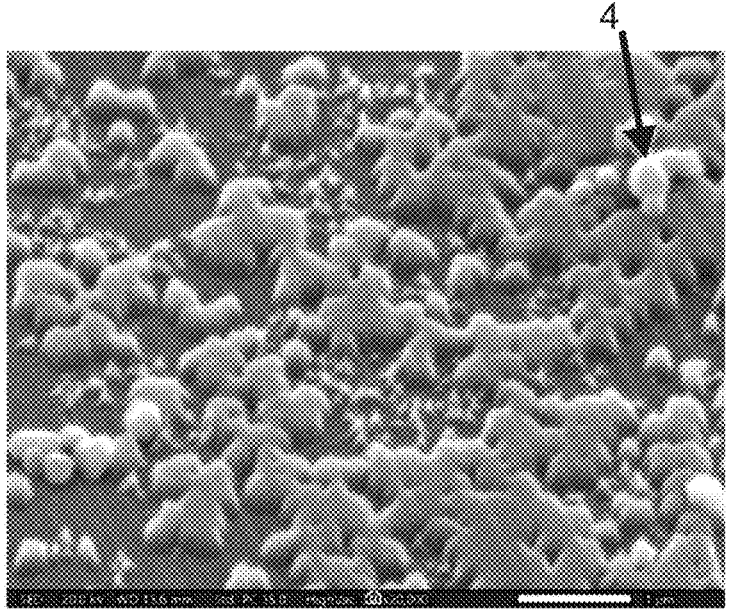

FIG. 14A provides a 1000× optical micrograph, and FIGS. 14B-14C provide 3000× and 20,000×SEM micrographs, of an etched SiC light extraction surface of a pixelated-LED chip formed by etching with a micromask according to FIGS. 13A-13C, following one sequence of micromask formation, reactive ion etching, and rinsing. FIGS. 14B-14C show significant open areas without etching. A ball or two of $TiO_2$ remain visible (shown with the arrow 4) in FIG. 14C.

Figure 15A:
FIGS. 15A-15C provide images obtained by microscopy at increasing magnification values of an etched surface of the pixelated-LED chip of FIGS. 11A-11C, following performance subsequent masking, subsequent reactive ion etching, and subsequent rinsing steps.
Figure 15B:
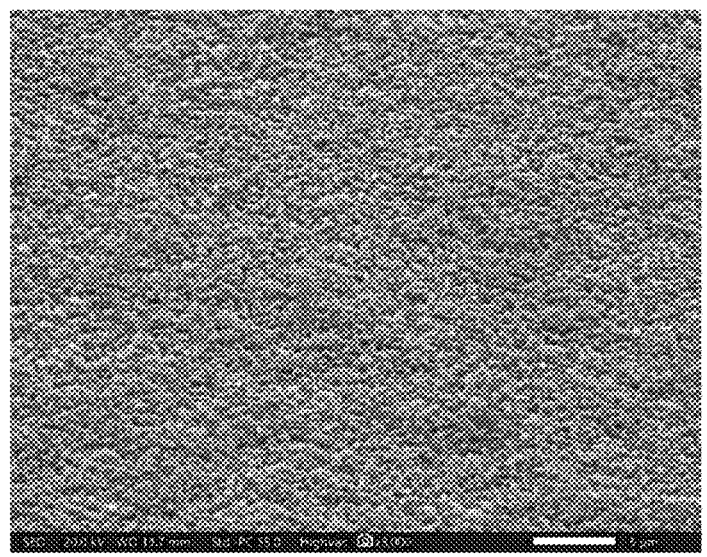
Figure 15C:
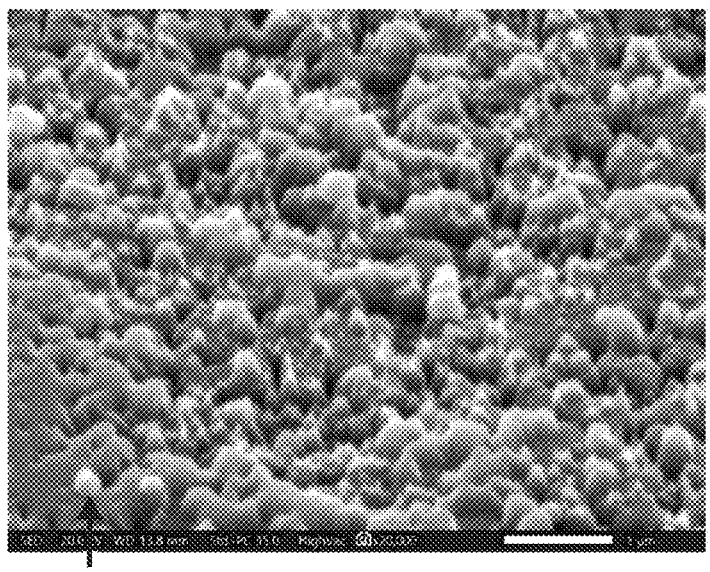

FIG. 15A provides a 1000× optical micrograph, and FIGS. 15B-15C provide 3000× and 20,000×SEM micrographs, of an etched SiC light extraction surface of a pixelated-LED chip formed by etching with a micromask according to FIGS. 15A-15C, following two sequences of micromask formation, reactive ion etching, and rinsing. Fewer open (unetched) areas are visible as compared to FIGS. 14A-14C. In FIG. 15C, a $TiO_2$ ball remains visible (shown with an arrow 5) on an unetched plateau.

Figure 16A:
FIGS. 16A-16C provide images obtained by microscopy at increasing magnification values of a masked surface of a pixelated-LED chip following spray coating with a micromask including titanium dioxide, fumed silica, and xylene with a mass fraction of titanium dioxide being five times that of fumed silica, and at applied at a nonzero liquid pressure feed value.
Figure 16B:
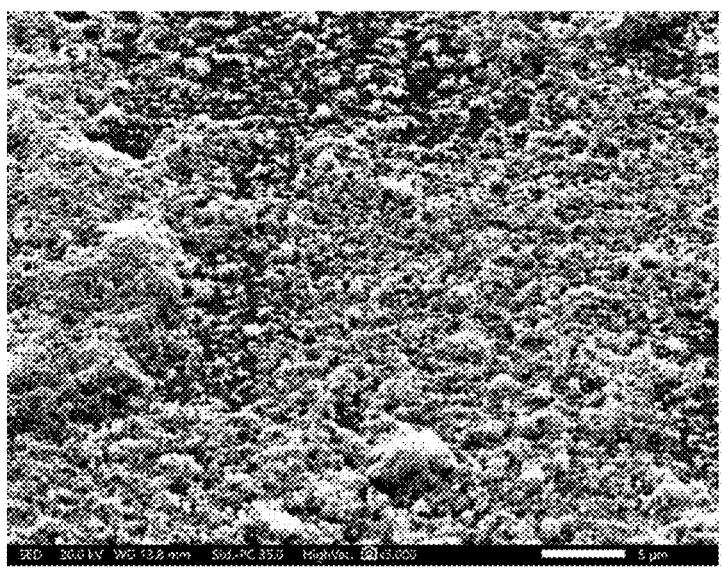
Figure 16C:
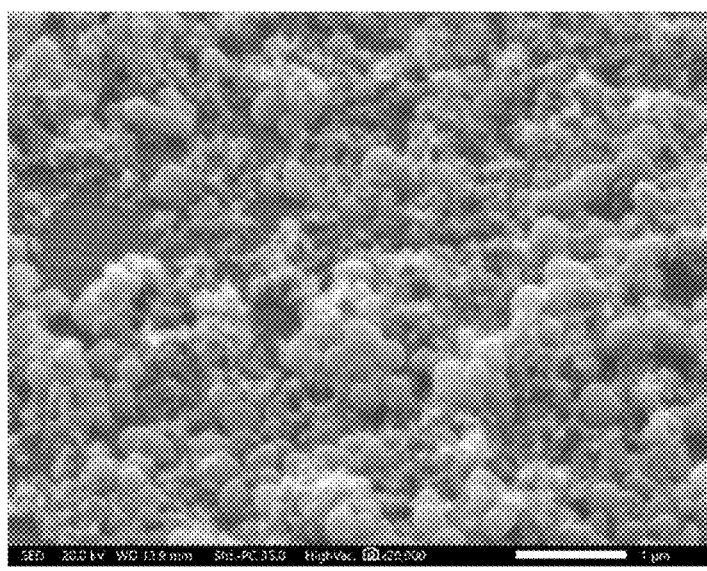

FIG. 16A provides a 1000× optical micrograph, and FIGS. 16B-16C provide 3000× and 20,000×SEM micrographs, of a micromask applied to a (not previously etched) SiC light extraction surface of a pixelated-LED chip, with the micromask including $TiO_2$ and fumed silica applied with xylene at a nonzero (1.6) fluid pressure, 60 psi atomizing air pressure, and a mass fraction of $TiO_2$ that is five times (5×) greater than that of the fumed silica.

Figure 17A:
FIGS. 17A-17C provide images obtained by microscopy at increasing magnification values of an etched surface of the pixelated-LED chip of FIGS. 16A-16C, following performance of initial reactive ion etching and initial rinsing steps.
Figure 17B:
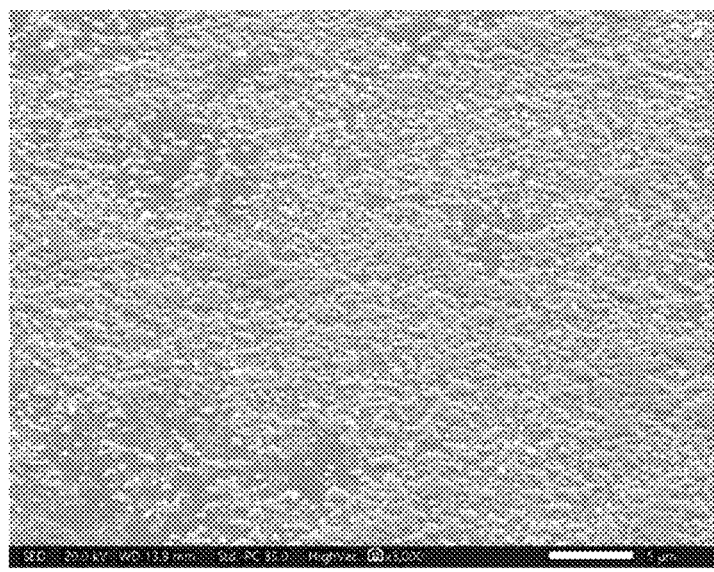
Figure 17C:
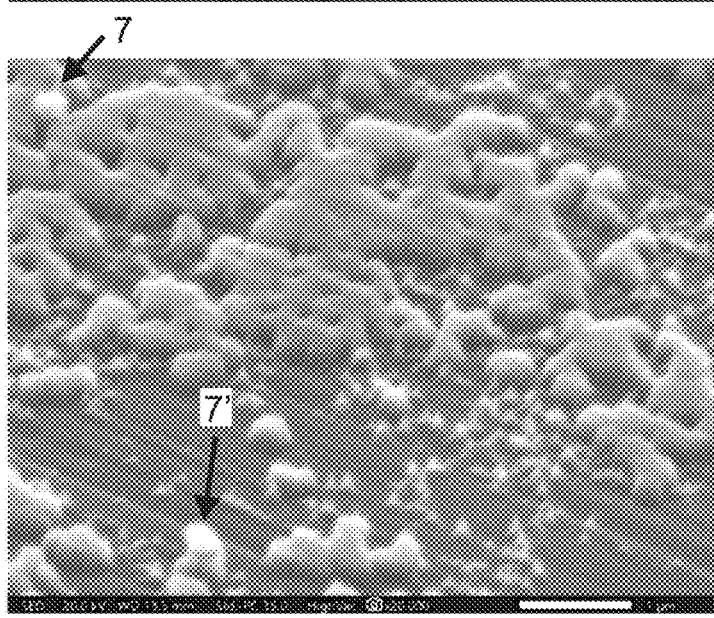

FIG. 17A provides a 1000× optical micrograph, and FIGS. 17B-17C provide 3000× and 20,000×SEM micrographs, of an etched SiC light extraction surface of a pixelated-LED chip formed by etching with a micromask according to FIGS. 16A-16C, following one sequence of micromask formation, reactive ion etching, and rinsing. As shown in FIGS. 17B-17C, the lower amount of $TiO_2$ and only a single masking and etching sequence appears insufficient to form a desired degree of texturing, in comparison to other embodiments with a higher amount of $TiO_2$. In FIG. 17C, $TiO_2$ balls remain visible (shown with arrows 7, 7').

Figure 18A:
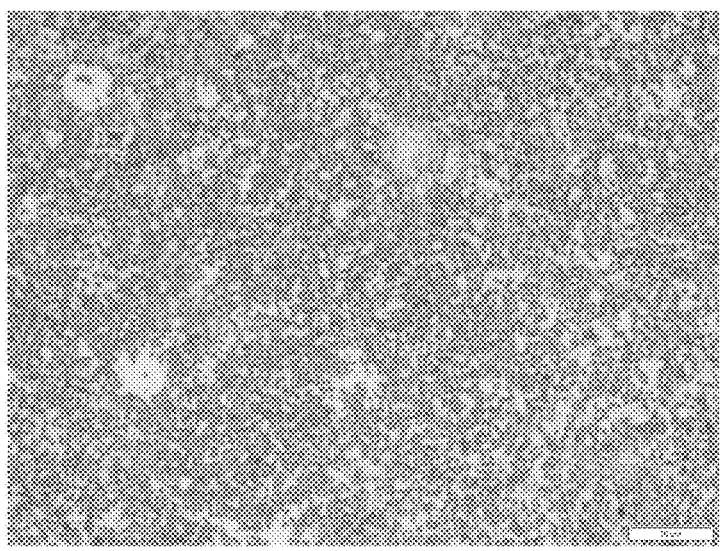
FIGS. 18A-18C provide images obtained by microscopy at increasing magnification values of an etched surface of the pixelated-LED chip of FIGS. 17A-17C, following performance subsequent masking, subsequent reactive ion etching, and subsequent rinsing steps.
Figure 18B:
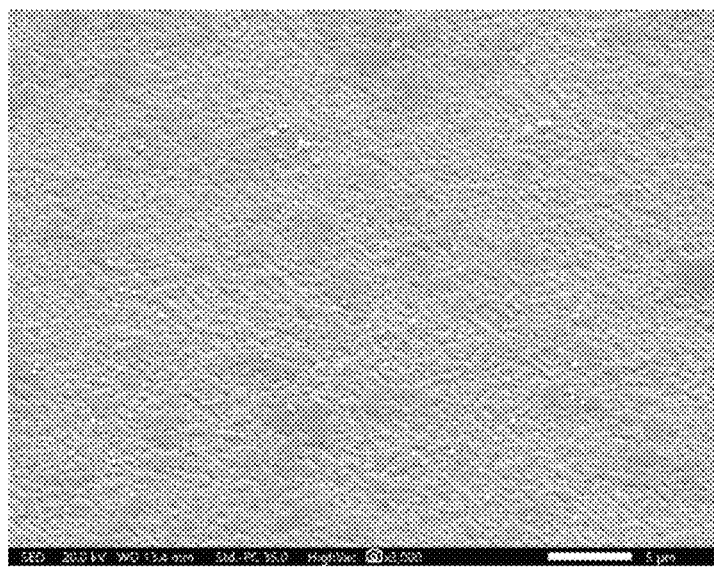
Figure 18C:
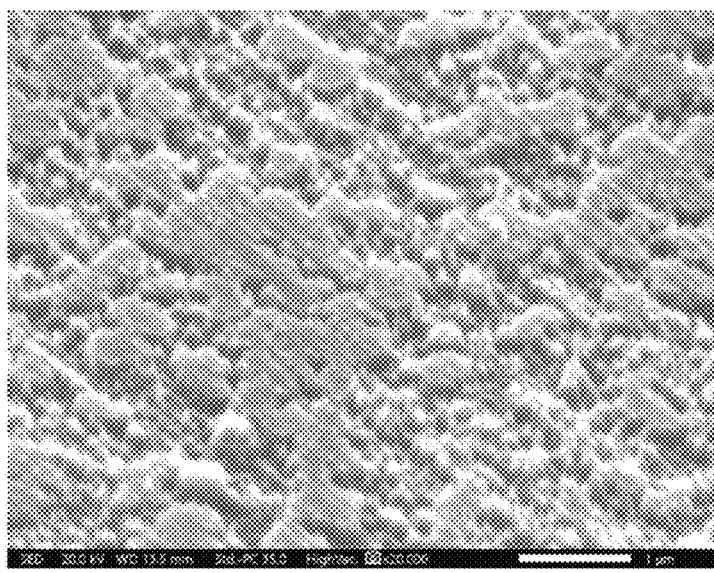

FIG. 18A provides a 1000× optical micrograph, and FIGS. 18B-18C provide 3000× and 20,000×SEM micrographs, of an etched SiC light extraction surface of a pixelated-LED chip formed by etching with a micromask according to FIGS. 16A-16C, following two sequences of micromask formation, reactive ion etching, and rinsing. As shown in FIG. 18C, two sequences of masking and etching provide improved texture density, but some flat areas of overmasking appear visible.

Figure 19A:
FIGS. 19A-19C provide images obtained by microscopy at increasing magnification values of a masked surface of a pixelated-LED chip following spray coating with a micromask including titanium dioxide, fumed silica, and xylene with a mass fraction of titanium dioxide being ten times that of fumed silica, and at applied at a zero liquid pressure feed value.
Figure 19B:
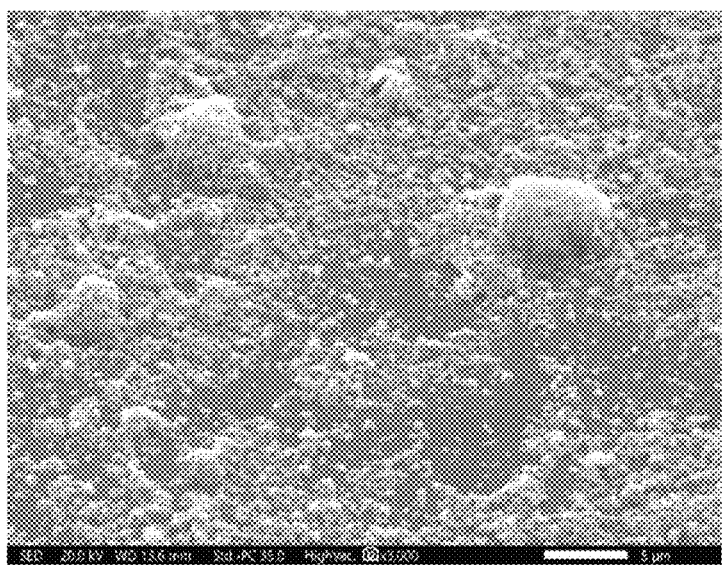
Figure 19C:
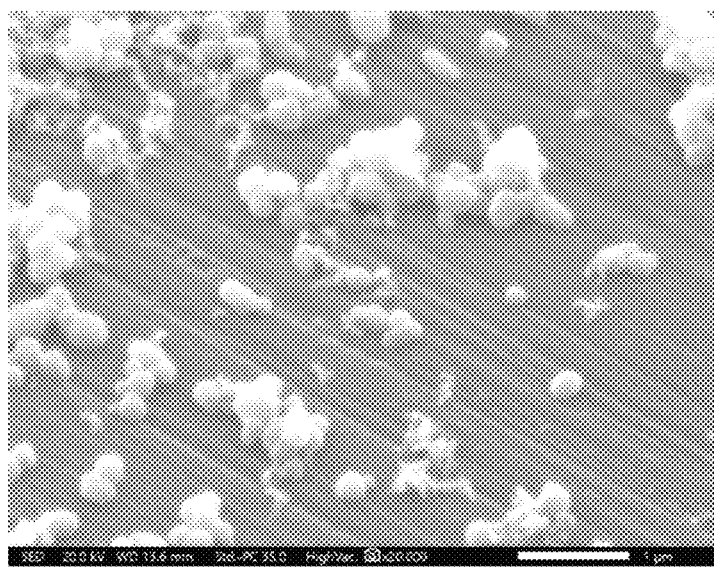

FIG. 19A provides a 1000× optical micrograph, and FIGS. 19B-19C provide 3000× and 20,000×SEM micrographs, of a micromask applied to a (not previously etched) SiC light extraction surface of a pixelated-LED chip, with the micromask including $TiO_2$ and fumed silica applied with xylene at zero fluid supply pressure, 60 psi atomizing air pressure, and a mass fraction of $TiO_2$ that is ten times (10×) greater than that of the fumed silica. FIGS. 19B-19C appear to depict less solid particulate material and possibly a larger degree of clumping of material on the SiC surface.

Figure 20A:
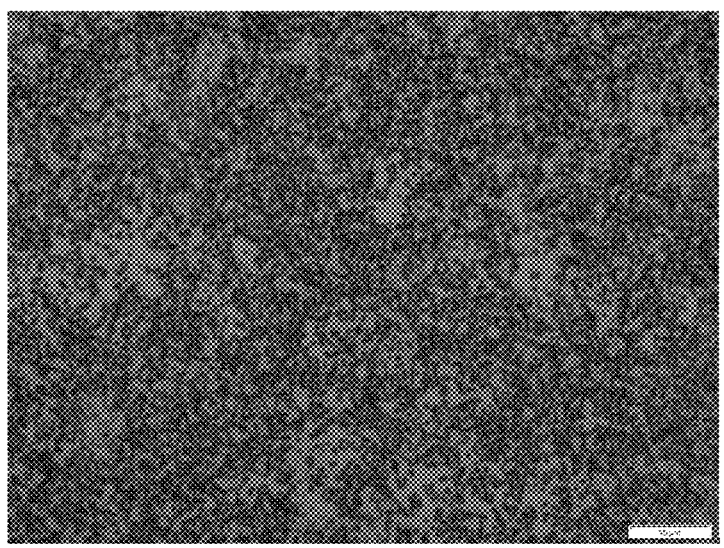
FIGS. 20A-20C provide images obtained by microscopy at increasing magnification values of an etched surface of the pixelated-LED chip of FIGS. 19A-19C, following performance of initial reactive ion etching and initial rinsing steps.
Figure 20B:
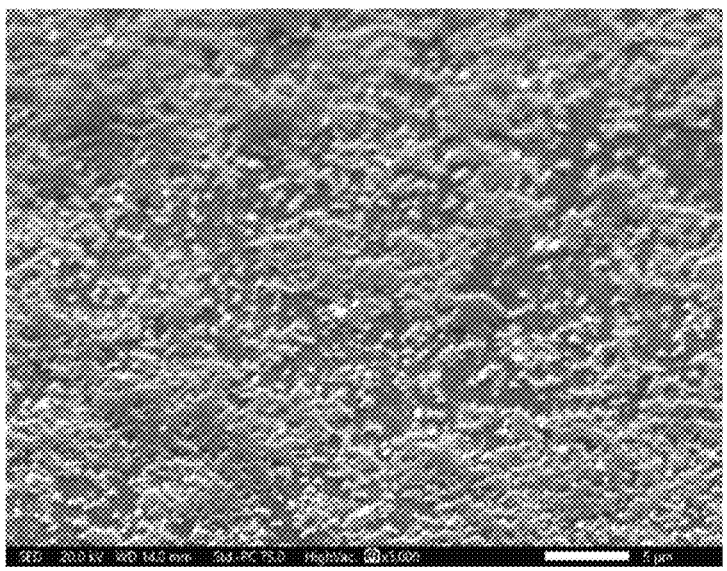
Figure 20C:
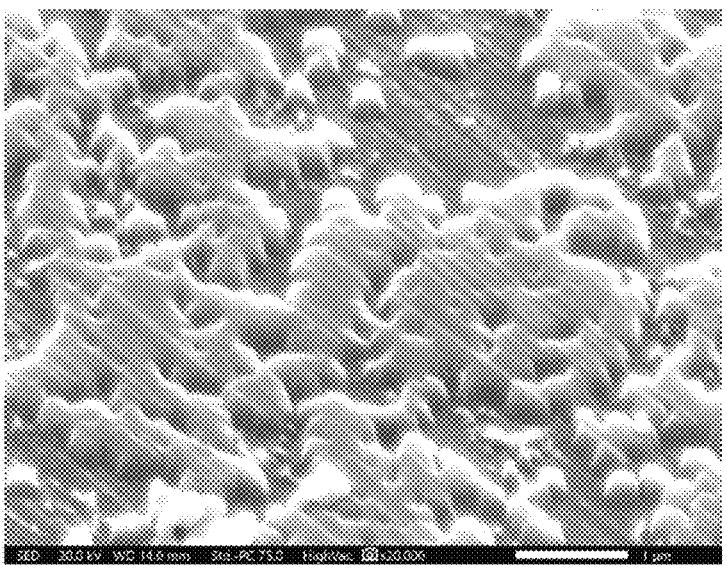

FIG. 20A provides a 1000× optical micrograph, and FIGS. 20B-20C provide 3000× and 20,000×SEM micrographs, of an etched SiC light extraction surface of a pixelated-LED chip formed by etching with a micromask according to FIGS. 19A-19C, following one sequence of micromask formation, reactive ion etching, and rinsing.

FIG. 20D is an annotated version of FIG. 20C including labeling of certain features of the etched surface of the pixelated-LED chip. Generally, darker areas correspond to more deeply recessed areas, while lighter areas correspond to elevated areas. As shown, the etched surface includes multiple plateau regions 195A-195F of varying sizes and varying irregular shapes. Various plateau regions 195A-195F may have a predominantly flat upper surface except along lateral boundaries thereof (which may have rounded edges toward lower-lying areas) and except for the presence of pitted regions. The plateau regions 195A-195F are elevated at a first height relative to valley regions 198A-198E disposed between the plateau regions 195A-195F. At least certain plateau regions (e.g., plateau region 195A) have pitted regions 196A defined in upper surfaces thereof. Additionally, multiple plateau regions (e.g., 195A-195B) include substantially parallel scoring marks 197A-197C along upper surfaces thereof, with such scoring marks having been imparted onto the substrate by surface grinding prior to masking and etching. In certain embodiments, features 199A-199D of a second height (which is less than the first height of the plateau regions 195A-195F) are present within valley regions 198A-198E and may be disposed between different plateau regions. In certain instances, for one or more valley regions, the valley region (e.g., 198E) may have a width (W) that is less than a width of each individual plateau regions (e.g., 195D, 195F) bordering the valley region 198E. Since the etched surface shown in FIG. 20D was subjected to only one sequence of micromask formation, reactive ion etching, and rinsing, less feature height variation is present than in other embodiments involving multiple sequences of masking, etching, and rinsing.

Figure 21A:
FIGS. 21A-21C provide images obtained by microscopy at increasing magnification values of an etched surface of the pixelated-LED chip of FIGS. 20A-20C, following performance subsequent masking, subsequent reactive ion etching, and subsequent rinsing steps.
Figure 21B:
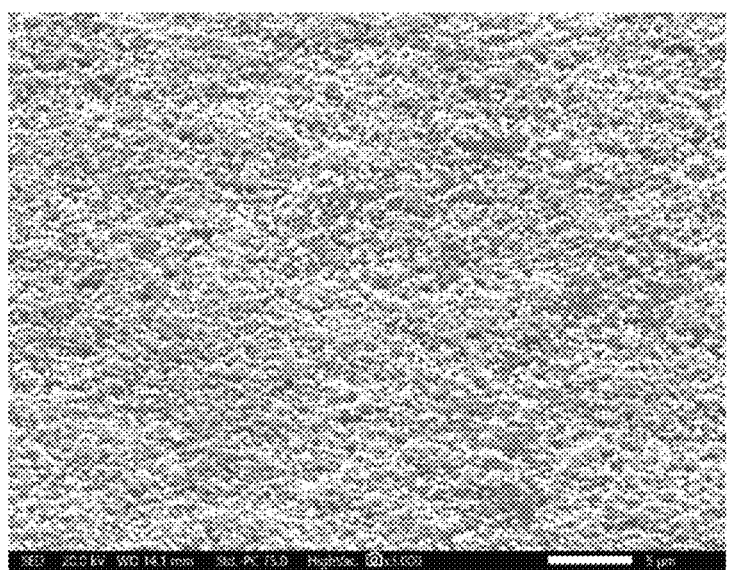
Figure 21C:
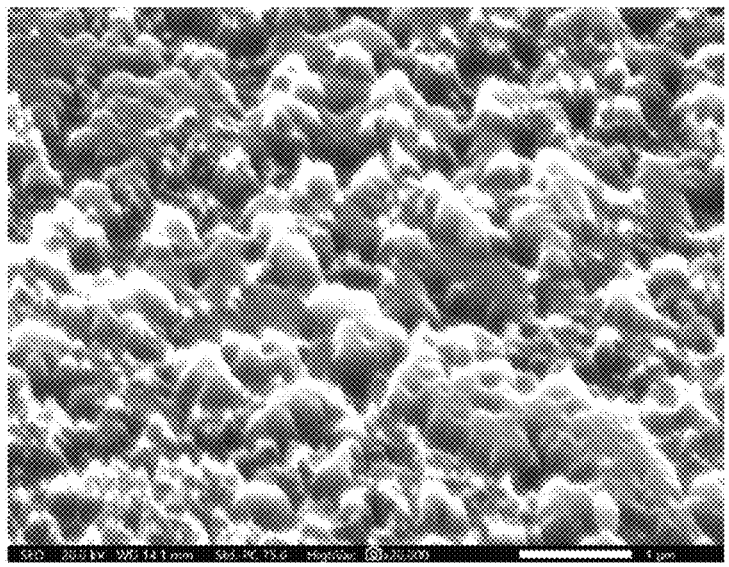

FIG. 21A provides a 1000× optical micrograph, and FIGS. 218B-21C provide 3000× and 20,000×SEM micrographs, of an etched SiC light extraction surface of a pixelated-LED chip formed by etching with a micromask according to FIGS. 19A-19C, following two sequences of micromask formation, reactive ion etching, and rinsing. The texturing shown in these figures may be considered to be preferable to that shown in the preceding figures for light extraction in certain contexts, with the texturing exhibiting a high degree of surface texture variation and a low degree of unetched areas.

Figure 21D:
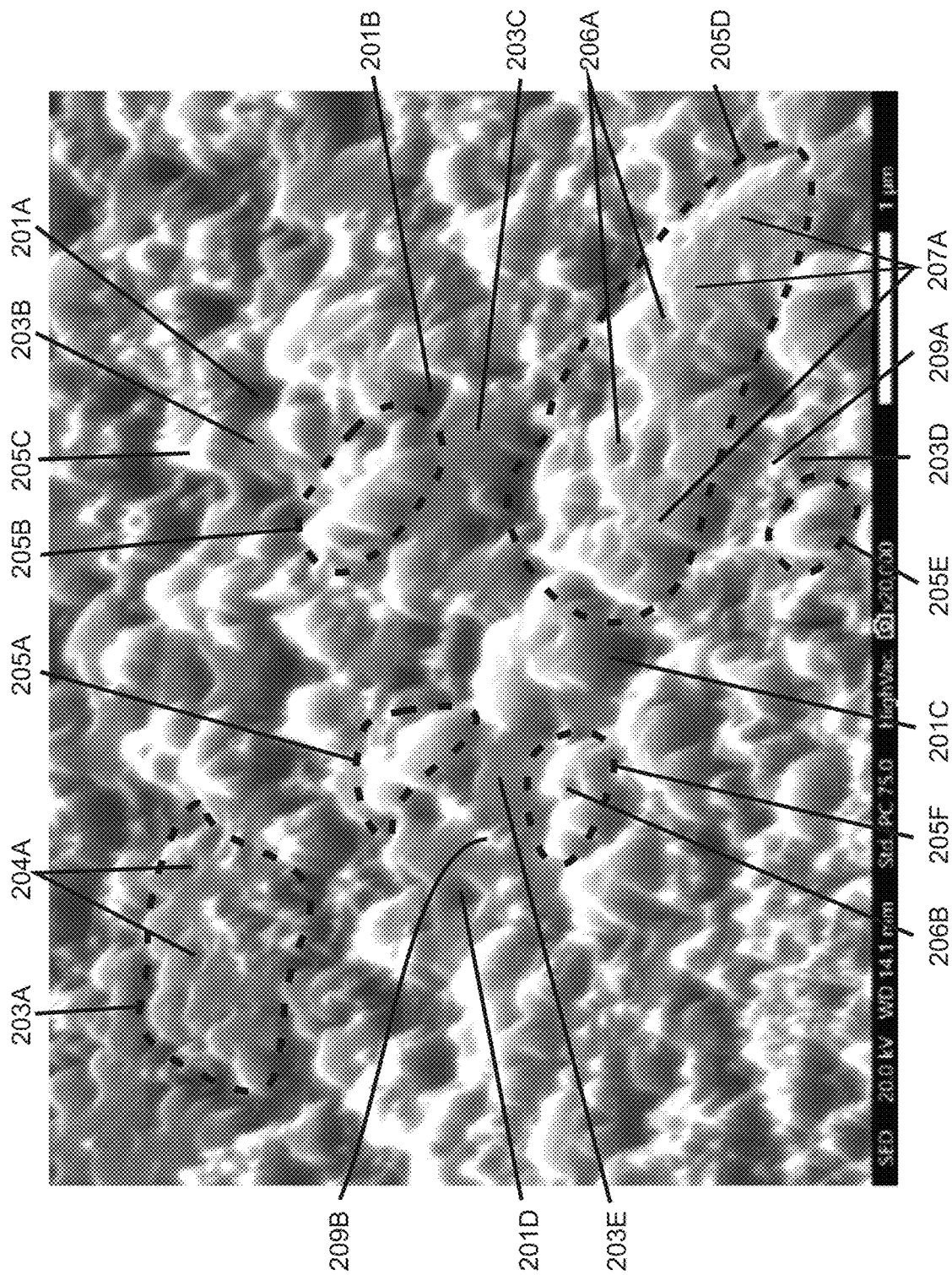
FIG. 21D is an annotated version of FIG. 21C including labeling of certain features of the etched surface of the pixelated-LED chip.

FIG. 21D is an annotated version of FIG. 21C with labeling of certain features of the etched surface of the pixelated-LED chip. Generally, darker areas correspond to more deeply recessed areas, while lighter areas correspond to elevated areas. As shown, the etched surface includes a plurality of first plateau regions 205A-205F and plurality of second plateau regions 203A-203E, with the various plateau regions 205A-205F, 203A-203E being of varying sizes and varying irregular shapes. The plurality of first plateau regions 205A-205F are elevated at a first height, and the plurality of second plateau regions 203A-203E are elevated at a second height less than the first height, both relative to recessed regions 201A-201D. The second plateau regions 203A-203E may also be considered valley regions arranged between first plateau regions. At least some of the plateau regions (e.g., first plateau regions 205D, 205F and second plateau region 203A) have pitted regions 206A, 206B, 204A defined in upper surfaces thereof. Additionally, at least some plateau regions (e.g., 205D) include substantially parallel scoring marks 207A along upper surfaces thereof, with such scoring marks having been imparted by grinding of the light-transmissive substrate prior to masking and etching. In certain embodiments, raised features 209A-209B of an intermediate height (i.e., between the first height and the second height) may be provided on at least some second plateau regions (203D, 203E). Since the etched surface shown in FIG. 20D was subjected to only one sequence of micromask formation, reactive ion etching, and rinsing, less feature height variation is present than in other embodiments involving multiple sequences of masking, etching, and rinsing.

Figure 22:
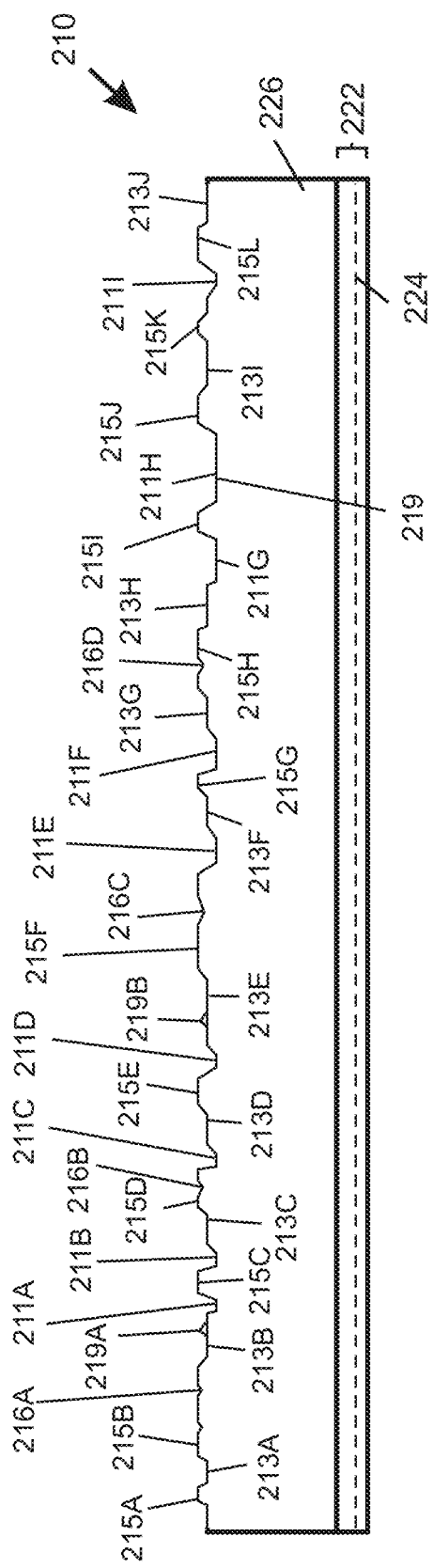
FIG. 22 is a schematic cross-sectional view of a LED chip including a light extraction surface having a microtextured, etched light extraction surface produced by methods disclosed herein.

FIG. 22 is a schematic cross-sectional view of a LED chip 210 including a light extraction surface 219 that embodies a microtextured, etched light extraction surface 219 produced by methods disclosed herein. The LED chip 210 includes a LED structure 222 including an active layer 224 deposited on a substrate 226. Numerous features are defined on or by the light extraction surface 219 by methods disclosed herein, such as one or multiple cycles of mask formation (with a mask including first and second solid materials of different etching rates), etching, and rinsing. Such features include a plurality of first plateau regions 215A-215L of a first height, a plurality of second plateau regions 213A-213J of a second height that is less than the first height, and a plurality of valley regions 211A-211I (e.g., being deeper than the second plurality of plateau regions 213A-213J). Selected first plateau regions (e.g., 216A, 215D, 215F, 215H) have pitted regions 216A-216D defined in upper surfaces thereof. Selected second plateau regions (e.g., 213B, 213E) include raised features 219A, 219B of an intermediate height (e.g., between the first height and the second height). It is to be appreciated that the features shown in FIG. 22 are not to scale, but instead are exaggerated to aid in understanding by the reader.

Figure 27:
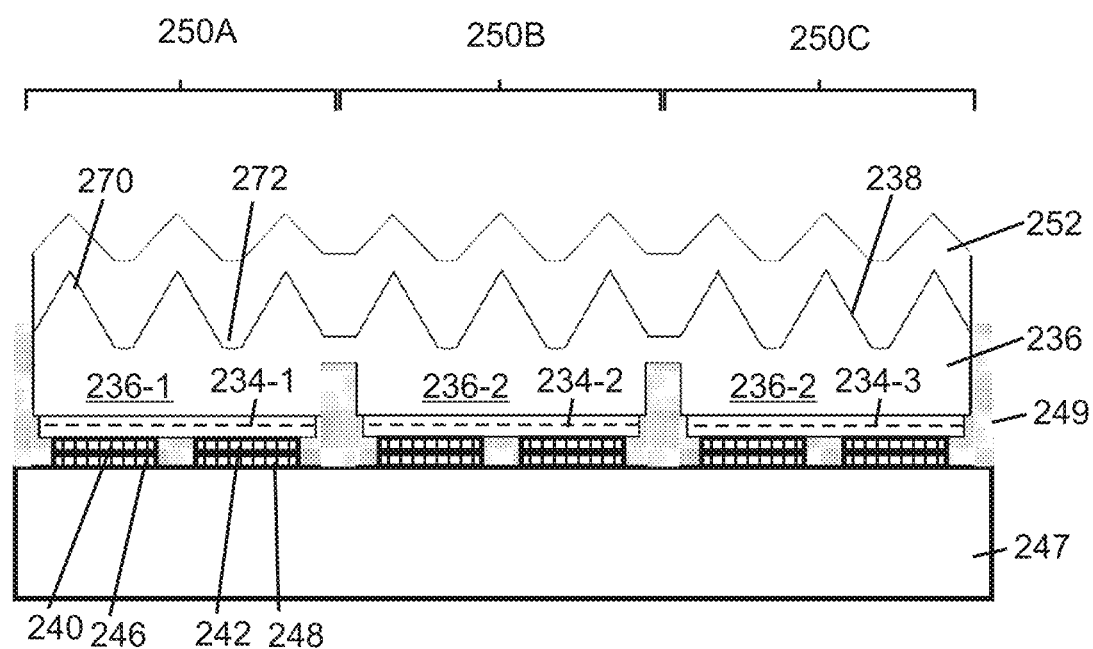
FIG. 27 is a schematic cross-sectional view of a pixelated-LED chip including a light extraction surface having macro-textural features produced by bevel cutting according to prior methods.

Performance of pixelated-LED chips having microtextured, etched light extraction surfaces produced by methods described herein was compared to that of pixelated-LED chips including macro-textural features (e.g., such as shown in FIG. 27) produced by bevel cutting according to prior methods.

Figure 23:
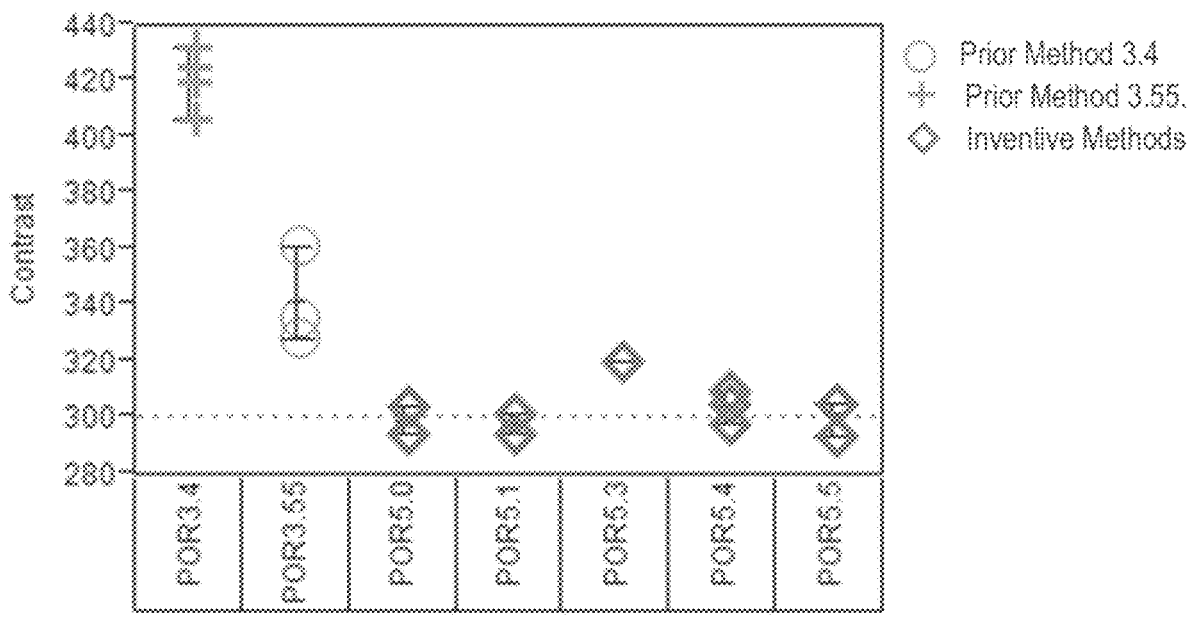
FIG. 23 provides plots of contrast values for pixelated-LED chips including microtextured, etched light extraction surfaces produced by methods disclosed herein in comparison to pixelated-LED chips including macro-textural produced by prior methods.

FIG. 23 provides plots of contrast values for pixelated-LED chips including microtextured, etched light extraction surfaces produced by methods disclosed herein in comparison to pixelated-LED chips including macro-textural features produced by bevel cutting according to prior methods. FIG. 23 shows that pixelated-LED chips including microtextured, etched light extraction surfaces can provide improved contrast relative to pixelated-LED chips including macro-textural features produced by bevel cutting according to prior methods.

Figure 24:
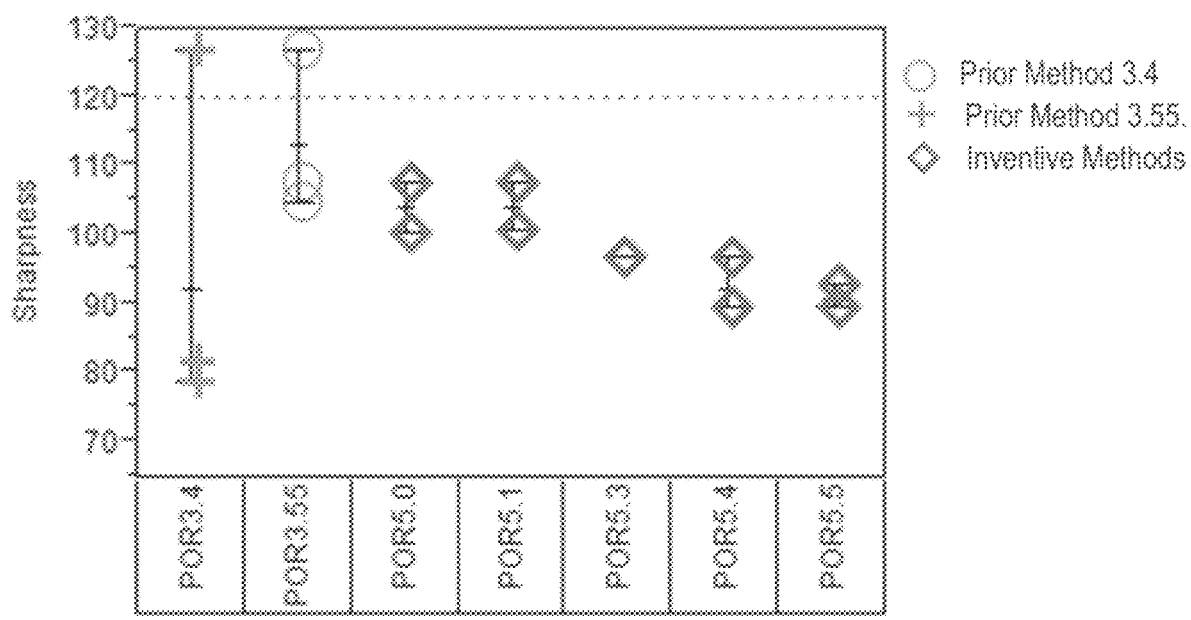
FIG. 24 provides plots of sharpness values for pixelated-LED chips including microtextured, etched light extraction surfaces produced by methods disclosed herein in comparison to pixelated-LED chips including a light extraction surface having macro-textural features produced by prior methods (e.g., bevel cutting with a saw).

FIG. 24 provides plots of sharpness values for pixelated-LED chips including microtextured, etched light extraction surfaces produced by methods disclosed herein in comparison to pixelated-LED chips including a light extraction surface having macro-textural features produced by bevel cutting according to prior methods. FIG. 24 shows that pixelated-LED chips including microtextured, etched light extraction surfaces can provide sharpness comparable to, and with greater consistency than, pixelated-LED chips including macro-textural features produced by bevel cutting according to prior methods.

Figure 25:
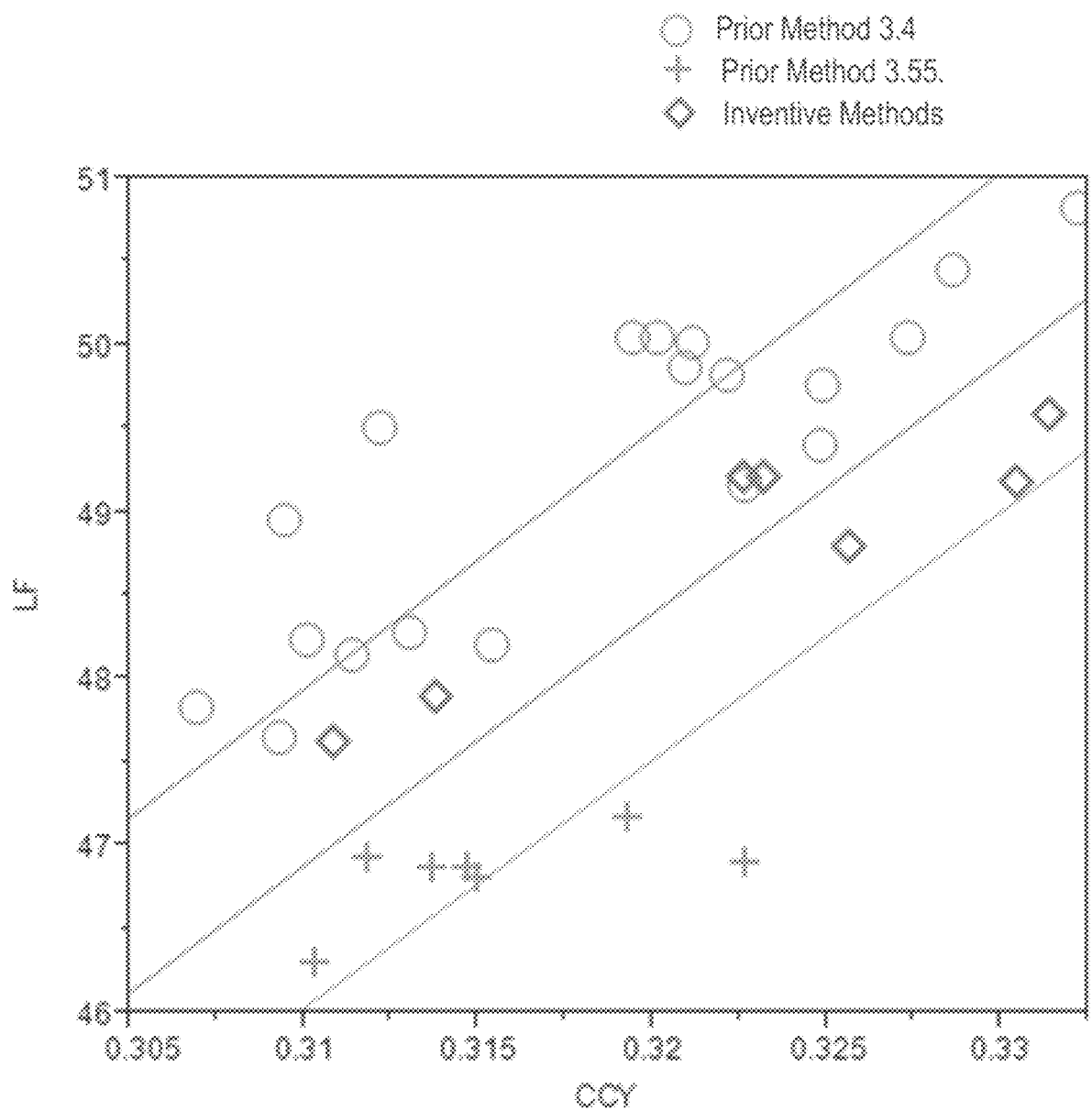
FIG. 25 provides plots of luminous flux versus CCY values for pixelated-LED chips including microtextured, etched light extraction surfaces produced by methods disclosed herein in comparison to pixelated-LED chips including a light extraction surface having macro-textural features produced by prior methods.

FIG. 25 provides plots of luminous flux versus CCY values for pixelated-LED chips including microtextured, etched light extraction surfaces produced by methods disclosed herein in comparison to pixelated-LED chips including a light extraction surface having macro-textural features produced by bevel cutting according to prior methods. FIG. 25 shows that pixelated-LED chips including microtextured, etched light extraction surfaces can provide improved comparable luminous flux with greater consistency (i.e., less variability) than pixelated-LED chips including macro-textural features produced by bevel cutting according to prior methods.

Figure 26:
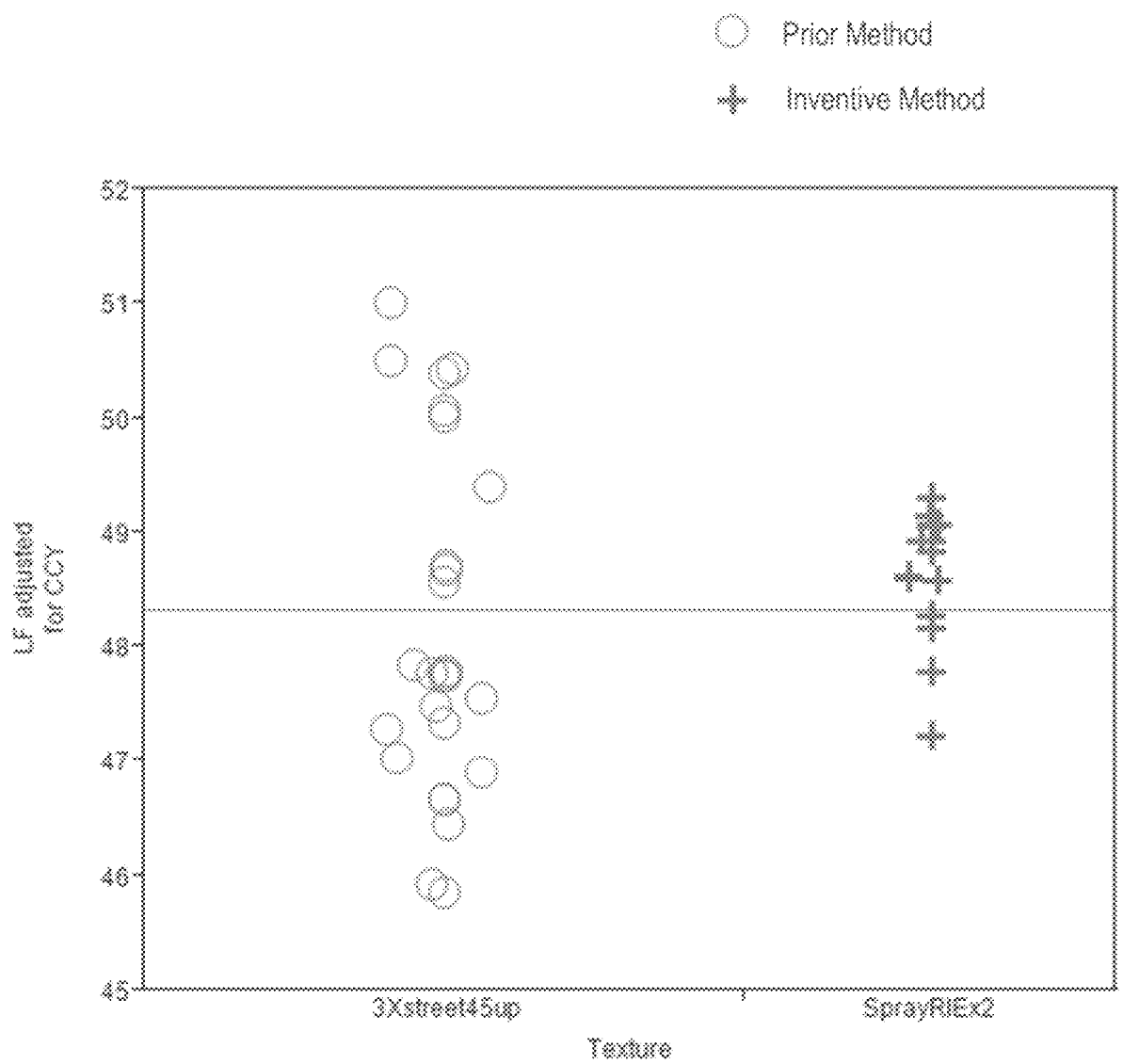
FIG. 26 provides plots of luminous flux adjusted for CCY values for pixelated-LED chips including microtextured, etched light extraction surfaces produced by methods disclosed herein in comparison to pixelated-LED chips a light extraction surface having macro-textural features produced by bevel cutting according to prior methods.

FIG. 26 provides plots of luminous flux adjusted for CCY values for pixelated-LED chips including microtextured, etched light extraction surfaces produced by methods disclosed herein in comparison to pixelated-LED chips a light extraction surface having macro-textural features produced by bevel cutting according to prior methods. FIG. 26 shows that pixelated-LED chips including microtextured, etched light extraction surfaces can provide improved comparable luminous flux (adjusted for color point) with greater consistency (less variability) than pixelated-LED chips including macro-textural features produced by bevel cutting according to prior methods.

Those skilled in the art will recognize improvements and modifications to the preferred embodiments of the present disclosure. All such improvements and modifications are considered within the scope of the concepts disclosed herein and the claims that follow.

What is claimed is:

1. A LED chip comprising:
   an active layer comprising a plurality of active layer portions configured to produce electrically activated emissions, with a plurality of streets defined through the active layer and arranged to segregate individual active layer portions of the plurality of active layer portions;

a substrate comprising a plurality of substrate portions supporting the plurality of active layer portions, wherein the substrate comprises a light-transmissive substrate material and each substrate portion comprises a light extraction surface; and a plurality of anode-cathode pairs associated with the plurality of active layer portions;

wherein active layer portion of the plurality of active layer portions comprises a different anode-cathode pair of the plurality of anode-cathode pairs and is configured to illuminate a different substrate portion of the plurality of substrate portions and transmit light through the light extraction surface of the substrate portion, such that the plurality of active layer portions and the plurality of substrate portions form a plurality of pixels;

wherein each light extraction surface comprises a microtextured etched surface having a non-repeating, irregular textural pattern.

2. The LED chip of claim 1, wherein the non-repeating, irregular textural pattern comprises an average feature depth in a range of from 120 nm to 400 nm.

3. The LED chip of claim 1, wherein the non-repeating, irregular textural pattern comprises a plurality of plateau regions and pits defined in upper surfaces of the plurality of plateau regions.

4. The LED chip of claim 3, wherein upper surfaces of at least some plateau regions of the plurality of plateau regions comprise substantially parallel scoring marks imparted by grinding of the light-transmissive substrate material.

5. The LED chip of claim 1, wherein the non-repeating, irregular textural pattern comprises a tiered microstructure including a plurality of plateau regions arranged at different heights.

6. The LED chip of claim 1, wherein the non-repeating, irregular textural pattern comprises a plurality of irregularly shaped first features of a first height, and a plurality of valley regions extending between different irregularly shaped first features of the plurality of irregularly shaped first features, wherein at least some valley regions of the plurality of valley regions are wider than individual irregularly shaped first features that border the at least some valley regions.

7. The LED chip of claim 1, wherein the non-repeating, irregular textural pattern comprises a plurality of irregularly shaped first features of a first height, a plurality of valley regions extending between different irregularly shaped first features of the plurality of irregularly shaped first features, and a plurality of irregularly shaped second features of a second height that is less than the first height, wherein the plurality of irregularly shaped second features are arranged within the plurality of valley regions.

8. The LED chip of claim 1, wherein the non-repeating, irregular textural pattern comprises a plurality of irregularly shaped first plateau regions of a first height, a plurality of irregularly shaped second plateau regions of a second height that is less than the first height, and a plurality of valley regions between different plateau regions of the plurality of irregularly shaped first plateau regions and the plurality of irregularly shaped second plateau regions.

9. The LED chip of claim 1, wherein each light extraction surface is free of any plurality of equally sized, equally shaped, and equally spaced textural features.

10. The LED chip of claim 1, further comprising at least one Group III nitride epitaxial layer arranged between the active layer and the substrate, wherein the substrate is compositionally different from the at least one Group III nitride epitaxial layer.

11. The LED chip of claim 1, wherein each light extraction surface consists essentially of silicon carbide or sapphire.

12. The LED chip of claim 1, wherein the non-repeating, irregular textural pattern is irregular in both a lateral direction and a vertical direction.

13. The LED chip of claim 1, being arranged in a flip-chip configuration, with the active layer arranged between the substrate and the plurality of anode-cathode pairs.

14. The LED chip of claim 1, wherein the light extraction surface of each substrate portion comprises silicon carbide or sapphire.

15. The LED chip of claim 1, further comprising at least one lumiphoric material arranged on or over the microtextured etched surface, wherein the at least one lumiphoric material is configured to receive at least a portion of light emitted by the plurality of active layer portions and to responsively generate lumiphor emissions.

16. The LED chip of claim 15, wherein the at least one lumiphoric material is continuous on the plurality of pixels.

17. The LED chip of claim 15, wherein the at least one lumiphoric material comprises a thickness variation of less than 500 nm over an entirety of the microtextured etched surface.

18. The LED chip of claim 15, wherein the at least one lumiphoric material comprises a plurality of light segregation elements that are registered between pixels of the plurality of pixels.

19. The LED chip of claim 18, wherein the plurality of light segregation elements comprises gaps or cuts in the at least one lumiphoric material.

20. The LED chip of claim 1, wherein the plurality of substrate portions comprises a plurality of discontinuous substrate portions.

21. The LED chip of claim 15, further comprising light scattering particles arranged between the light extraction surface of each substrate portion and the at least one lumiphoric material.

22. A lighting device comprising at least one LED chip according to claim 1.

* * * * *

UNITED STATES PATENT AND TRADEMARK OFFICE
CERTIFICATE OF CORRECTION

| | | |
|---|---|---|
| PATENT NO. | : 11,894,488 B2 | Page 1 of 1 |
| APPLICATION NO. | : 17/357091 | |
| DATED | : February 6, 2024 | |
| INVENTOR(S) | : Peter Scott Andrews | |

It is certified that error appears in the above-identified patent and that said Letters Patent is hereby corrected as shown below:

In the Specification

Column 29, Line 29, replace "Ill-nitride layers" with --III-nitride layers--.

In the Claims

Claim 1, Column 35, Line 12, replace "wherein active layer portion" with --wherein each active layer portion--.

Claim 10, Column 36, Lines 10 and 12, replace "Group Ill" with --Group III--.

Signed and Sealed this
Nineteenth Day of March, 2024

Katherine Kelly Vidal
*Director of the United States Patent and Trademark Office*